(12) United States Patent
Kimura

(10) Patent No.: US 8,476,929 B2
(45) Date of Patent: Jul. 2, 2013

(54) SEMICONDUCTOR DEVICE

(75) Inventor: Hajime Kimura, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 6 days.

(21) Appl. No.: 13/231,997

(22) Filed: Sep. 14, 2011

(65) Prior Publication Data

US 2012/0074985 A1   Mar. 29, 2012

(30) Foreign Application Priority Data

Sep. 23, 2010   (JP) ................. 2010-212933

(51) Int. Cl.
*H03K 19/173*  (2006.01)
(52) U.S. Cl.
USPC ............................... 326/46; 326/93; 415/100
(58) Field of Classification Search
USPC ................. 326/46, 93; 345/98–100
See application file for complete search history.

(56) References Cited

U.S. PATENT DOCUMENTS

| | | | |
|---|---|---|---|
| 5,638,018 A | 6/1997 | Sharpe-Geisler | |
| 6,198,324 B1 * | 3/2001 | Schober | 327/202 |
| 6,252,448 B1 | 6/2001 | Schober | |
| 6,333,656 B1 | 12/2001 | Schober | |
| 6,459,316 B1 | 10/2002 | Vangal et al. | |
| 7,369,113 B2 | 5/2008 | Washio et al. | |
| 7,420,402 B2 | 9/2008 | Washio et al. | |
| 7,420,403 B2 | 9/2008 | Yang et al. | |
| 7,489,174 B2 | 2/2009 | Yoshizawa | |
| 7,564,440 B2 | 7/2009 | Li | |
| 2001/0011987 A1 | 8/2001 | Kubota et al. | |
| 2003/0141913 A1 | 7/2003 | Park et al. | |
| 2008/0094343 A1 | 4/2008 | Osame et al. | |
| 2008/0130821 A1 | 6/2008 | Jarupoonphol et al. | |
| 2010/0084651 A1 | 4/2010 | Yamazaki et al. | |

FOREIGN PATENT DOCUMENTS

| | | |
|---|---|---|
| JP | 10-302494 | 11/1998 |
| JP | 2008-090983 | 4/2008 |

\* cited by examiner

*Primary Examiner* — Don Le
(74) *Attorney, Agent, or Firm* — Eric J. Robinson; Robinson Intellectual Property Law Office, P.C.

(57) ABSTRACT

In the case where data is rewritten in a delay period of a signal in a flip flop and a shift register which use an inverted clock signal, current inhibiting charging may flow, whereby data cannot written quickly, so that charging is not completed, which makes operation unstable. In view of the above, a flip flop and a shift register without using an inverted clock signal, which have high stability are provided. Current inhibiting charging of a node where that current inhibiting charging flows is cut off at the time of rewriting data so that data is rewritten quickly.

24 Claims, 41 Drawing Sheets

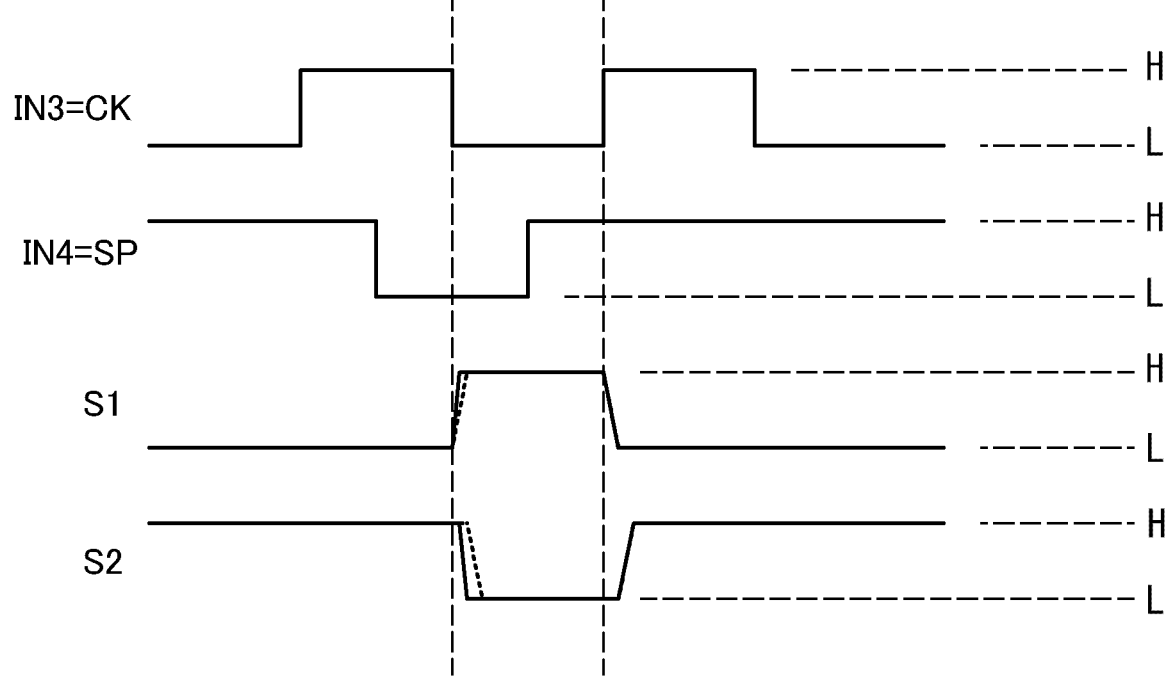

SEMICONDUCTOR DEVICE

BACKGROUND OF THE INVENTION

1. Field of the Invention

The present invention relates to a semiconductor device, a display device, a light-emitting device, a liquid crystal display device, and a memory device; driving methods thereof; and manufacturing methods thereof. In particular, the present invention relates to a flip flop or a shift register. Further, the present invention relates to a display device having a flip flop or a shift register.

2. Description of the Related Art

A shift register which sequentially outputs signals (e.g., sampling signals) by input of a clock signal and a start signal is used for various circuits. For example, in a display device including a plurality of pixels arranged in matrix, a shift register is used in a source signal line driver circuit or a gate signal line driver circuit which selects a pixel or inputs a signal to the selected pixel. A shift register can be used for a driver circuit for memories arranged in matrix.

In recent years, with the increase of large display devices such as liquid crystal televisions, display devices such as liquid crystal display devices and light-emitting devices have been actively developed. In particular, a technique for forming a pixel circuit and a driver circuit in a display device over the same insulating substrate by using thin film transistors or the like including semiconductor layers provided over the insulating substrate has been actively developed, because the technique greatly contributes to reduction in power consumption and cost, for example. The driver circuit formed over the insulating substrate is connected to a circuit including a controller IC through an FPC, for example, and its operation is controlled by the controller IC.

Examples of the driver circuit in the display device are a source signal line driver circuit and a gate signal line driver circuit. The examples of the driver circuit have shift registers which are one kind of electronic circuits. The shift register includes a plurality of sequential circuits such as flip-flops.

A shift register using a flip flop generally uses a clock signal and an inverted clock signal. However, whether in the case where an inverted clock signal is input from the outside of a driver circuit or an inverted clock signal is generated in the driver circuit, power consumption, the number of wirings, or the number of transistors is increased; accordingly, a flip flop or a shift register which operates only with a clock signal without an inverted clock signal has been used in some cases. As examples of such a shift register, Patent Document 1 and Patent Document 2 can be given.

REFERENCE

[Patent Document 1] Japanese Published Patent Application No. H10-302494

[Patent Document 2] Japanese Published Patent Application No. 2008-090983

SUMMARY OF THE INVENTION

However, a flip flop or a shift register which does not use an inverted clock signal is a circuit configured to, for example, rewrite a signal within a slight latency period of another signal in some cases; thus, there is a possibility of unstable operation. For example, there is a possibility that writing to a node cannot sufficiently be performed because characteristics of transistors vary, change because of temperature or over time because of a long-time operation. When writing to a node cannot be performed sufficiently, the signal is not transmitted to the following node correctly, which may result in instability of the operation.

It is an object of an embodiment of the present invention is to provide a circuit, a semiconductor device, or a display device, which operates stably. An object of an embodiment of the present invention is to provide a circuit, a semiconductor device, or a display device, configured to rewrite a signal within a slight latency period of another signal. An object of an embodiment of the present invention is to provide a circuit, a semiconductor device, or a display device, in which influence of a variation in transistor characteristics is reduced. An object of an embodiment of the present invention is to provide a circuit, a semiconductor device, or a display device, which uses a clock signal and does not use an inverted clock signal. An object of an embodiment of the present invention is to provide a flip flop and a shift register which have high stability. Note that the descriptions of these problems do not prevent the existence of other problems. Note that in one embodiment of the present invention, there is no need to achieve all the objects. Other objects will be apparent from and can be derived from the description of the specification, the drawings, the claims, and the like.

An embodiment of the present invention is a semiconductor device including a first circuit, a second circuit, and a third circuit. The first circuit includes a first p-channel transistor, a first n-channel transistor, and a second n-channel transistor. A first terminal of the first p-channel transistor is directly connected to a first wiring. A second terminal of the first p-channel transistor is directly connected to an output terminal of the first circuit. The first n-channel transistor and the second n-channel transistor are electrically connected in series between the output terminal of the first circuit and a second wiring. A gate of the first p-channel transistor is electrically connected to a first input terminal of the first circuit. A gate of the first n-channel transistor is electrically connected to the first input terminal of the first circuit. A gate of the second n-channel transistor is electrically connected to a second input terminal of the first circuit. The output terminal of the first circuit is electrically connected to an input terminal of the third circuit.

Further, the second circuit includes a second p-channel transistor, a third p-channel transistor, and a third n-channel transistor. A first terminal of the third n-channel transistor is directly connected to the second wiring. A second terminal of the third n-channel transistor is directly connected to an output terminal of the second circuit. The second p-channel transistor and the third p-channel transistor are electrically connected in series between the output terminal of the second circuit and the first wiring. A gate of the second p-channel transistor is electrically connected to a first input terminal of the second circuit. A gate of the third n-channel transistor is electrically connected to the first input terminal of the second circuit. A gate of the third p-channel transistor is electrically connected to a second input terminal of the second circuit. The output terminal of the second circuit is electrically connected to the input terminal of the third circuit.

Further, the third circuit includes a fourth p-channel transistor and a fourth n-channel transistor. A first terminal of the fourth p-channel transistor is electrically connected to the first wiring. A second terminal of the fourth p-channel transistor is electrically connected to an output terminal of the third circuit. A first terminal of the fourth n-channel transistor is electrically connected to the output terminal of the third circuit. A second terminal of the fourth n-channel transistor is electrically connected to the second wiring. A gate of the fourth p-channel transistor is electrically connected to the input terminal of the third circuit. A gate of the fourth n-channel transistor is electrically connected to the input terminal of the third circuit. The output terminal of the third circuit is electrically connected to the first input terminal of the second circuit.

An embodiment of the present invention is a semiconductor device including a first circuit, a second circuit, and a third circuit. The first circuit includes a first p-channel transistor, a second p-channel transistor, and a first n-channel transistor. The first p-channel transistor and the second p-channel transistor are electrically connected in series between an output terminal of the first circuit and a first wiring. A first terminal of the first n-channel transistor is directly connected to the output terminal of the first circuit. A second terminal of the first n-channel transistor is directly connected to a second wiring. A gate of the second p-channel transistor is electrically connected to a first input terminal of the first circuit. A gate of the first n-channel transistor is electrically connected to the first input terminal of the first circuit. A gate of the first p-channel transistor is electrically connected to a second input terminal of the first circuit. The output terminal of the first circuit is electrically connected to an input terminal of the third circuit.

Further, the second circuit includes a third p-channel transistor, a second n-channel transistor, and a third n-channel transistor. A first terminal of the third p-channel transistor is directly connected to a third wiring. A second terminal of the third p-channel transistor is directly connected to an output terminal of the second circuit. The second n-channel transistor and the third n-channel transistor are electrically connected in series between the output terminal of the second circuit and a fourth wiring. A gate of the third p-channel transistor is electrically connected to a first input terminal of the second circuit. A gate of the second n-channel transistor is electrically connected to the first input terminal of the second circuit. A gate of the third n-channel transistor is electrically connected to a second input terminal of the second circuit. The output terminal of the second circuit is electrically connected to the input terminal of the third circuit.

Further, the third circuit includes a fourth p-channel transistor and a fourth n-channel transistor. A first terminal of the fourth p-channel transistor is electrically connected to a fifth wiring. A second terminal of the fourth p-channel transistor is electrically connected to an output terminal of the third circuit. A first terminal of the fourth n-channel transistor is electrically connected to the output terminal of the third circuit. A second terminal of the fourth n-channel transistor is electrically connected to a sixth wiring. A gate of the fourth p-channel transistor is electrically connected to the input terminal of the third circuit. A gate of the fourth n-channel transistor is electrically connected to the input terminal of the third circuit. The output terminal of the third circuit is electrically connected to the first input terminal of the second circuit.

In the above structure, the semiconductor device may include a reset circuit.

In the above structure, a clock signal may be input to the first input terminal of the first circuit and the second input terminal of the second circuit.

In the above structure, the first wiring may be connected to a high potential power source and the second wiring may be connected to a low potential power source.

According to an embodiment of the present invention, a flip flop and a shift register which do not use an inverted clock signal, in which rewriting is performed quickly by cutting off current inhibiting rewriting, and which has high stability can be provided.

BRIEF DESCRIPTION OF THE DRAWINGS

FIG. 20 is an example of a timing diagram of Embodiment 2.

DETAILED DESCRIPTION OF THE INVENTION

Figure 1:
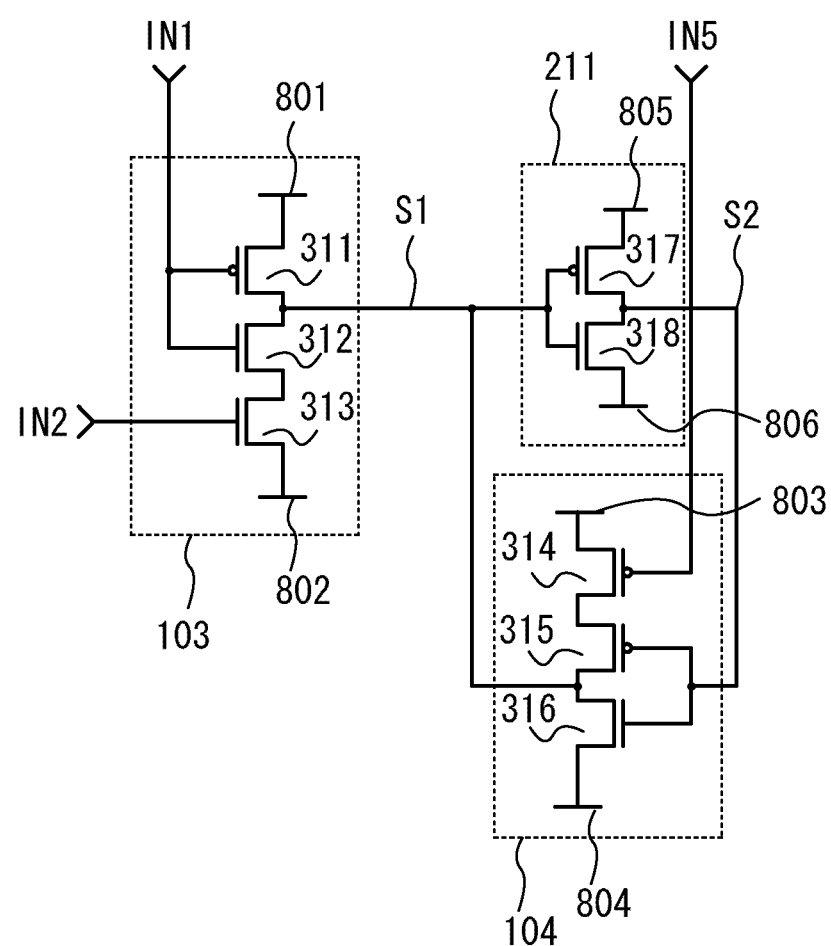
FIG. 1 is a circuit diagram of an example of a configuration of Embodiment 1.

Hereinafter, embodiments of the present invention will be described with reference to the accompanying drawings. However, the present invention can be carried out in many different modes, and it is easily understood by those skilled in the art that modes and details of the present invention can be modified in various ways without departing from the purpose and the scope of the present invention. Therefore, the present invention is not construed as being limited to description of the embodiments. Note that, in the drawings hereinafter shown, the same portions or portions having similar functions are denoted by the same reference numerals, and repeated description thereof will be omitted.

Further, in the present invention, two electrodes serving as a source and a drain, which are included in a single transistor, is determined whether any one of the two electrodes serves as the source or drain depending on a potential difference generated between these electrodes. Accordingly, in some cases, it is difficult to define whichever electrode serves as a source or a drain. Thus, in this specification, a source and a drain are also referred to as a first terminal and a second terminal, a first electrode and a second electrode, or a first region and a second region, in some cases.

Note that in this specification and the like, numerals such as "first", "second", and "third" are used for distinguishing various elements, members, regions, layers, and areas from each other. Therefore, the numerals such as "first", "second", "third", and the like do not limit the number of the elements, members, regions, layers, areas, or the like. Further, for example, "first" can be replaced with "second", "third", or the like.

A plurality of transistors which have the same conductivity types, which are connected in series, gates of which are connected to one another are referred to as a multi-gate transistor. In the present invention, a multi-gate transistor comparably functions as one transistor, and both ends thereof are referred to as a first terminal and a second terminal, a first electrode and a second electrode, or a first region and a second region in some cases. That is to say, a transistor in this invention may be either one transistor or a multi-gate transistor.

At least two potentials are needed for a circuit operation in many cases. In this specification, as an example, a high potential power source is denoted by VDD and a low potential power source is denoted by VSS. In some cases, a potential level of a high potential is denoted by H, an H signal, an H potential, an H voltage, or an H level, and a potential level of a low potential is denoted by L, an L signal, an L potential, an L voltage, or an L level. In this specification, a circuit operation is described with the use of these two potentials in some cases. The circuit can be driven with the use of three or more potential levels.

Note that, in this specification and the like, when it is explicitly described that X and Y are connected, the case where X and Y are electrically connected, the case where X and Y are functionally connected, and the case where X and Y are directly connected are included therein. Here, each of X and Y denotes an object (e.g., a device, an element, a circuit, a wiring, an electrode, a terminal, a conductive film, a layer, or the like). Accordingly, another connection relation shown in drawings and texts is included without being limited to a predetermined connection relation, for example, the connection relation shown in the drawings and the texts.

For example, in the case where X and Y are electrically connected, one or more elements which enable electrical connection between X and Y (e.g., a switch, a transistor, a capacitor, an inductor, a resistor, and/or a diode) can be connected between X and Y.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a dc-dc converter, a step-up dc-dc converter, or a step-down dc-dc converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected.

Note that when it is explicitly described that X and Y are connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is to say, when it is explicitly described that "A and B are electrically connected", the description is the same as the case where it is explicitly only described that "A and B are connected".

Embodiment 1

In this embodiment, an example of a circuit configuration of an embodiment of the present invention will be described with reference to FIG. 1. The circuit in FIG. 1 can be applied to, for example, a shift register, a flip flop, a latch circuit, a memory circuit, a source signal line driver circuit for a display device, and a gate signal line driver circuit for the display device. An embodiment of the present invention is not limited thereto, and can be used for various circuits.

FIG. 1 illustrates an example of a circuit configuration. The circuit in FIG. 1 can operate as a flip flop with the use of a single phase clock signal. The circuit in FIG. 1 includes a circuit 103, a circuit 104, and a circuit 211.

A p-channel transistor 311, an n-channel transistor 312, and an n-channel transistor 313 are connected in series in the circuit 103. In the circuit 103, a first terminal of the p-channel transistor 311 is connected to a wiring 801. A second terminal of the p-channel transistor 311 is connected to a first terminal of the n-channel transistor 312. A second terminal of the n-channel transistor 312 is connected to a first terminal of the n-channel transistor 313. A second terminal of the n-channel transistor 313 is connected to a wiring 802. Further, in the circuit 103, a gate of the p-channel transistor 311 is connected to a gate of the n-channel transistor 312. The gate of the p-channel transistor 311 and the gate of the n-channel transistor 312 are connected to a first input terminal (IN1) of the circuit 103. A gate of the n-channel transistor 313 is connected to a second input terminal (IN2) of the circuit 103. Furthermore, in the circuit 103, the second terminal of the p-channel transistor 311 and the first terminal of the n-channel transistor 312 are connected to an output terminal of the circuit 103 and an input terminal of the circuit 211. Note that in this specification, the first input terminal (IN1) of the circuit 103 is abbreviated to an input terminal IN1 in some cases. The same can be applied to the other input terminals.

A p-channel transistor 314, a p-channel transistor 315, and an n-channel transistor 316 are connected in series in the circuit 104. In the circuit 104, a first terminal of the p-channel transistor 314 is connected to a wiring 803. A second terminal of the p-channel transistor 314 is connected to a first terminal of the p-channel transistor 315. A second terminal of the p-channel transistor 315 is connected to a first terminal of the n-channel transistor 316. A second terminal of the n-channel transistor 316 is connected to a wiring 804. Further, in the circuit 104, a gate of the p-channel transistor 315 is connected to a gate of the n-channel transistor 316. The gate of the p-channel transistor 315 and the gate of the n-channel transistor 316 are connected to a first input terminal of the circuit 104. A gate of the p-channel transistor 314 is connected to a second input terminal (IN5) of the circuit 104. Furthermore, in the circuit 104, the second terminal of the p-channel transistor 315 and the first terminal of the n-channel transistor 316 are connected to an output terminal of the circuit 104. The output terminal of the circuit 104 is connected to the input terminal of the circuit 211.

A p-channel transistor 317 and an n-channel transistor 318 are connected in series in the circuit 211. In the circuit 211, a first terminal of the p-channel transistor 317 is connected to a wiring 805. A second terminal of the p-channel transistor 317 is connected to a first terminal of the n-channel transistor 318. A second terminal of the n-channel transistor 318 is connected to a wiring 806. Further, a gate of the p-channel transistor 317 is connected to a gate of the n-channel transistor 318, whereby the input terminal of the circuit 211 is formed. Furthermore, in the circuit 211, the second terminal of the p-channel transistor 317 and the first terminal of the n-channel transistor 318 are connected to an output terminal of the circuit 211 and are connected to the first input terminal of the circuit 104.

In the circuit diagram in FIG. 1, for example, a signal or a power supply voltage is input to the first input terminal (IN1) of the circuit 103, a second input terminal (IN2) of the circuit 103, and the second input terminal (IN5) of the circuit 104. For example, a clock signal is input to the first input terminal (IN1) of the circuit 103 and the second input terminal (IN5) of the circuit 104, and an input signal SP (a start pulse) is input to the second input terminal (IN2) of the circuit 103. Further, for example power supply voltages are supplied to the wiring 801, the wiring 802, the wiring 803, the wiring 804, the wiring 805, and the wiring 806. Signals can be supplied to these wirings. For example, the wiring 801, the wiring 803, and the wiring 805 are each connected to a wiring or a circuit supplied with the high potential power source VDD, and the wiring 802, the wiring 804, and the wiring 806 are each connected to a wiring or a circuit supplied with the low potential power source VSS.

Note that the first input terminal (IN1) of the circuit 103 can be connected to the second input terminal (IN5) of the circuit 104. Accordingly, the same signal can be supplied to the first input terminal (IN1) of the circuit 103 and the second input terminal (IN5) of the circuit 104, which results in reduction in the number of signals. Note that an embodiment of the present invention is not limited thereto. Signals supplied to the first input terminal (IN1) of the circuit 103 and the second input terminal (IN5) of the circuit 104 may be different from each other, which enables the circuit to be controlled more precisely. For example, an inverted signal of a signal input to the input terminal IN5 can be used as a signal input to the input terminal IN1.

Note that the second input terminal (IN2) of the circuit 103 can be functionally connected to the first input terminal (IN1) of the circuit 103 or the second input terminal (IN5) of the circuit 104. Accordingly, a signal input to the second input terminal (IN2) of the circuit 103 and a signal input to the first input terminal (IN1) of the circuit 103 or the second input terminal (IN5) of the circuit 104 can have a relation with each other. Alternatively, a slight signal delay can occur between a signal supplied to the second input terminal (IN2) of the circuit 103, and a signal supplied to the first input terminal (IN1) of the circuit 103 or the second input terminal (IN5) of the circuit 104. Note that an embodiment of the present invention is not limited thereto. A signal supplied to the second input terminal (IN2) of the circuit 103 and a signal supplied to the first input terminal (IN1) of the circuit 103 or the second input terminal (IN5) of the circuit 104 can have no relation with each other.

The wiring 801, the wiring 803, and the wiring 805 can be formed using wirings different from one another. At least two of the wirings 801, 803, and 805 can be connected to each other. Accordingly, for example, the same potential can be supplied to the wiring 801, the wiring 803, and the wiring 805. Connection of the wirings can lead to reduction in the number of wirings. Note that an embodiment of the present invention is not limited thereto. Similarly, the wiring 802, the wiring 804, and the wiring 806 can be formed using wirings different from one another. At least two of the wirings 802, 804, and 806 can be connected to each other. Accordingly, for example, the same potential can be supplied to the wiring 802, the wiring 804, and the wiring 806. Connection of the wirings can lead to reduction in the number of wirings. Note that an embodiment of the present invention is not limited thereto.

The operation example of the circuit in FIG. 1 is described. Here, a node corresponding to the output terminal of the circuit 103 is S1, and a node corresponding to the output terminal of the circuit 211 is S2. Note that an output terminal of the whole circuit in FIG. 1 can be either a node S1 or a node S2. Alternatively, the output terminal of the whole circuit in FIG. 1 can be the node S1 and the node S2. In other words, a circuit to which a signal is input from the node S1 can be distinguished from a circuit to which a signal is input from the node S2.

Figure 2:
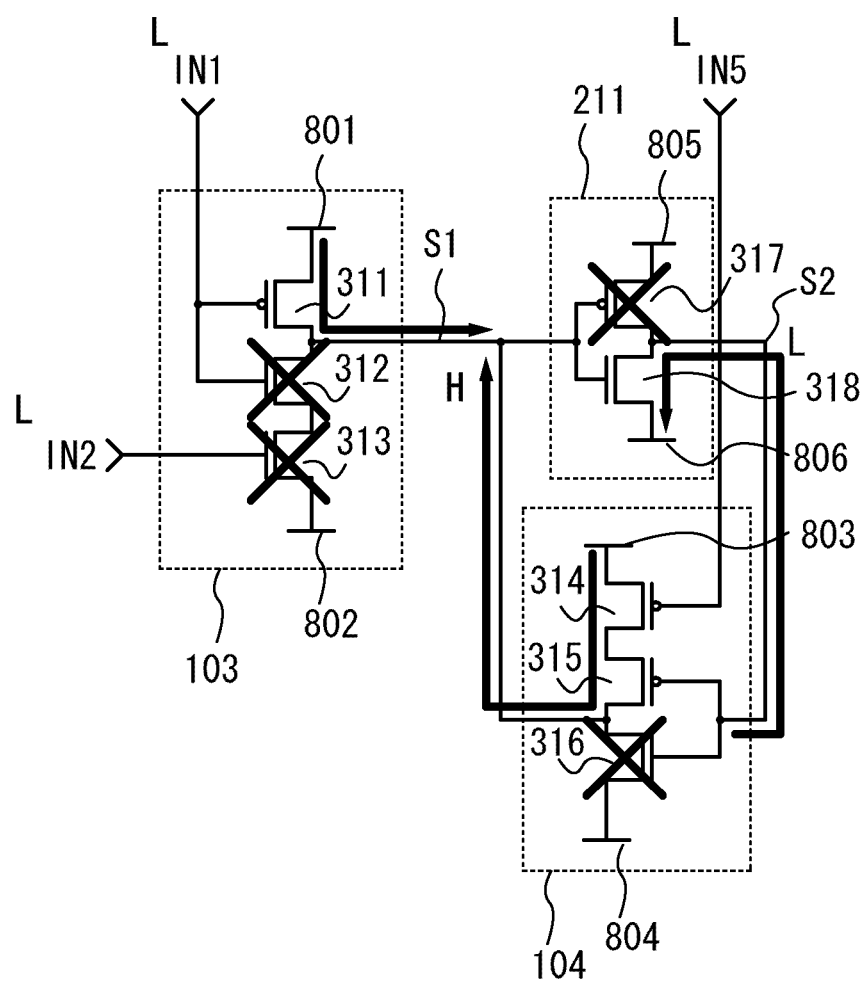
FIG. 2 illustrates an operation example of the circuit.

First, as illustrated in FIG. 2, L signals are supplied to the input terminal IN1 and the input terminal IN5, and an L signal is supplied to the input terminal IN2; consequently, the p-channel transistor 311 is turned on, the n-channel transistor 312 is tuned off, and the n-channel transistor 313 is turned off. As a result, the potential of the node S1 becomes an H level. Therefore, the p-channel transistor 317 is tuned off, and the n-channel transistor 318 is tuned on. Consequently, the potential of the node S2 becomes an L level. Therefore, the p-channel transistor 315 is turned on, and the n-channel transistor 316 is turned off. Consequently, since the p-channel transistor 314 is on, an H signal is output from the circuit 103 and the circuit 104 to the node S1. In other words, the potential of the signal in the node S1 and the node S2 is kept.

Figure 3:
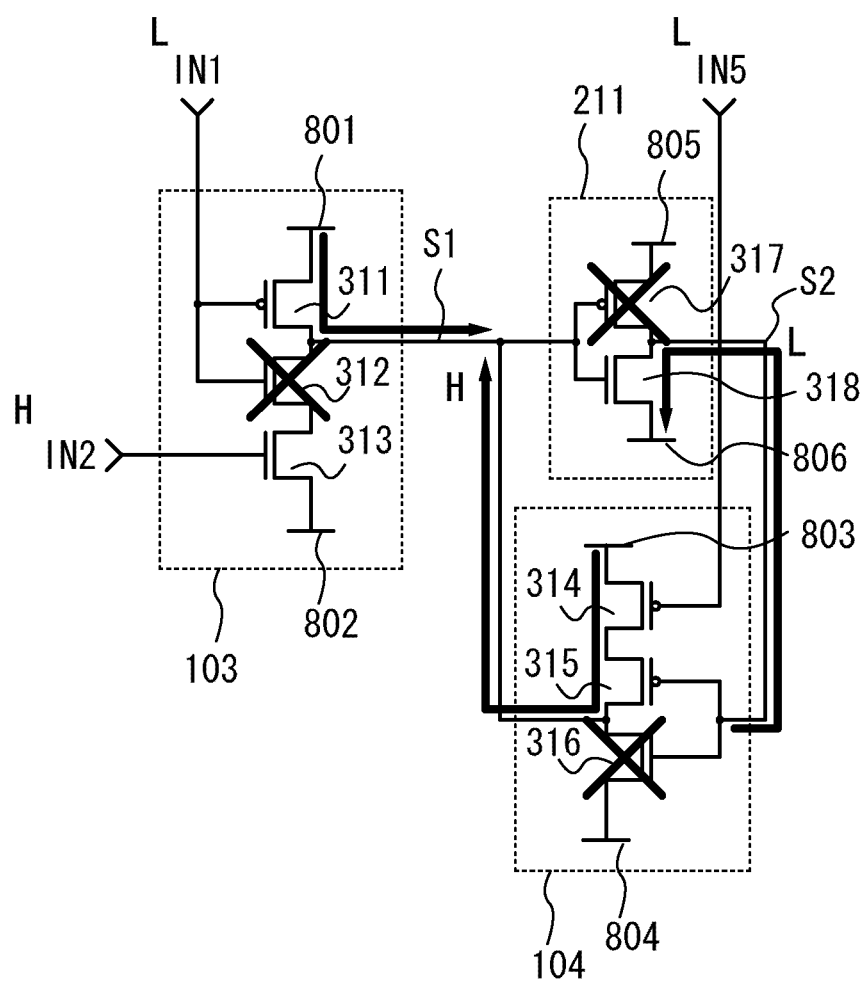
FIG. 3 illustrates an operation example of the circuit.

Next, as illustrated in FIG. 3, the signal supplied to the input terminal IN2 is changed to an H signal. Since the n-channel transistor 312 is off, the other states are not changed.

Figure 4:
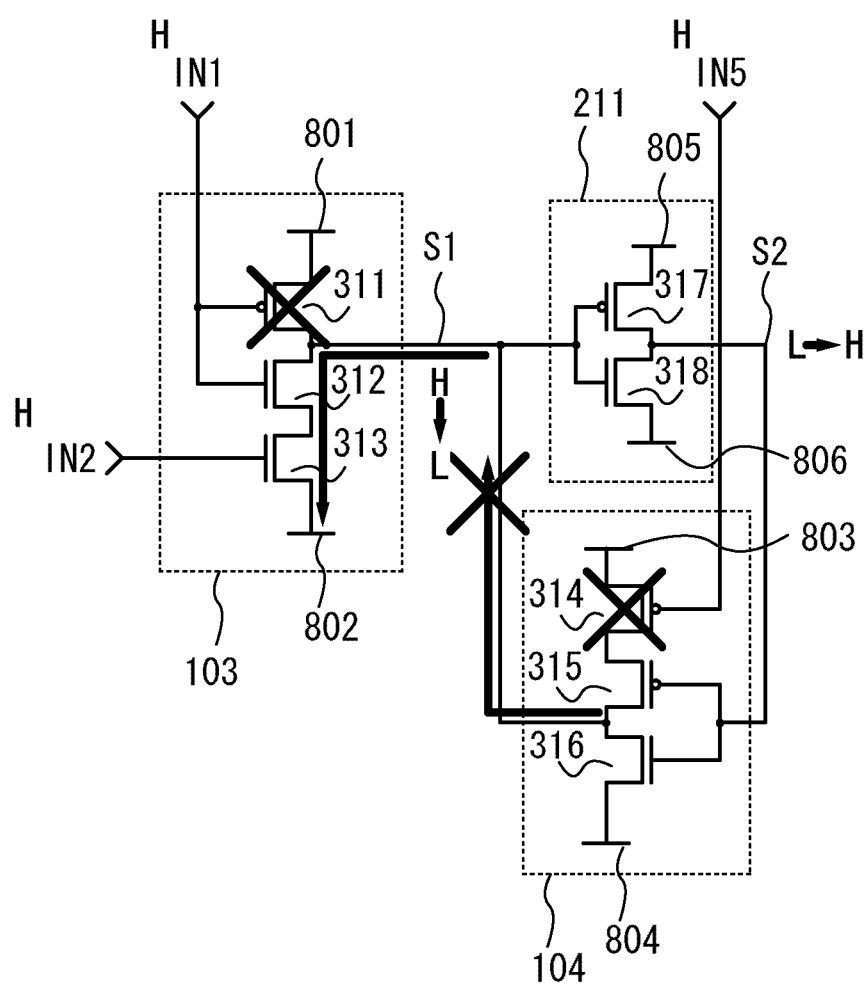
FIG. 4 illustrates an operation example of the circuit.

Then, as illustrated in FIG. 4, the signals supplied to the input terminal IN1 and the input terminal IN5 are changed to H signals. Consequently, the p-channel transistor 311 is turned off and the n-channel transistor 312 is turned on. As a result, the potential of the node S1 changes from the H level to the L level. Since the potential of the node S1 changes, the potential of the node S2 changes following the change in the potential of the node S1 because of the circuit 211. However, the potential of the node S2 is not changed yet because of the delay caused by the circuit 211. Therefore, the p-channel transistor 315 remains on. However, in the case where the p-channel transistor 314 is provided, the p-channel transistor 314 is turned off, and therefore, current is not supplied from the wiring 803 to the node S1. That is to say, current is supplied to the node S1, only from the wiring 802, and thus, the potential can be changed easily from the H level to the L level. If the p-channel transistor 314 is not provided, current is supplied from the wiring 803 to the node S1 through the p-channel transistor 315. In that case, current is supplied from the wiring 803 so that the potential of the node S1 is at the H level; accordingly, it is difficult for the potential of the node S1 to change to the L level. Accordingly, in such a case, it is preferable that the W/L, which is a ratio of the channel width (or the gate width) W to the channel length (or the gate length) L, of the p-channel transistor 315 be small and the W/L, which is a ratio of the channel width W to the channel length L, of the n-channel transistor 313 and/or the n-channel transistor 312 be large. More preferably, W/L of the n-channel transistor 312 is twice or more as large as W/L of the p-channel transistor 315. Alternatively, W of the n-channel transistor 313 is preferably twice or more as large as the W of the p-channel transistor 315. On the other hand, in the case where the p-channel transistor 314 is provided, W/L of the n-channel transistor 313 and W/L of the n-channel transistor 312 are not necessarily large. Accordingly, for example, W/L of the n-channel transistor 313 and W/L of the n-channel transistor 312 are as large as or smaller than W/L of the p-channel transistor 314. Therefore, W/L of the p-channel transistors in the circuit 104 and W/L of the p-channel transistor in the circuit 103 can be approximately equal to each other. Similarly, W/L of the n-channel transistor in the circuit 104 and W/L of the n-channel transistor in the circuit 103 can be approximately equal to each other. Here, a difference between "W/Ls which are approximately equal to each other" means that W/L ratios differ less than about ±10% of their values, more preferably, ±5%.

Figure 5:
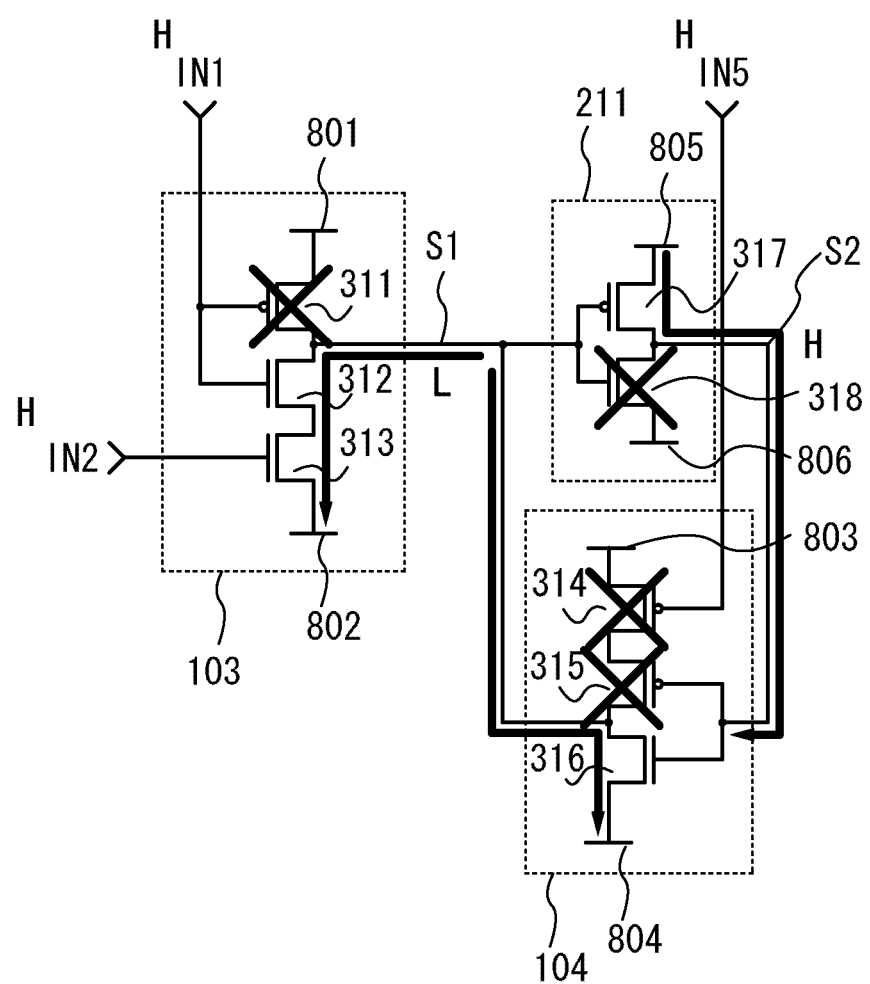
FIG. 5 illustrates an operation example of the circuit.

Next, as illustrated in FIG. 5, the potential of the node S1 completely becomes an L signal from an H signal; consequently, the p-channel transistor 317 is turned on and the n-channel transistor 318 is turned off. As a result, the potential of the node S2 becomes the H level. Consequently, the p-channel transistor 315 is turned off and the n-channel transistor 316 is turned on. Accordingly, an L signal is output from the circuit 103 and the circuit 104 to the node S1.

Figure 6:
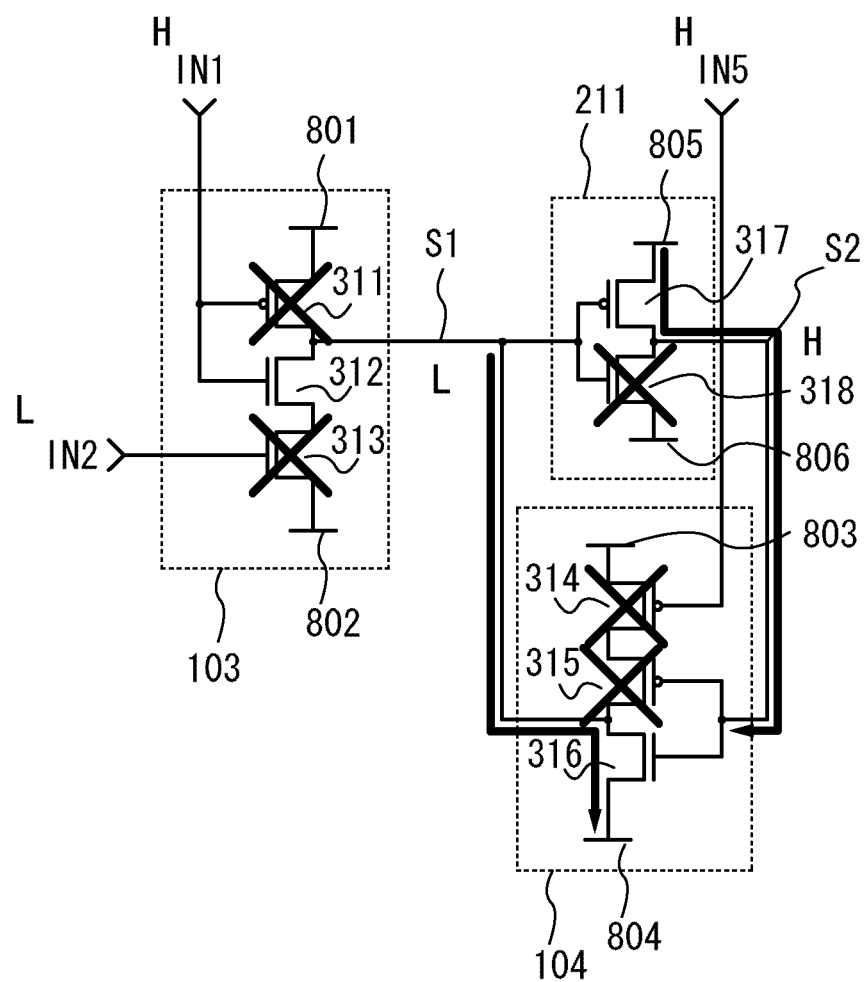
FIG. 6 illustrates an operation example of the circuit.

After that, as illustrated in FIG. 6, even when the signal supplied to the input terminal IN2 is changed to an L signal, the n-channel transistor 313 is turned off, and a signal is not output from the circuit 103, the node S1 can be stable because the node S1 is supplied with an L signal by the circuit 104. In other words, in the node S1, the potential of the signal is kept.

Note that as illustrated in FIG. 6, in the case where a signal supplied to the input terminal IN2 is changed to an L signal, the signal can be changed before the potential of the node S1 or the node S2 is completely stabilized. In the case where the potential of the node S1 or the node S2 is changed to some extent, the operation can be performed correctly even when the input terminal IN2 is changed to the L signal.

Figure 7:
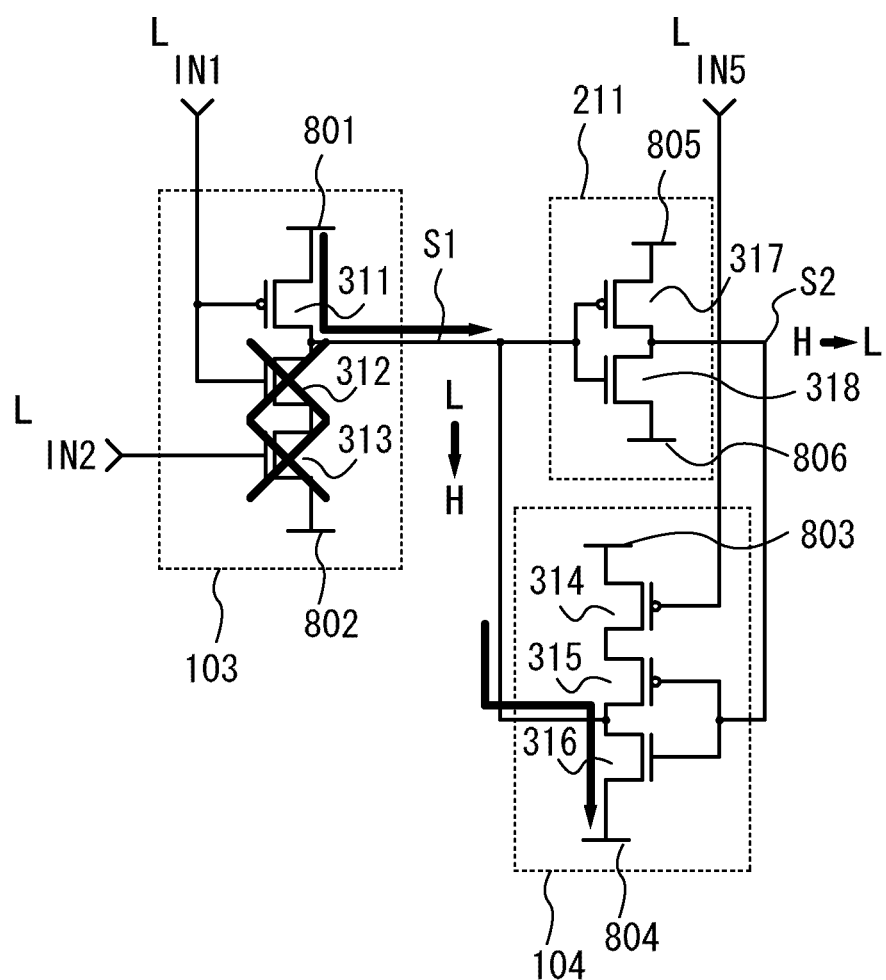
FIG. 7 illustrates an operation example of the circuit.

Next, as illustrated in FIG. 7, a signal supplied to the input terminal IN1 and the input terminal IN5 is changed to an L signal. Then, the p-channel transistor 311 is turned on and the n-channel transistor 312 is turned off. As a result, the potential of the node S1 changes from the L level to the H level. The potential of the node S1 changes, whereby the potential of the node S2 changes following the change in the potential of the node S1 because of the circuit 211. The potential of the node S2 is not changed yet because of the delay caused by the circuit 211. Therefore, the n-channel transistor 316 remains on. Therefore, it is preferable that the potential of the node S1 can be changed from L to H easily. For example, the current drive capability of the p-channel transistor 311 is preferably higher than the current drive capability of the n-channel transistor 316. Specifically, the W/L of the p-channel transistor 311 is preferably larger than the W/L of the n-channel transistor 316. More preferably, the W/L of the p-channel transistor 311 is twice or more as large as the W/L of the n-channel transistor 316. Alternatively, the W of the p-channel transistor 311 is preferably twice or more as large as the W of the n-channel transistor 316.

Note that an embodiment of the present invention is not limited thereto. An n-channel transistor may be connected to the n-channel transistor 316 in series, whereby it is possible not to supply current from the wiring 804 to the node S1. In that case, current is supplied to the node S1, only from the wiring 801, and thus, the potential can be changed easily from the L level to the H level. Accordingly, in that case, the W/L of the p-channel transistor 311 is not necessarily large. Therefore, for example, the W/L of the p-channel transistor 311 is as large as or smaller than the W/L of the n-channel transistor 316. Therefore, in that case, the W/L of at least one p-channel transistor in the circuit 104 and the W/L of at least one p-channel transistor in the circuit 103 can be approximately equal to each other. The W/L of at least one n-channel transistor in the circuit 104 and the W/L of at least one n-channel transistor in the circuit 103 can be approximately equal to each other. Here, a difference between "W/Ls which are approximately equal to each other" means that W/L ratios differ of less than about ±10% of their values, more preferably, ±5%.

Note that in the case where an n-channel transistor is added to be connected to the n-channel transistor 316 in series, a gate of the n-channel transistor can be connected to the gate of the n-channel transistor 316. Accordingly, increase in the number of wirings and signals can be suppressed. Note that an embodiment of the present invention is not limited thereto. The gate of the n-channel transistor can be connected to a wiring other than the gate of the n-channel transistor 316. Accordingly, operation can be controlled precisely.

Figure 8:
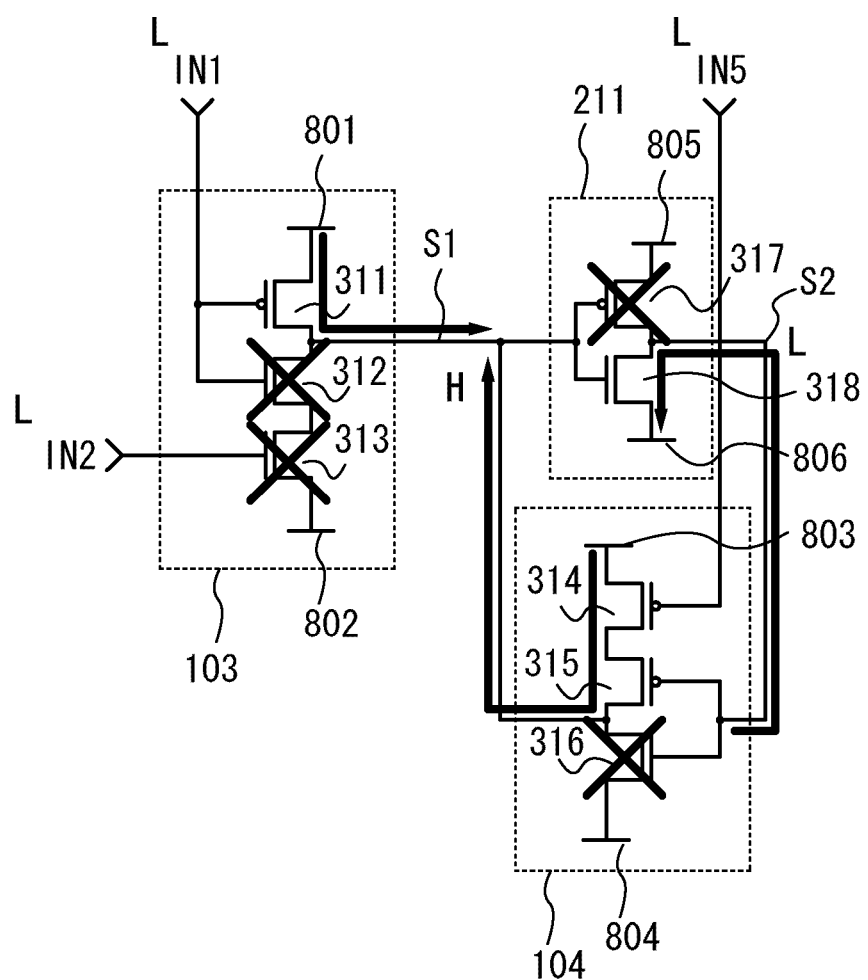
FIG. 8 illustrates an operation example of the circuit.

Next as illustrated in FIG. 8, the potential of the node S1 becomes completely an H signal; consequently, the p-channel transistor 317 is turned off and the n-channel transistor 318 is turned on. As a result, the potential of the node S2 becomes the L level. Consequently, the p-channel transistor 315 is turned on and the n-channel transistor 316 is turned off. Accordingly, since the p-channel transistor 314 is on, H signals are output from the circuit 103 and the circuit 104 to the node S1.

Figure 9:
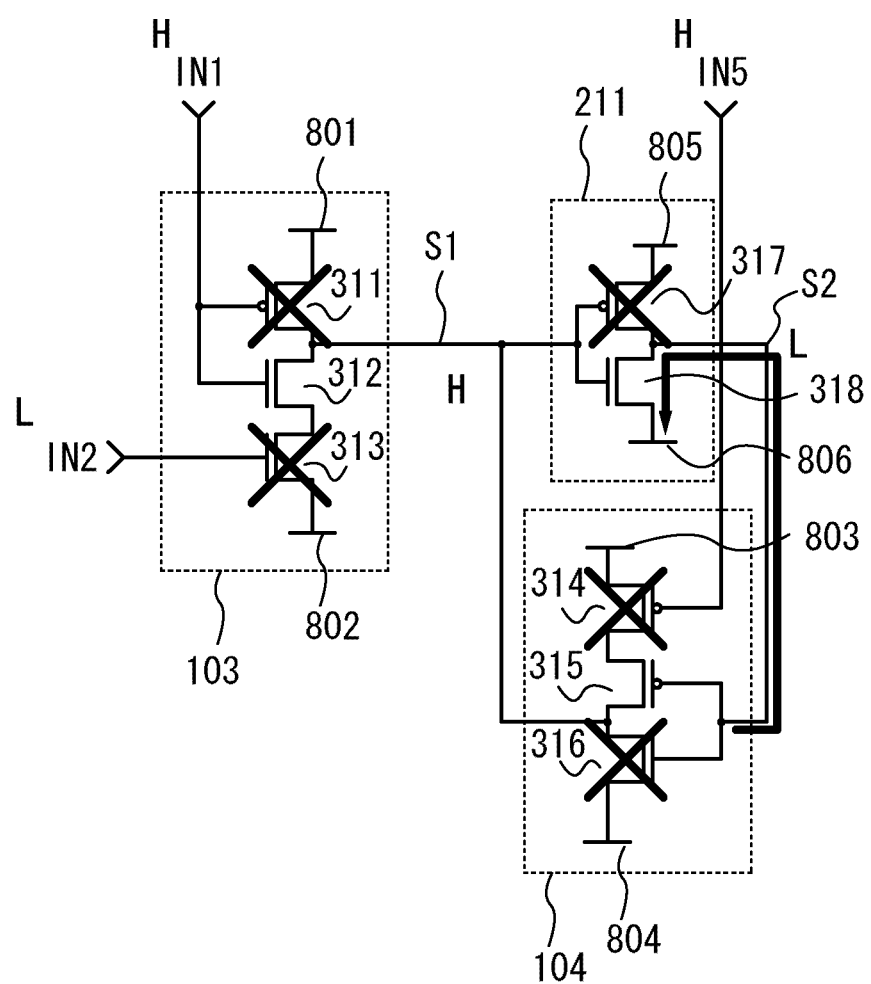
FIG. 9 illustrates an operation example of the circuit.

Next, as illustrated in FIG. 9, a signal supplied to the input terminal IN1 and the input terminal IN5 is changed to an H signal. Then, the p-channel transistor 311 is turned off and the n-channel transistor 312 is turned on. As a result, the potential of the node S1 remains at the H level. Therefore, the p-channel transistor 317 remains off and the n-channel transistor 318 remains on. Consequently, the potential of the node S2 remains L and is not changed. However, the p-channel transistor 314 is turned off, and thus, a signal is not output to the node S1 also from the circuit 104. Accordingly, the potential of the node S1 remains H and is not changed. That is to say, the node S1 is in a floating state.

Next, as illustrated in FIG. 8, the signals supplied to the input terminal IN1 and the input terminal IN5 is changed to L signals. Then, H signals are output from the circuit 103 and the circuit 104 to the node S1. Accordingly, in FIG. 9, even when the node S1 is in a floating state and the potential of the node S1 is slightly changed because of noise or the like, when the signals are supplied to the input terminal IN1 and the input terminal IN5 become L signals as illustrated in FIG. 8, the potential of the node S1 can be at the H level.

After that, as an example, operations shown in FIG. 8 and FIG. 9 are alternately repeated.

Figure 10:
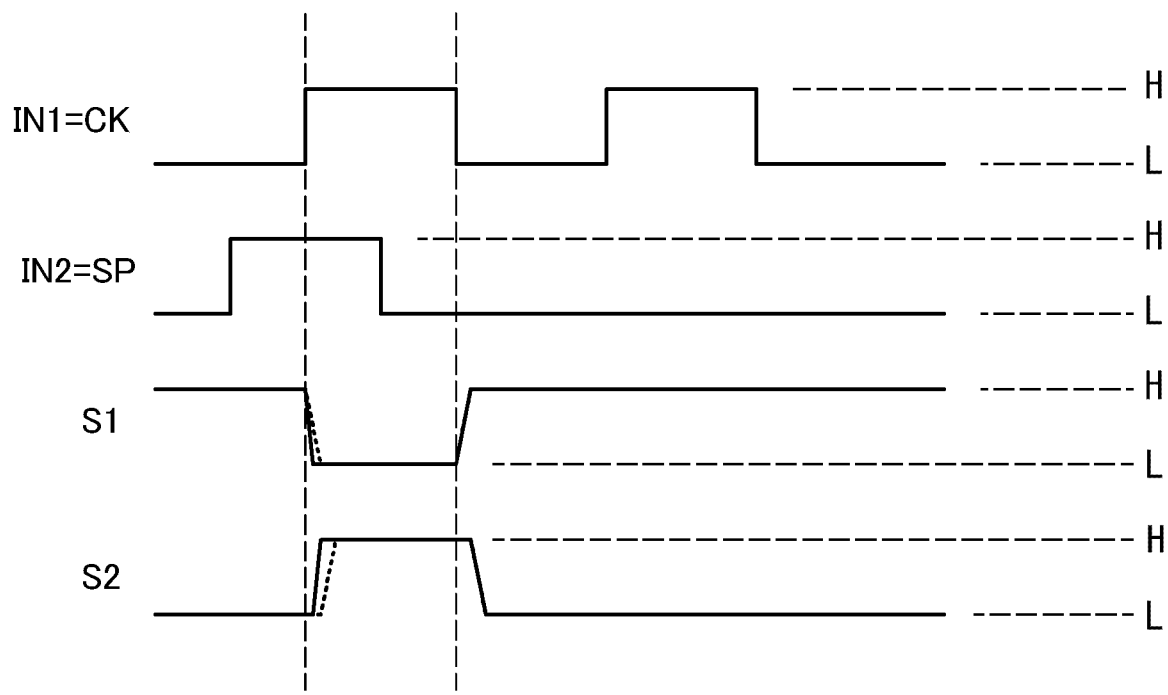
FIG. 10 is an example of a timing diagram of Embodiment 1.

FIG. 10 illustrates a timing diagram of the circuit in FIG. 1, FIG. 2, FIG. 3, FIG. 4, FIG. 5, FIG. 6, FIG. 7, FIG. 8, and FIG. 9 by a solid line. Note that by a dotted line, FIG. 10 also shows a timing diagram in the case where the input terminal IN5 and the p-channel transistor 314 are not provided. In the node S1 and the node S2, the signal can be changed quickly in comparison with the case where the p-channel transistor 314 is not provided. That is to say, the p-channel transistor 314 is provided, whereby the node S1 is charged quickly and surely. Accordingly, a circuit which operates stably can be provided. Alternatively, the circuit can operate stably even when characteristics of transistors vary.

Note that the circuit 104 of the circuit diagram in FIG. 1 is also referred to as a configuration in which the p-channel transistor 314 is added to an inverter which includes the p-channel transistor 315 and the n-channel transistor 316, so that the p-channel transistor 314 is connected to the p-channel transistor 315 in series. At the timing in which the potential of the node S1 is changed from the H level to the L level, with the use of the added transistor, the H level of the clock signal is input to the gate of the p-channel transistor 314 (an input terminal IN5) to turn off the p-channel transistor 314, which prevents current inhibiting charging from flowing into the node S1. Therefore, the signal of the node S1 can be changed quickly. On the other hand, an n-channel transistor can be added to be connected to the n-channel transistor 316 in series. In that case, a gate of the n-channel transistor can be connected to the gate of the p-channel transistor 314 of the circuit 104. Note that an embodiment of the present invention is not limited thereto. The gate of the n-channel transistor can be connected to the other wiring. However, even when the node S1 is connected to the wiring 804 through only the n-channel transistor 316 without adding an n-channel transistor, the circuit can operate without problems. That is to say, the n-channel transistor 316 and the wiring 804 in the circuit 104 can be directly connected to each other. In that case, since the n-channel transistor 316 is not connected to an n-channel transistor in series, the number of control signals is not necessarily increased. Alternatively, because a transistor is not provided, the layout area of the circuit can be small. Alternatively, noise generated through transistors can be reduced. Alternatively, possibility of reduction in the amount of current due to on resistance of a transistor can be decreased because a transistor is not provided to be connected in series. Accordingly, delay of a signal caused when the potential of the node S1 is changed from the H level to the L level can be reduced.

Note that the circuit 103 of the circuit diagram in FIG. 1 is also referred to as a configuration in which the n-channel transistor 313 is added to an inverter which includes the p-channel transistor 311 and the n-channel transistor 312, so that the n-channel transistor 313 is connected to the n-channel transistor 312 in series. Therefore, it is possible not to provide an n-channel transistor 313 and the input terminal IN2. That is to say, the node S1 and the wiring 802 can be connected through only the n-channel transistor 312. Alternatively, a p-channel transistor may be added to be connected to the p-channel transistor 311 in series. In that case, a gate of the p-channel transistor can be connected to a wiring other than the input terminal IN1. Note that even when the node S1 is connected to the wiring 801 through only the p-channel transistor 311 without adding a p-channel transistor, the circuit can operate without problems. That is to say, the first terminal of the p-channel transistor 311 in the circuit 103 can be directly connected to the wiring 801. In that case, since the p-channel transistor 311 is not connected to a p-channel transistor in series, the number of control signals is not necessarily increased. Alternatively, because a transistor is not provided, the layout area of the circuit can be small. Alternatively, noise generated through transistors can be reduced. Alternatively, possibility of reduction in the amount of current due to on resistance of a transistor can be decreased because a transistor is not provided to be connected in series. Accordingly, delay of a signal caused when the potential level of the node S1 is changed from the L level to the H level can be reduced.

Note that the circuit 211 of the circuit diagram in FIG. 1 is also referred to as a configuration of an inverter which includes the p-channel transistor 317 and the n-channel transistor 318. Accordingly, for example, a p-channel transistor is added to be connected to the p-channel transistor 317 in series. In that case, a gate of the p-channel transistor can be connected to a wiring other than the gate of the p-channel transistor 317 or the input terminal IN5. Note that even when the node S2 is connected to the wiring 805 through only the p-channel transistor 317 without adding a p-channel transistor, the circuit can operate without problems. That is to say, the first terminal of the p-channel transistor 317 in the circuit 211 can be directly connected to the wiring 805. In that case, since the p-channel transistor 317 is not connected to a p-channel transistor in series, the number of control signals is not necessarily increased. Alternatively, because a transistor is not provided, the layout area of the circuit can be small. Alternatively, noise generated through transistors can be reduced. Alternatively, possibility of reduction in the amount of current due to on resistance of a transistor can be decreased because a transistor is not provided to be connected in series. Accordingly, delay of a signal caused when the potential of the node S2 is changed from the L level to the H level can be reduced.

The circuit 211 of the circuit diagram in FIG. 1 can have a configuration in which an n-channel transistor is added to be connected to the n-channel transistor 318 in series. In that case, a gate of the n-channel transistor can be connected to a wiring other than the gate of the n-channel transistor 318 or the input terminal IN5. Note that even when the node S2 is connected to the wiring 806 through only the n-channel transistor 318 without adding an n-channel transistor, the circuit can operate without problems. That is to say, the first terminal of the n-channel transistor 318 in the circuit 211 can be directly connected to the wiring 806. In that case, since the n-channel transistor 318 is not connected to an n-channel transistor in series, the number of control signals is not necessarily increased. Alternatively, because a transistor is not provided, the layout area of the circuit can be small. Alternatively, noise generated through transistors can be reduced. Alternatively, possibility of reduction in the amount of current due to on resistance of a transistor can be decreased because a transistor is not provided to be connected in series.

Accordingly, delay of a signal caused when the potential of the node S2 is changed from the H level to the L level can be reduced.

Note that in the circuit configuration in FIG. 1, the output terminal of the circuit 103 is connected to the n-channel transistor 312, and the wiring 802 is connected to the n-channel transistor 313; however, the order of the n-channel transistor 312 and the n-channel transistor 313 can be changed to be connected in series. Accordingly, the output terminal of the circuit 103 can be connected to the n-channel transistor 313, and the wiring 802 can be connected to the n-channel transistor 312. Further, the output terminal of the circuit 104 is connected to the p-channel transistor 315, and the wiring 803 is connected to the p-channel transistor 314; however, the order of the p-channel transistor 314 and the p-channel transistor 315 can be changed to be connected in series. Accordingly, the output terminal of the circuit 104 can be connected to the p-channel transistor 314, and the wiring 803 can be connected to the p-channel transistor 315. Note that the same can be applied to the case where a transistor is added to be connected to the p-channel transistor 311 in series, and the case where a transistor is added to be connected to the n-channel transistor 316 in series. There are various arrangements of transistors.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In particular, in the case where the number of portions to which the terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Embodiment 2

In this embodiment, an example of a circuit configuration of the present invention will be described with reference to FIG. 11. The circuit in FIG. 11 corresponds to a circuit in which the polarity of transistors and the potential level of nodes in the circuit in FIG. 1 are inverted. That is to say, the p-channel transistors of the circuit in FIG. 1 are replaced with n-channel transistors, and the n-channel transistor of the circuit in FIG. 1 are replaced with p-channel transistors. Then, as for a signal or a power supply potential, a circuit in which the H level potential, the L level potential, VDD, and VSS in the circuit FIG. 1 are made to be the L level potential, the H level potential, VSS, and VDD, respectively, corresponds to the circuit in FIG. 11. Therefore, the content described in Embodiment 1 can be applied to, combined with, or replaced with this embodiment.

Figure 11:
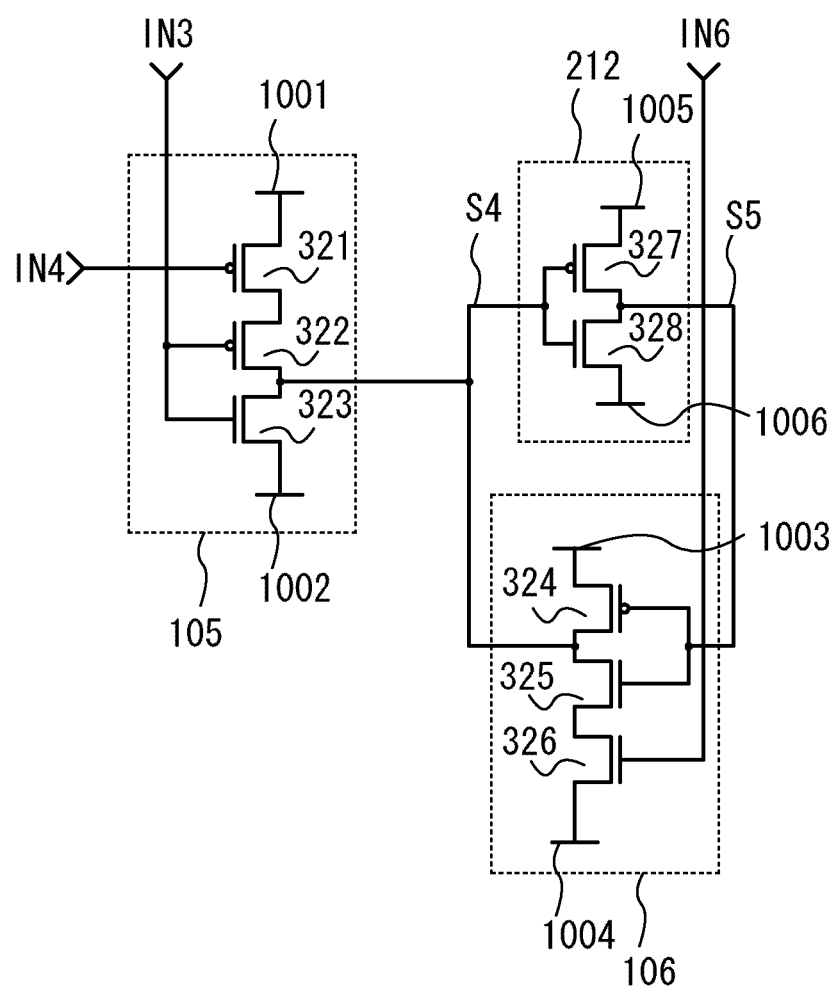
FIG. 11 is a circuit diagram of an example of a configuration of Embodiment 2.
Figure 12:
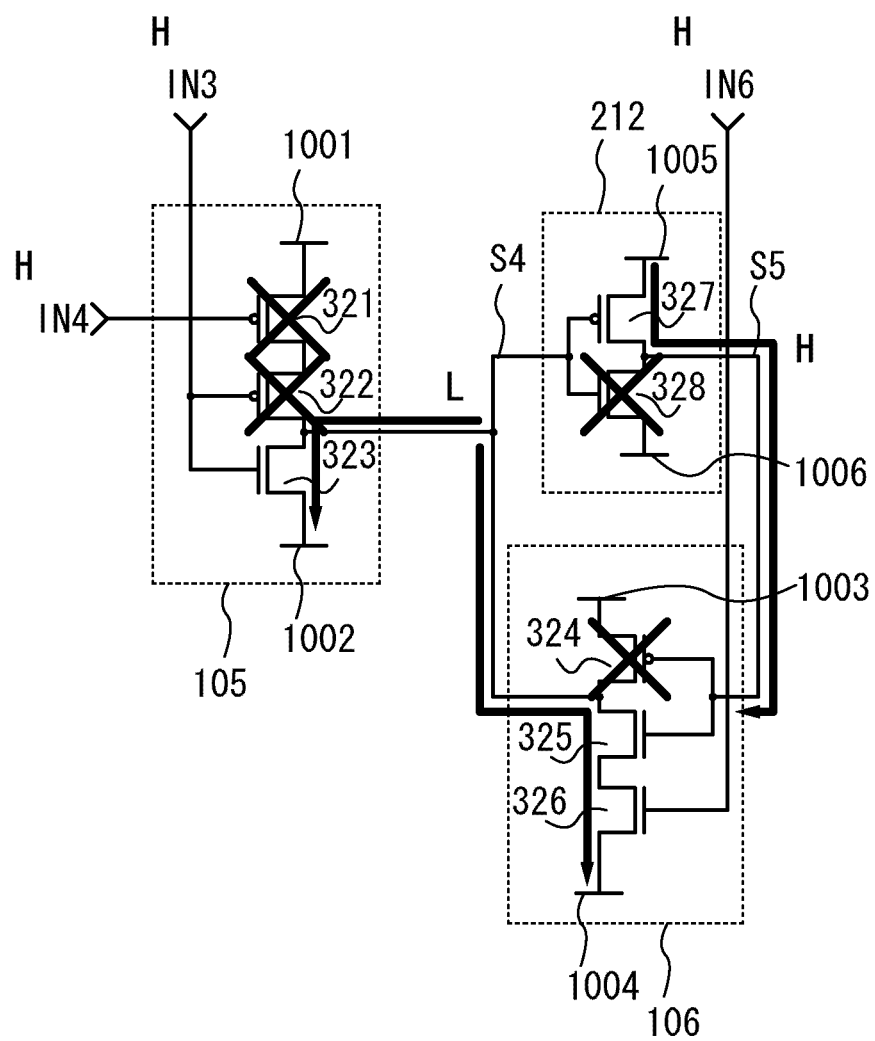
FIG. 12 illustrates an operation example of the circuit.
Figure 13:
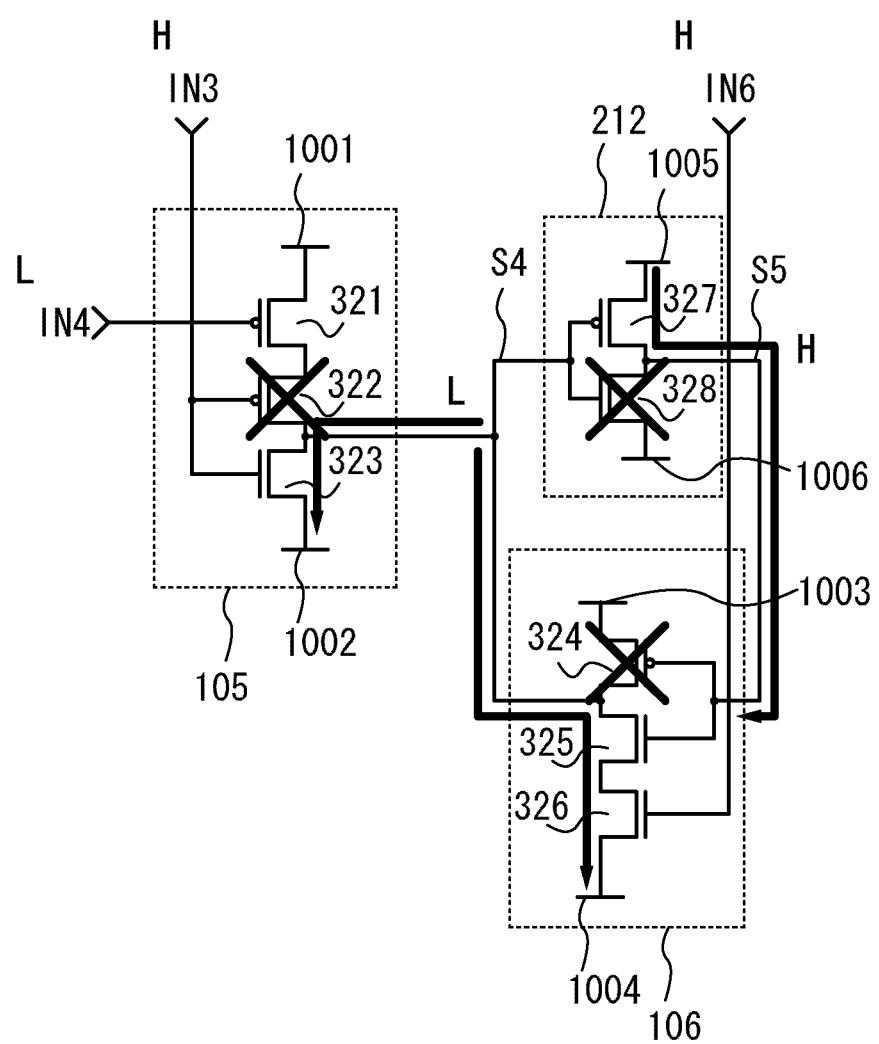
FIG. 13 illustrates an operation example of the circuit.
Figure 14:
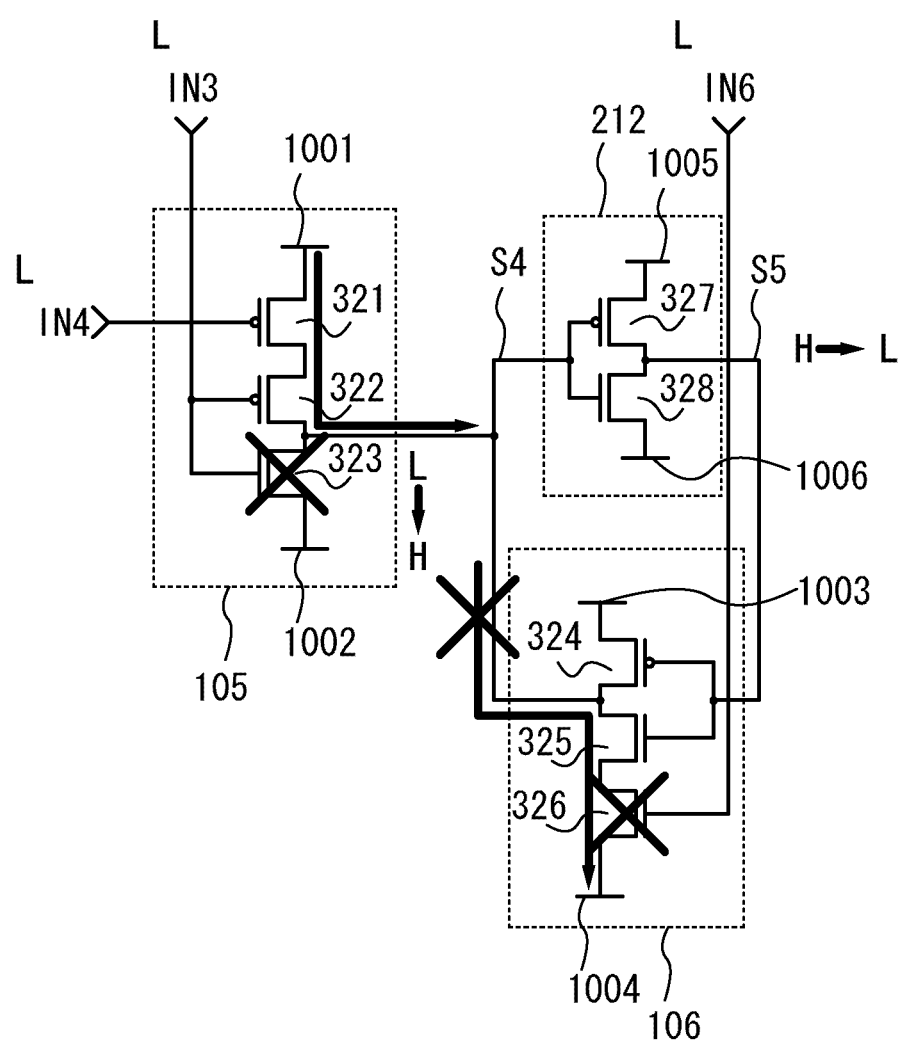
FIG. 14 illustrates an operation example of the circuit.
Figure 15:
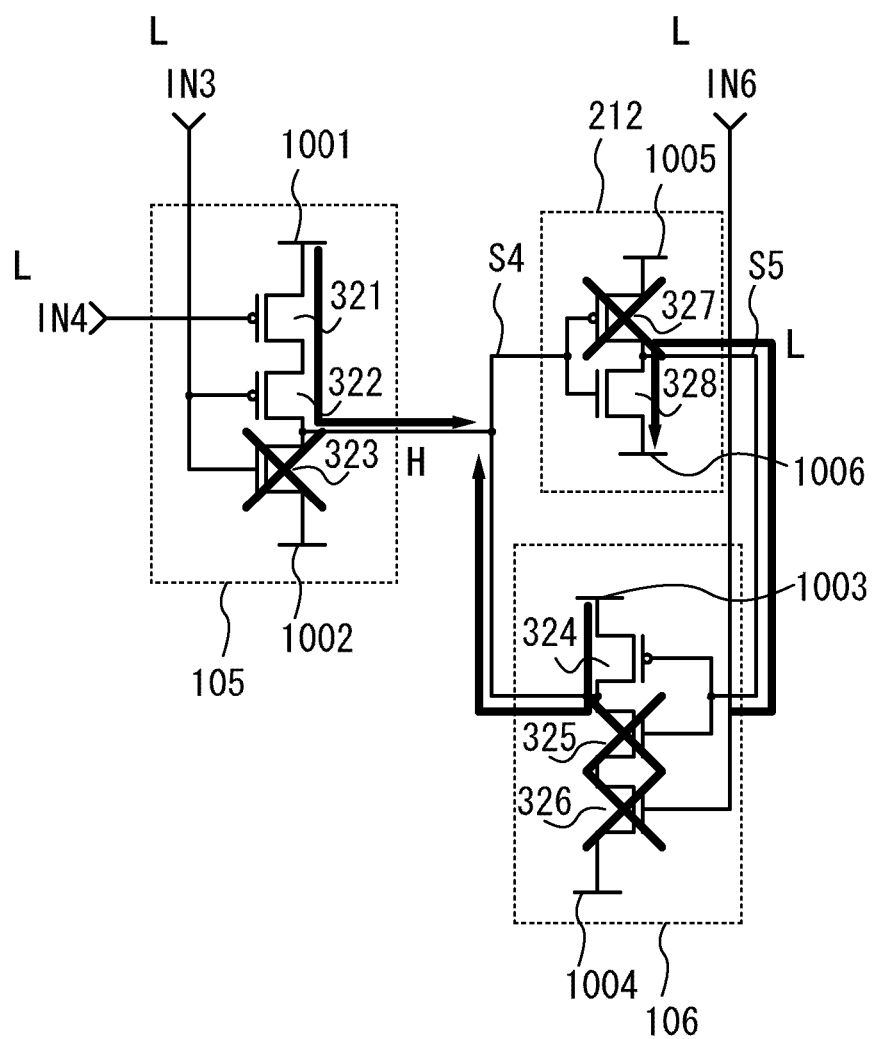
FIG. 15 illustrates an operation example of the circuit.
Figure 16:
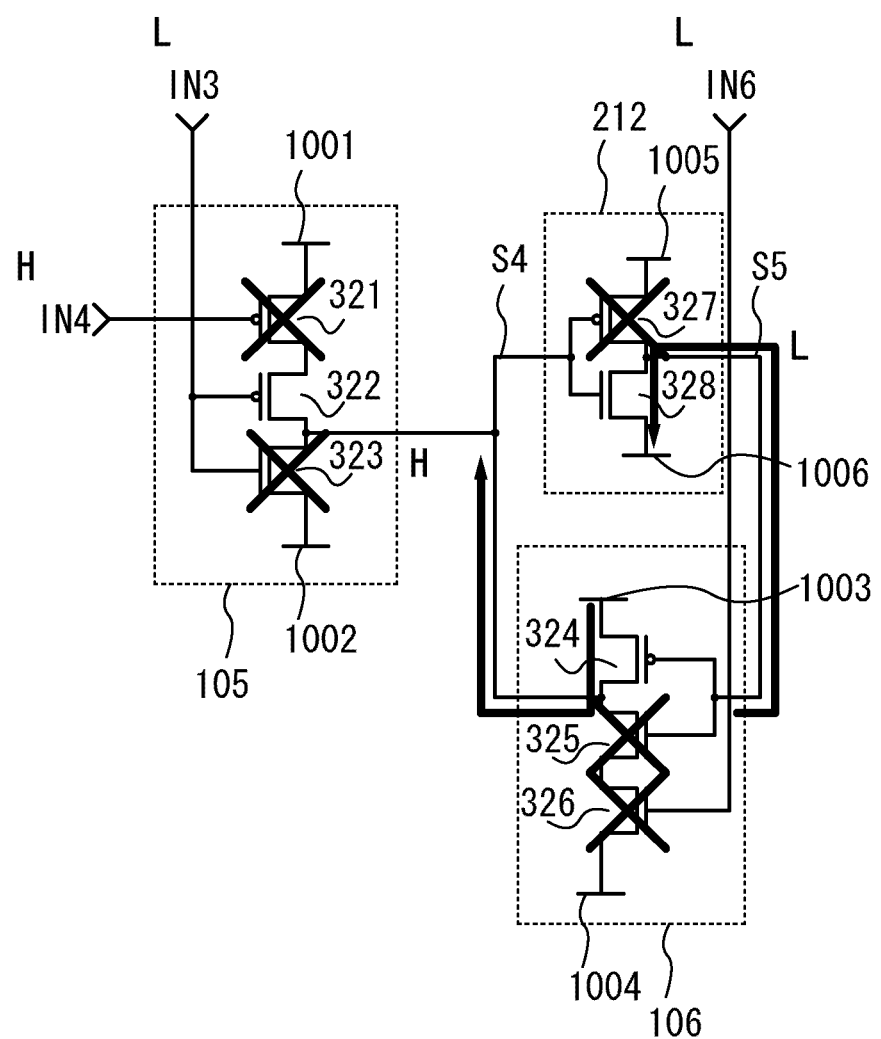
FIG. 16 illustrates an operation example of the circuit.
Figure 17:
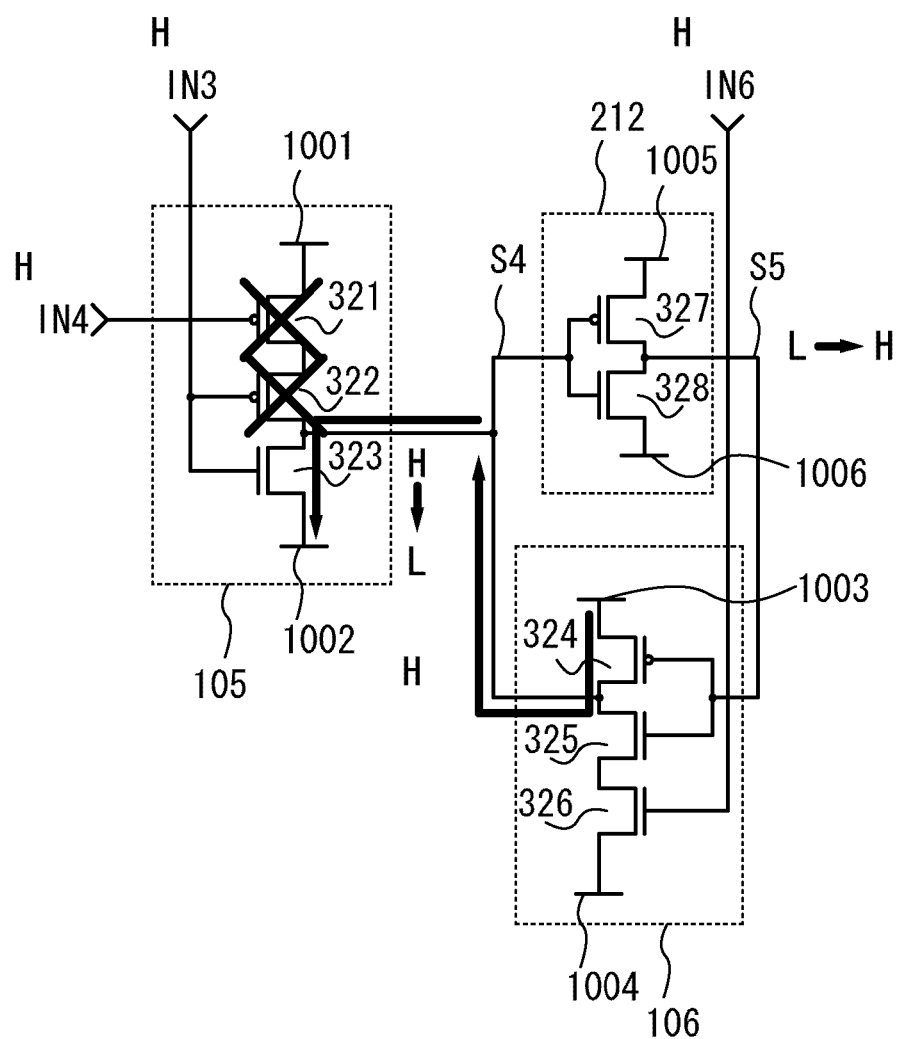
FIG. 17 illustrates an operation example of the circuit.
Figure 18:
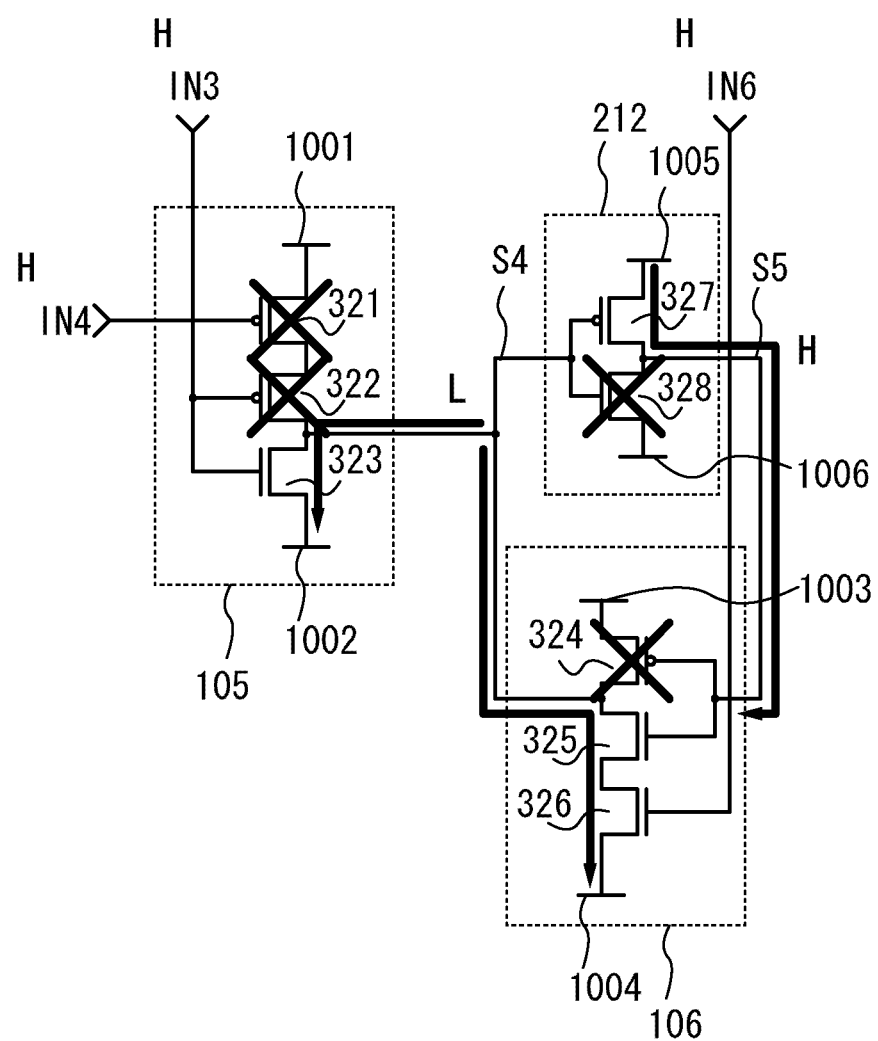
FIG. 18 illustrates an operation example of the circuit.
Figure 19:
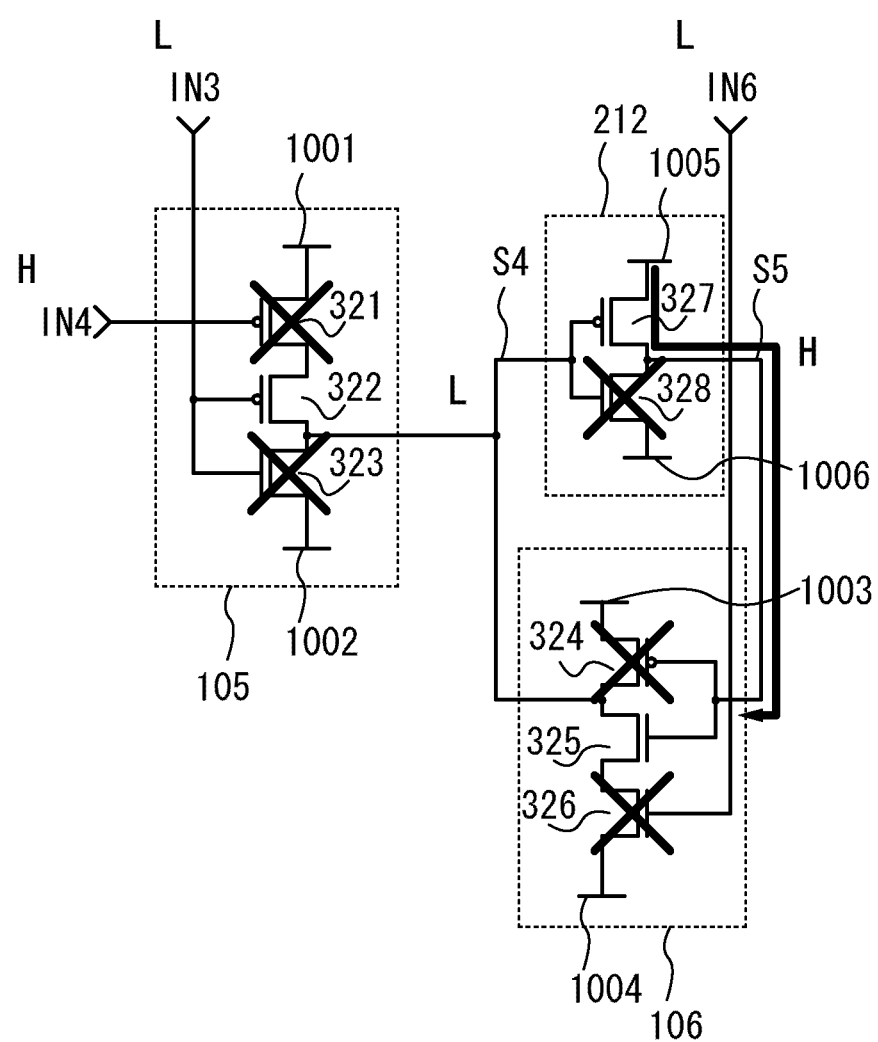
FIG. 19 illustrates an operation example of the circuit.

FIG. 11 illustrates an example of a circuit configuration of a flip flop operating with the use of a single phase clock signal, which is different from that in Embodiment 1. The circuit in FIG. 11 includes a circuit 105, a circuit 106, and the circuit 212.

A p-channel transistor 321, the p-channel transistor 322, and the n-channel transistor 323 are connected in series in the circuit 105. In the circuit 105, a first terminal of the p-channel transistor 321 is connected to a wiring 1001. A second terminal of the p-channel transistor 321 is connected to a first terminal of the p-channel transistor 322. A second terminal of the p-channel transistor 322 is connected to a first terminal of the n-channel transistor 323. A second terminal of the n-channel transistor 323 is connected to a wiring 1002. Further, in the circuit 105, the gate of the p-channel transistor 322 and the gate of the n-channel transistor 323 are connected and form a first input terminal (IN3) of the circuit 105. A gate of the p-channel transistor 321 is connected to a second input terminal (IN4) of the circuit 105. Furthermore, in the circuit 105, the second terminal of the p-channel transistor 322 and the first terminal of the n-channel transistor 323 are connected to an output terminal of the circuit 105 and an input terminal of the circuit 212.

A p-channel transistor 324, an n-channel transistor 325, and an n-channel transistor 326 are connected in series in the circuit 106. In the circuit 106, a first terminal of the p-channel transistor 324 is connected to a wiring 1003. A second terminal of the p-channel transistor 324 is connected to a first terminal of the n-channel transistor 325. A second terminal of the n-channel transistor 325 is connected to a first terminal of the n-channel transistor 326. A second terminal of the n-channel transistor 326 is connected to a wiring 1004. Further, in the circuit 106, a gate of the n-channel transistor 325 is connected to a gate of the n-channel transistor 326. The gate of the n-channel transistor 325 and the gate of the n-channel transistor 326 are connected to a first input terminal of the circuit 106. A gate of the p-channel transistor 324 is connected to a second input terminal (IN6) of the circuit 106. Furthermore, in the circuit 106, the second terminal of the p-channel transistor 324 and the first terminal of the n-channel transistor 325 are connected to an output terminal of the circuit 106 and the input terminal of the circuit 212.

A p-channel transistor 327 and an n-channel transistor 328 are connected in series in the circuit 212. In the circuit 212, a first terminal of the p-channel transistor 327 is connected to a wiring 1005. A second terminal of the p-channel transistor 327 is connected to a first terminal of the n-channel transistor 328. A second terminal of the n-channel transistor 328 is connected to a wiring 1006. Further, a gate of the p-channel transistor 327 is connected to a gate of the n-channel transistor 328, and they are connected to the input terminal of the circuit 212. Furthermore, in the circuit 212, the second terminal of the p-channel transistor 327 and the first terminal of the n-channel transistor 328 are connected to an output terminal of the circuit 212 and are connected to the first input terminal of the circuit 106.

In the circuit diagram in FIG. 11, for example, a signal or a power supply voltage is input to the first input terminal (IN3) of the circuit 105, a second input terminal (IN4) of the circuit 105, and the second input terminal (IN6) of the circuit 106. For example, a clock signal is input to the first input terminal (IN3) of the circuit 105 and the second input terminal (IN6) of the circuit 106, and an input signal SP (a start pulse) is input to the second input terminal (IN4) of the circuit 105. Further, for example a power supply voltage is supplied to the wiring 1001, the wiring 1002, the wiring 1003, the wiring 1004, the wiring 1005, and the wiring 1006. A signal can be supplied to these wirings. For example, the wiring 1001, the wiring 1003, and the wiring 1005 are each connected to a wiring or a circuit supplied with the high potential power source VDD, and the wiring 1002, the wiring 1004, and the wiring 1006 are each connected to a wiring or a circuit supplied with the low potential power source VSS.

Note that the first input terminal (IN3) of the circuit 105 can be connected to the second input terminal (IN6) of the circuit 106. Accordingly, the same signal can be supplied to the first input terminal (IN3) of the circuit 105 and the second input terminal (IN6) of the circuit 106, which results in reduction in the number of signals. Note that an embodiment of the present invention is not limited thereto. Signals supplied to the first input terminal (IN3) of the circuit 105 and the second input terminal (IN6) of the circuit 106 may be different from each other, which enables the circuit to be controlled more precisely. For example, an inverted signal of a signal input to the input terminal IN6 can be used as a signal input to the input terminal IN3.

Note that the second input terminal (IN4) of the circuit 105 can be functionally connected to the first input terminal (IN3) of the circuit 105 or the second input terminal (IN6) of the circuit 106. Accordingly, a signal input to the second input terminal (IN4) of the circuit 105 and a signal input to the first input terminal (IN3) of the circuit 105 or the second input terminal (IN6) of the circuit 106 can have a relation with each other. Alternatively, a slight signal delay occurs between a signal supplied to the second input terminal (IN4) of the circuit 105, and a signal supplied to the first input terminal (IN3) of the circuit 105 or the second input terminal (IN6) of the circuit 106. Note that an embodiment of the present invention is not limited thereto. A signal supplied to the second input terminal (IN4) of the circuit 105 and a signal supplied to the first input terminal (IN3) of the circuit 105 or the second input terminal (IN6) of the circuit 106 can have no relation with each other.

The wiring 1001, the wiring 1003, and the wiring 1005 can be formed using wirings different from one another. At least two of the wirings 1001, 1003, and 1005 can be connected to each other. Accordingly, for example, the same potential can be supplied to the wiring 1001, the wiring 1003, and the wiring 1005. Connection of the wirings can lead to reduction in the number of wirings. Note that an embodiment of the present invention is not limited thereto. Similarly, the wiring 1002, the wiring 1004, and the wiring 1006 can be formed using wirings different from one another. At least two of the wirings 1002, 1004, and 1006 can be connected to each other. Accordingly, for example, the same potential can be supplied to the wiring 1002, the wiring 1004, and the wiring 1006. Connection of the wirings can lead to reduction in the number of wirings. Note that an embodiment of the present invention is not limited thereto.

Next, an operation example of the circuit in FIG. 11 is illustrated in FIG. 12, FIG. 13, FIG. 14, FIG. 15, FIG. 16, FIG. 17, FIG. 18, and FIG. 19. The operation is similar to the operation illustrated in FIG. 2, FIG. 3, FIG. 4, FIG. 5, FIG. 6, FIG. 7, FIG. 8, and FIG. 9 though there are differences in the level of the potential and the polarity of transistors.

Note that, in the case where the n-channel transistor 326 is not provided, it is preferable that the W/L, which is a ratio of the channel width (or the gate width) W to the channel length (or the gate length) L, of the n-channel transistor 325 be small and the W/L, which is a ratio of the channel width W to the channel length L, of the p-channel transistor 321 and/or the p-channel transistor 322 be large. More preferably, the W/L of the p-channel transistor 322 is twice or more as large as the W/L of the n-channel transistor 325. Alternatively, the W of the p-channel transistor 321 is preferably twice or more as large as the W of the n-channel transistor 325.

Alternatively, in the case where the n-channel transistor 326 is not provided, the W/L of the p-channel transistor 322 and the W/L of the p-channel transistor 322 are not necessarily large. Accordingly, for example, the W/L of the p-channel transistor 321 and the W/L of the p-channel transistor 322 are as large as or smaller than the W/L of the n-channel transistor 326. Therefore, the W/L of the p-channel transistors in the circuit 105 and the W/L of the p-channel transistor in the circuit 106 can be approximately equal to each other. The W/L of the n-channel transistor in the circuit 105 and the W/L of the n-channel transistor in the circuit 106 can be approximately equal to each other. Here, a difference between "W/Ls which are approximately equal to each other" means that W/L ratios differ less than about ±10% of their values, more preferably, ±5%.

In the case where a p-channel transistor is not provided to be connected to the p-channel transistor 324 in series, the current drive capability of the n-channel transistor 323 is preferably higher than the current drive capability of the p-channel transistor 324. Specifically, the W/L of the n-channel transistor 323 is preferably larger than the W/L of the p-channel transistor 324. More preferably, the W/L of the n-channel transistor 323 is twice or more as large as the W/L of the p-channel transistor 324. Alternatively, the W of the n-channel transistor 323 is preferably twice or more as large as the W of the p-channel transistor 324.

In the case where a p-channel transistor is not provided to be connected to the p-channel transistor 324 in series, the W/L of the n-channel transistor 323 is not necessarily large. Therefore, for example, the W/L of the n-channel transistor 323 is as large as or smaller than the W/L of the p-channel transistor 324. Therefore, in that case, the W/L of at least one n-channel transistor in the circuit 106 and the W/L of at least one n-channel transistor in the circuit 105 can be approximately equal to each other. The W/L of at least one p-channel transistor in the circuit 106 and the W/L of at least one p-channel transistor in the circuit 105 can be approximately equal to each other. Here, a difference between "W/Ls which are approximately equal to each other" means that W/L ratios differ less than about ±10% of their values, more preferably, ±5%.

FIG. 20 illustrates a timing diagram of a circuit in FIG. 11, FIG. 12, FIG. 13, FIG. 14, FIG. 15, FIG. 16, FIG. 17, FIG. 18, and FIG. 19 by a solid line. Note that by a dotted line, FIG. 20 shows a timing diagram in the case where the input terminal IN6 and the n-channel transistor 326 are not provided. Here, a node corresponding to the output terminal of the circuit 105 and a node corresponding to the output terminal of the circuit 212 are referred to as S4 and S5, respectively. In the node S4 and the node S5, the signal can be changed quickly in comparison with the case where the n-channel transistor 326 is not provided. That is to say, the n-channel transistor 326 is provided, whereby the node S4 is charged quickly and surely. Accordingly, a circuit which operates stably can be provided. Alternatively, the circuit can operate stably even when characteristics of transistors vary.

Note that the circuit 106 of the circuit diagram in FIG. 11 is also referred to as a configuration in which the n-channel transistor 326 is added to an inverter which includes the p-channel transistor 324 and the n-channel transistor 325 of the circuit 106, so that the n-channel transistor 326 is connected to the p-channel transistor 324 in series. At the timing in which the potential of the node S4 is changed from the L level to the H level, with the use of the added transistor, the L level of the clock signal is input to the gate of the n-channel transistor 326 (an input terminal IN6) to turn off the n-channel transistor 326, which prevents current inhibiting charging from flowing into the node S4. Therefore, the signal of the node S4 can be changed quickly.

On the other hand, a p-channel transistor can be added to be connected to the p-channel transistor 324 in series. In that case, a gate of the p-channel transistor can be connected to the gate of the n-channel transistor 326 of the circuit 106. Note that an embodiment of the present invention is not limited thereto. The gate of the p-channel transistor can be connected to the other wiring. However, even when the node S4 is connected to the wiring 1003 through only the p-channel transistor 324 without adding an n-channel transistor, the circuit can operate without problems. That is to say, the p-channel transistor 324 and the wiring 1003 in the circuit 106 can be directly connected to each other. In that case, since the p-channel transistor 324 is not connected to a p-channel transistor in series, the number of control signals is not necessarily increased. Alternatively, because a transistor is not provided, the layout area of the circuit can be small. Alternatively, noise generated through transistors can be reduced. Alternatively, possibility of reduction in the amount of current due to on resistance of a transistor can be decreased because a transistor is not provided to be connected in series. Accordingly, delay of a signal caused when the potential of the node S4 is changed from the L level to the H level can be reduced.

Note that the circuit 105 of the circuit diagram in FIG. 11 is also referred to as a configuration in which the p-channel transistor 321 is added to an inverter which includes the n-channel transistor 323 and the p-channel transistor 322, so that the p-channel transistor 321 is connected to the p-channel transistor 322 in series. Therefore, it is possible not to provide the p-channel transistor 321 and the input terminal IN4. That is to say, the node S4 and the wiring 1001 can be connected through the p-channel transistor 322. Alternatively, a p-channel transistor is added to be connected to the n-channel transistor 323 in series. In that case, a gate of the p-channel transistor can be connected to a wiring other than the input terminal IN3. Note that even when the node S4 is connected to the wiring 1002 through only the n-channel transistor 323 without adding an n-channel transistor, the circuit can operate without problems. That is to say, the first terminal of the n-channel transistor 323 in the circuit 105 can be directly connected to the wiring 1002. In that case, since the n-channel transistor 323 is not connected to an n-channel transistor in series, the number of signals is not necessarily increased. Alternatively, because a transistor is not provided, the layout area of the circuit can be small. Alternatively, noise generated through transistors can be reduced. Alternatively, possibility of reduction in the amount of current due to on resistance of a transistor can be decreased because a transistor is not provided to be connected in series. Accordingly, delay of a signal caused when the potential of the node S4 is changed from the H level to the L level can be reduced.

Note that the circuit 212 of the circuit diagram in FIG. 11 is also referred to as a configuration of an inverter which includes the n-channel transistor 328 and the p-channel transistor 327. Accordingly, for example, an n-channel transistor is added to be connected to the n-channel transistor 328 in series. In that case, a gate of the n-channel transistor can be connected to a wiring other than the gate of the n-channel transistor 328 or the input terminal IN6. Note that even when the node S5 is connected to the wiring 1006 through only the n-channel transistor 328 without adding a p-channel transistor, the circuit can operate without problems. That is to say, the first terminal of the n-channel transistor 328 in the circuit 212 can be directly connected to the wiring 1006. In that case, since the n-channel transistor 328 is not connected to an n-channel transistor in series, the number of control signals is not necessarily increased. Alternatively, because a transistor is not provided, the layout area of the circuit can be small. Alternatively, noise generated through transistors can be reduced. Alternatively, possibility of reduction in the amount of current due to on resistance of a transistor can be decreased because a transistor is not provided to be connected in series. Accordingly, delay of a signal caused when the potential of the node S5 is changed from the H level to the L level can be reduced.

Alternatively, the circuit 212 of the circuit diagram in FIG. 11 can have a configuration in which a p-channel transistor can be added to be connected to the p-channel transistor 327. In that case, a gate of the p-channel transistor can be connected to a wiring other than the gate of the p-channel transistor 327 or the input terminal IN6. Note that even when the node S2 is connected to the wiring 1005 through only the p-channel transistor 327 without adding a p-channel transistor, the circuit can operate without problems. That is to say, the first terminal of the p-channel transistor 327 in the circuit 212 can be directly connected to the wiring 1005. In that case, since the p-channel transistor 327 is not connected to a p-channel transistor in series, the number of control signals is not necessarily increased. Alternatively, because a transistor is not provided, the layout area of the circuit can be small. Alternatively, noise generated through transistors can be reduced. Alternatively, possibility of reduction in the amount of current due to on resistance of a transistor can be decreased because a transistor is not provided to be connected in series. Accordingly, delay of a signal caused when the potential of the node S5 is changed from the L level to the H level can be reduced.

Note that in the circuit configuration in FIG. 11, the output terminal of the circuit 105 is connected to the p-channel transistor 322, and the wiring 1001 is connected to the p-channel transistor 321; however, the order of the p-channel transistor 322 and the p-channel transistor 321 can be changed to be connected in series. Accordingly, the output terminal of the circuit 105 can be connected to the p-channel transistor 321, and the wiring 1001 can be connected to the p-channel transistor 322. Further, the output terminal of the circuit 106 is connected to the n-channel transistor 325, and the wiring 1004 is connected to the n-channel transistor 326; however, the order of the n-channel transistor 326 and the n-channel transistor 325 can be changed to be connected in series. Accordingly, the output terminal of the circuit 106 can be connected to the n-channel transistor 326, and the wiring 1004 can be connected to the n-channel transistor 325. Note that the same can be applied to the case where a transistor is added to be connected to the n-channel transistor 312 in series, and the case where a transistor is added to be connected to the p-channel transistor 324 in series. There are various arrangements of transistors.

Embodiment 3

In this embodiment, an application example of the circuits in Embodiment 1 and Embodiment 2 will be described. Accordingly, the contents described in Embodiment 1 and Embodiment 2 can be applied to, combined with, or replaced with this embodiment.

Figure 21A:
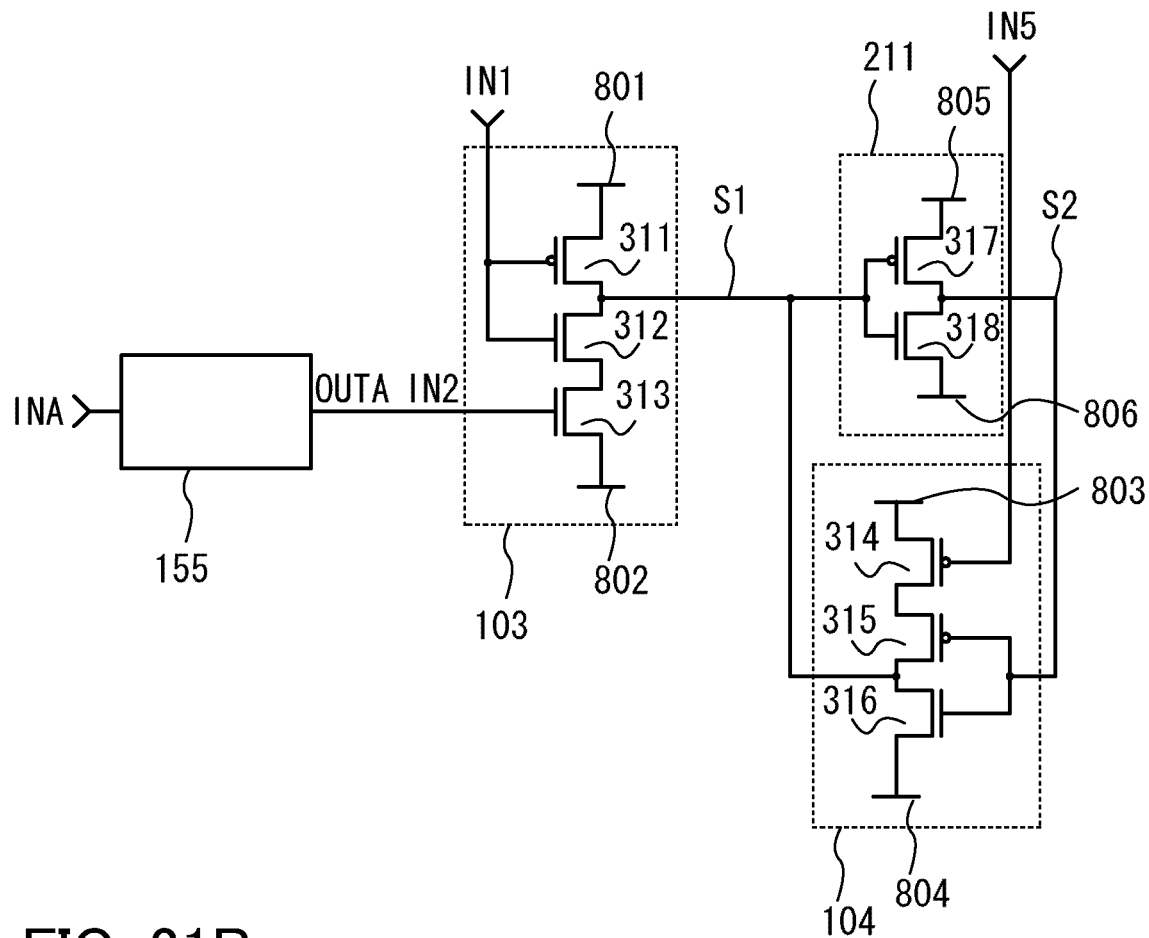
FIG. 21A is a circuit diagram of an example of a configuration of Embodiment 3 and FIG. 21B is a timing diagram thereof.

FIG. 21A illustrates a configuration in which a circuit 155 is connected to the input terminal IN2 in the circuit in FIG. 1. The circuit 155 includes an input terminal INA and an output terminal OUTA. Note that the circuit 155 can include another input terminal and another output terminal. The circuit 155 can have various configurations. As an example, a signal input to the input terminal INA is output to the output terminal OUTA by some logical operation. Accordingly, the circuit 155 may have a function of not holding a signal in the circuit, a function of holding a signal in the circuit, or a function of performing a level shift of the potential of a signal. Examples of the logical operation are an operation of inverting a signal, an operation of outputting a signal without inversion, and an operation of converting the potential level of a signal.

For example, some kind of treatment is performed in the circuit 155 even when a signal is output to the output terminal OUTA in synchronization with a signal input to the input terminal INA; as a result, rising and falling of the signal are slightly delayed. Therefore, the circuit 155 can have a function of delaying a signal.

Figure 21B:
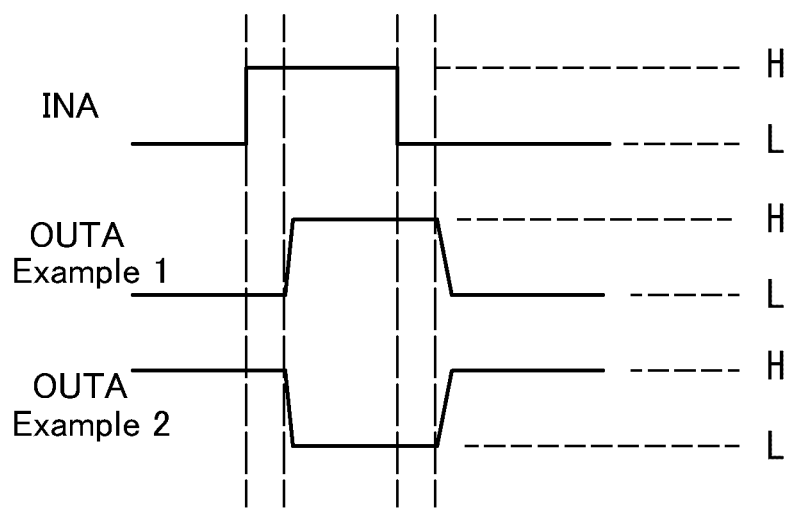

FIG. 21B illustrates an example of a timing diagram of that case. A waveform is input to the input terminal INA. At that time, a slightly-delayed or a slightly-dulled waveform which is similar to the waveform of the input terminal INA is output from the output terminal OUTA. Alternatively, in the case where the circuit 155 has another circuit configuration, a slightly-delayed or a slightly-dulled waveform which is inverted or a slightly-delayed or a slightly-dulled waveform which is similar to the waveform of the input terminal INA is output from the output terminal OUTA.

Figure 22A:
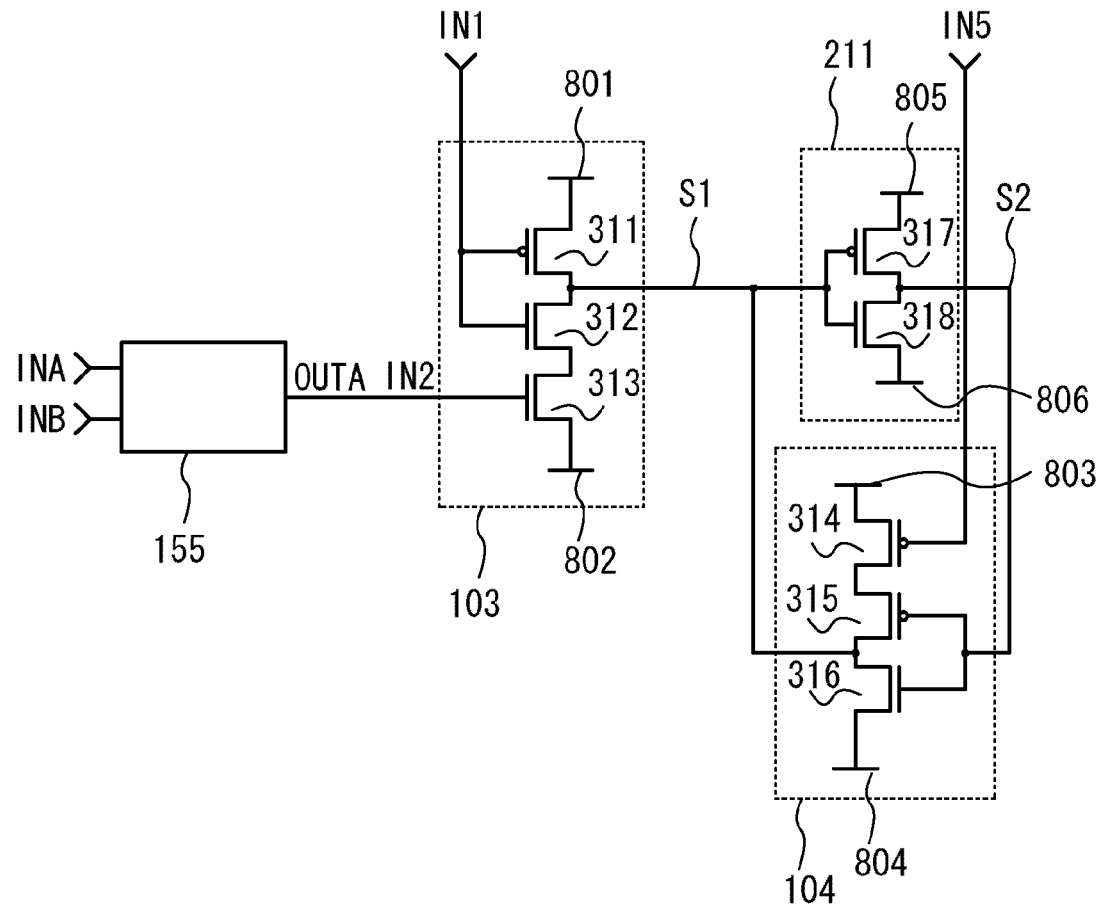
FIG. 22A is a circuit diagram of an example of a configuration of Embodiment 3 and FIG. 22B is a timing diagram thereof.

Note that the circuit 155 can have a plurality of input terminals; accordingly, FIG. 22A illustrates the case where the circuit 155 includes two input terminals (INA and INB), as an application example. In the circuit 155, signals input to the input terminal INA and the input terminal INB are output to the output terminal OUTA by some logical operation. For example, the potential of the output terminal OUTA is not changed because of input of a signal to the input terminal INB. Alternatively, a signal in response to a signal input to the input terminal INA is output from the output terminal OUTA.

Figure 22B:
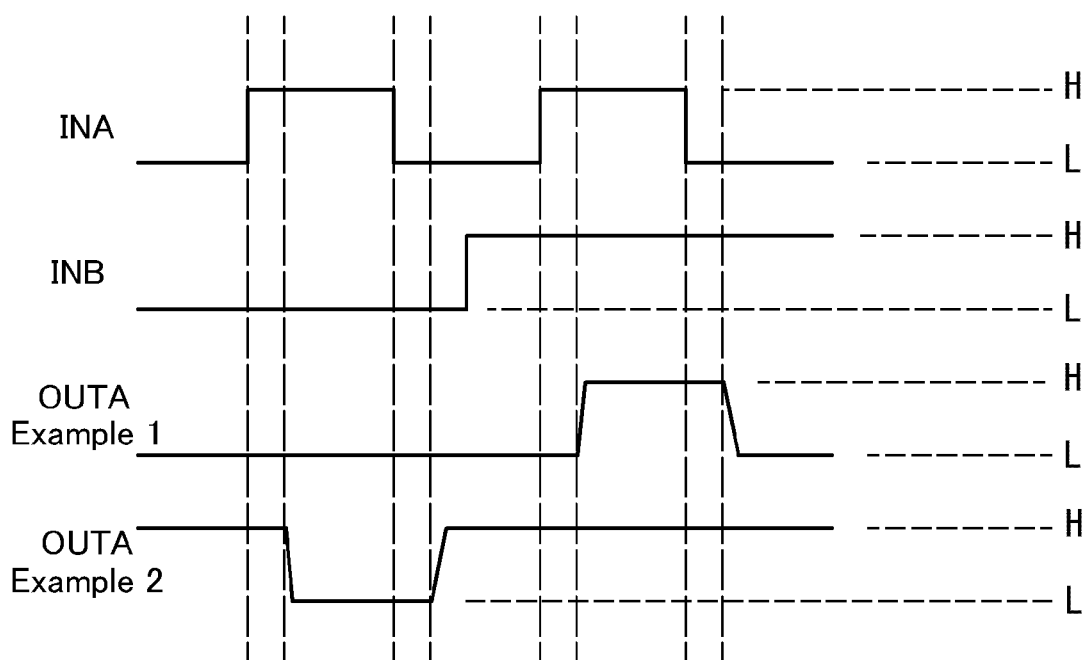

FIG. 22B illustrates an example of a timing diagram of that case. Waveforms are input to the input terminal INA and the input terminal INB. At that time, in the case where the circuit 155 has a predetermined circuit configuration, an L signal is always output from the output terminal OUTA when an L signal is input to the input terminal INB. On the other hand, when an H signal is input to the input terminal INB, a slightly-delayed signal which is similar to a signal input to the input terminal INA is output from the output terminal OUTA.

Alternatively, in the case where the circuit 155 has another circuit configuration, a slightly-delayed signal which is inverted with respect to a signal input to the input terminal INA is output from the output terminal OUTA when an L signal is input to the input terminal INB. On the other hand, when an H signal is input to the input terminal INB, an H signal is always output from the output terminal OUTA.

Figure 23A:
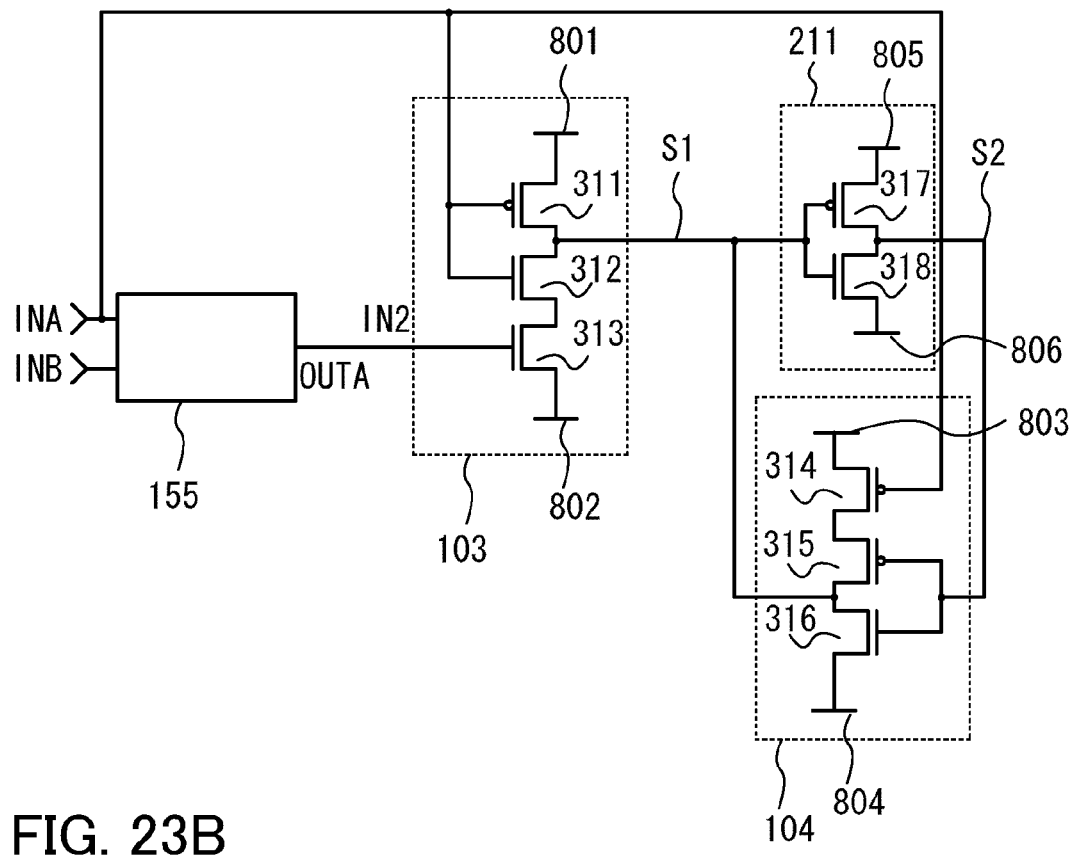
FIG. 23A is a circuit diagram of an example of a configuration of Embodiment 3 and FIG. 23B is a timing diagram thereof.

Next, as an application example of the circuit in FIG. 22A, FIG. 23A illustrates a circuit diagram in the case where the input terminal IN1 and the input terminal IN5 are connected to the input terminal INA. Note that FIG. 22A and FIG. 23A illustrate different circuit configurations of the inside of the circuit 155.

Figure 23B:
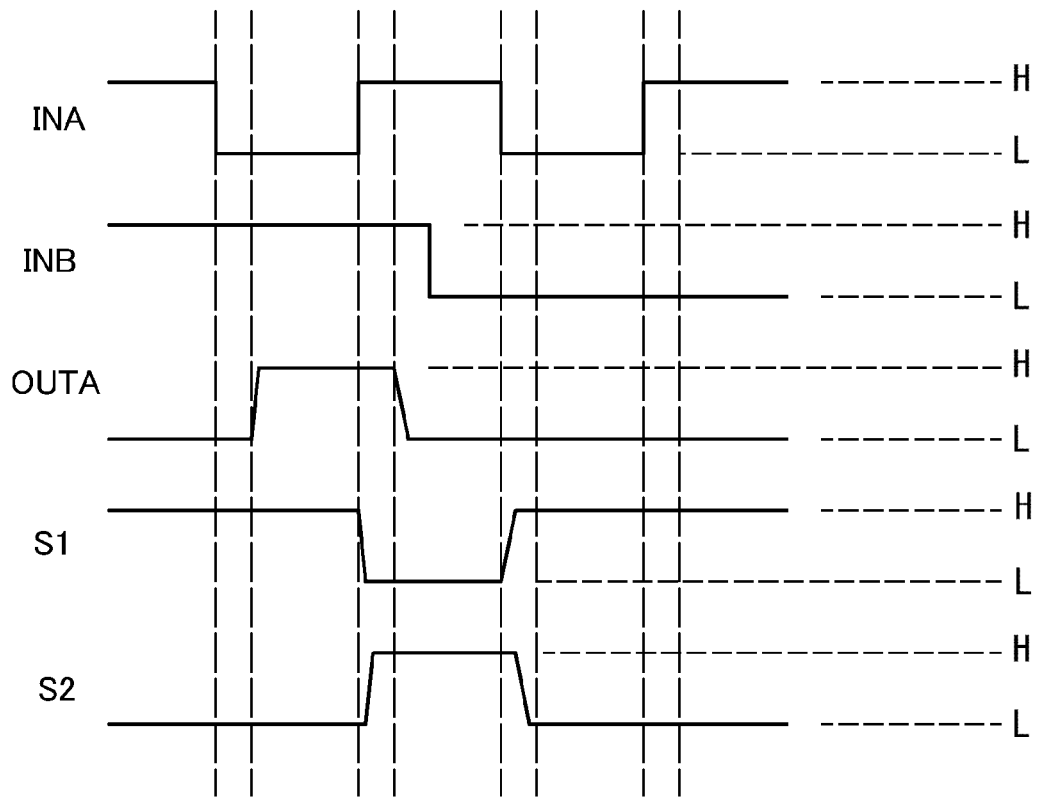

FIG. 23B illustrates an example of a timing diagram of that case. Waveforms are input to the input terminal INA and the input terminal INB. At that time, a slightly-delayed signal which is inverted with respect to a signal input to the input terminal INA is output from the output terminal OUTA when an H signal is input to the input terminal INB. Therefore, the potentials of the node S1 and the node S2 can be changed while a signal of the input terminal IN2 delayed. In particular, in the case where the p-channel transistor 314 is provided, the potential of the node S1 is changed easily; therefore, the potential of the node S1 can be changed in a short period in which the signal of the input terminal IN2 is delayed from the signal of the input terminal INA. On the other hand, when an L signal is input to the input terminal INB, an L signal is always output from the output terminal OUTA regardless of a signal input to the input terminal INA.

Figure 24A:
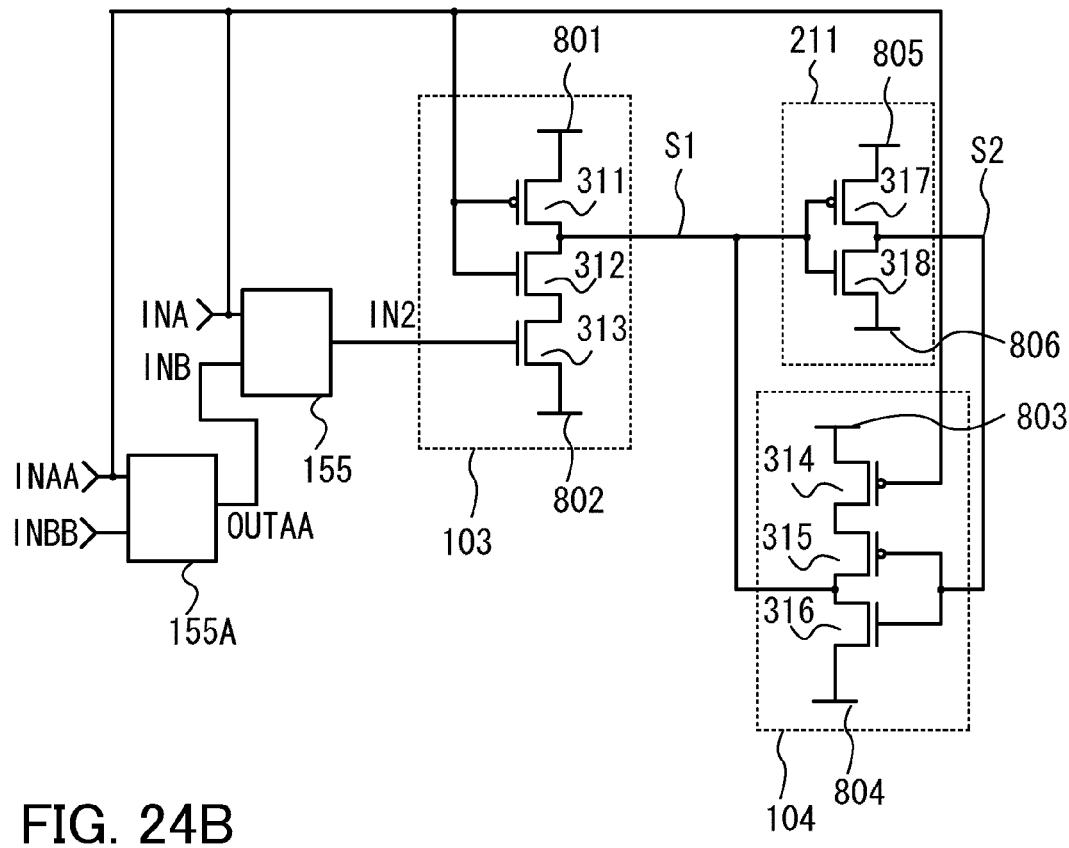
FIG. 24A is a circuit diagram of an example of a configuration of Embodiment 3 and FIG. 24B is a timing diagram thereof.
Figure 24B:
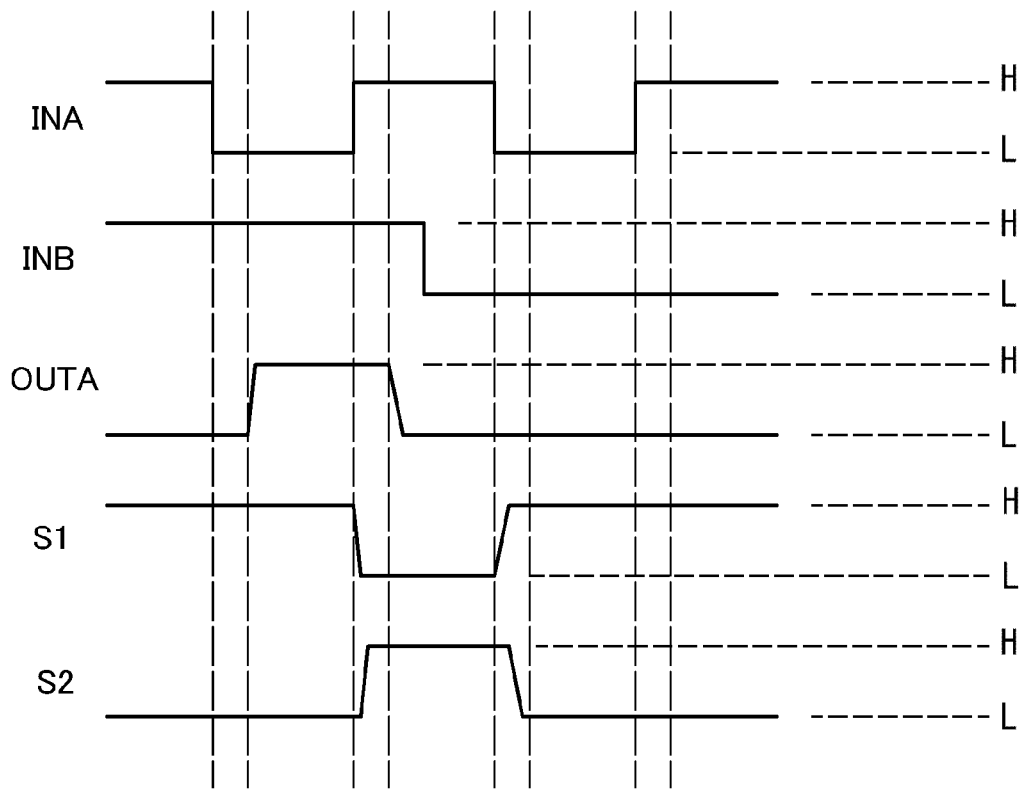

Next, as an application example of the circuit in FIG. 23A, FIG. 24A illustrate a circuit diagram in the case where a circuit 155A which is similar to the circuit 155 is connected to the input terminal INB of the circuit 155. The circuit 155A includes an input terminal INAA and an input terminal INBB. The input terminal INAA of the circuit 155A is connected to the input terminal INA of the circuit 155. An output terminal OUTAA of the circuit 155A is connected to the input terminal INB of the circuit 155. FIG. 24B illustrates an example of a timing diagram of that case.

Note that in the circuits in FIG. 21A and the like, an example in which the input terminal IN2 is connected to the circuit 155 is illustrated, but an embodiment of the present invention is not limited thereto. The input terminal IN4 can be connected to the circuit 155 also in the circuit in FIG. 11.

Figure 25A:
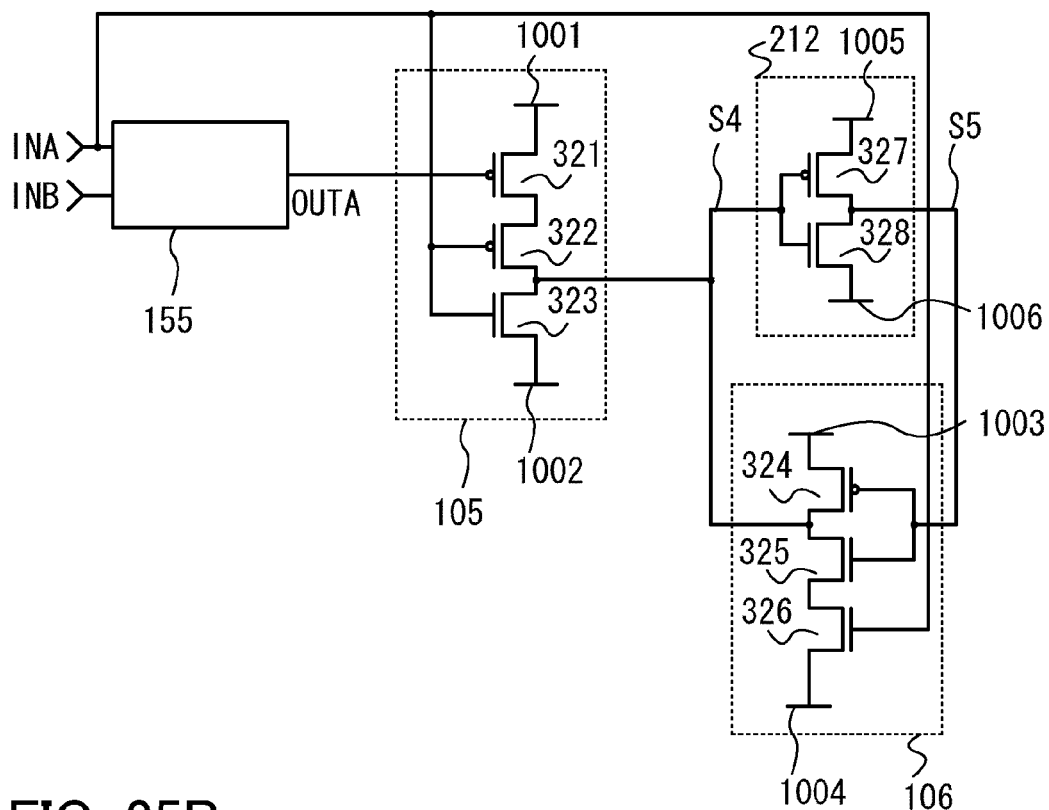
FIG. 25A is a circuit diagram of an example of a configuration of Embodiment 3 and FIG. 25B is a timing diagram thereof.
Figure 25B:
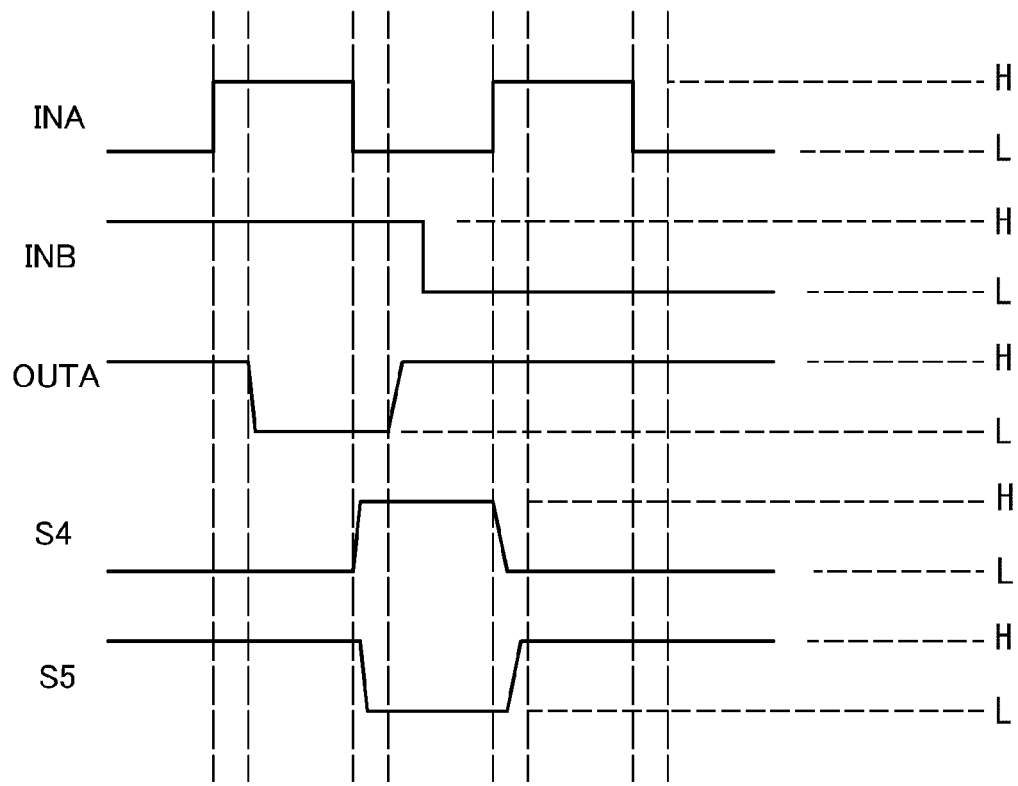

Thus, as an example, similarly to FIG. 23A, FIG. 25A illustrates a circuit diagram in which the input terminal IN3 and the input terminal IN6 are connected to the input terminal INA. FIG. 25B illustrates an example of the timing diagram of that case. Waveforms are input to the input terminal INA and the input terminal INB. At that time, a slightly-delayed signal which is inverted with respect to a signal input to the input terminal INA is output from the output terminal OUTA when an H signal is input to the input terminal INB. Therefore, the potentials of the node S4 and the node S5 can be changed while a signal of the input terminal IN4 is delayed. In particular, in the case where the n-channel transistor 326 is provided, the potential of the node S4 is changed easily; therefore, the potential of the node S4 can be changed in a short period in which the signal of the input terminal IN4 is delayed from the signal of the input terminal INA. On the other hand, when an L signal is input to the input terminal INB, an H signal is always output from the output terminal OUTA regardless of a signal input to the input terminal INA.

Note that FIG. 25A is illustrated as a diagram corresponding to FIG. 23A. Circuit diagrams corresponding to FIG. 21A and FIG. 22A can also be formed as in the case of FIG. 23A.

Figure 26A:
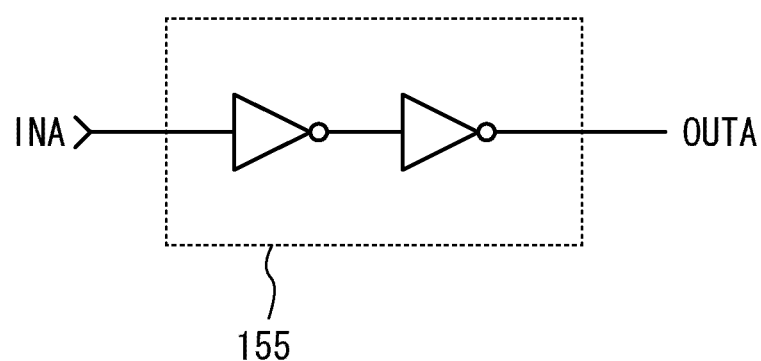
FIGS. 26A and 26B are circuit diagrams of examples of a configuration of Embodiment 3.
Figure 26B:
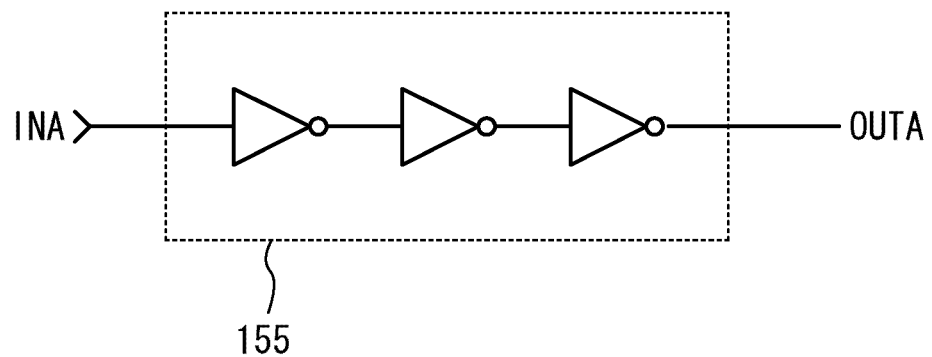

Next, an example of the configuration of the circuit 155 will be described. The circuit 155 can have various kinds of circuit configurations. For example, the circuit 155 can have an inverter circuit. For example, the circuit 155 may include two inverter circuits as illustrated in FIG. 26A or may include three inverter circuits as illustrated in FIG. 26B. The number of inverter circuits can be one or more.

Figure 27A:
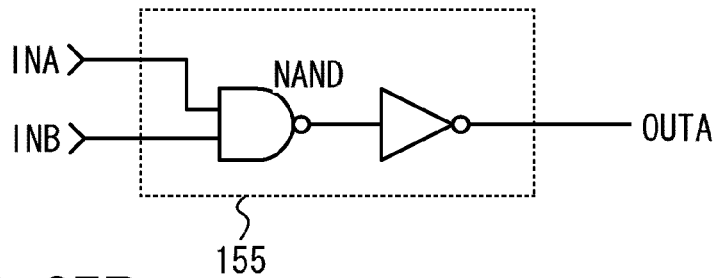
FIGS. 27A to 27D are circuit diagrams of examples of a configuration of Embodiment 3.
Figure 27B:
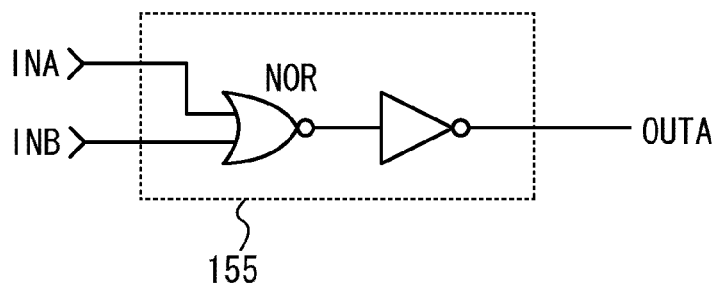
Figure 27C:
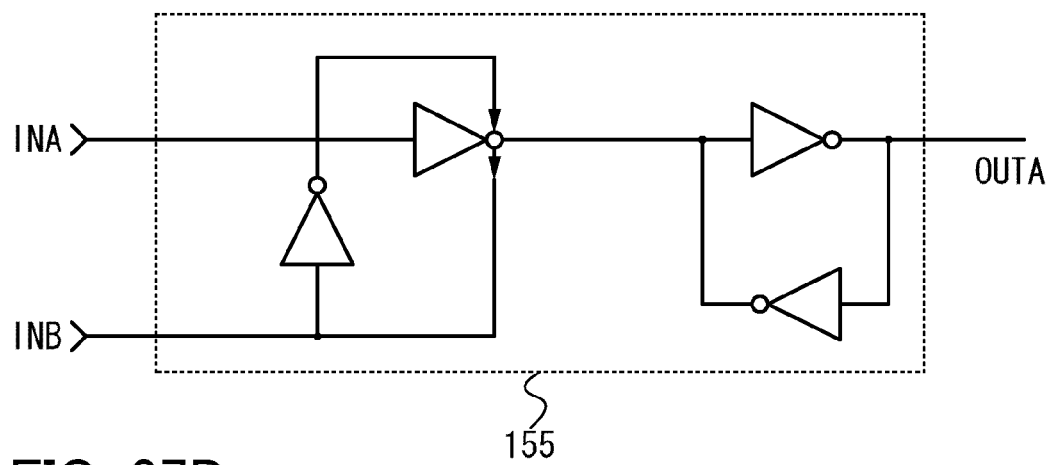
Figure 27D:
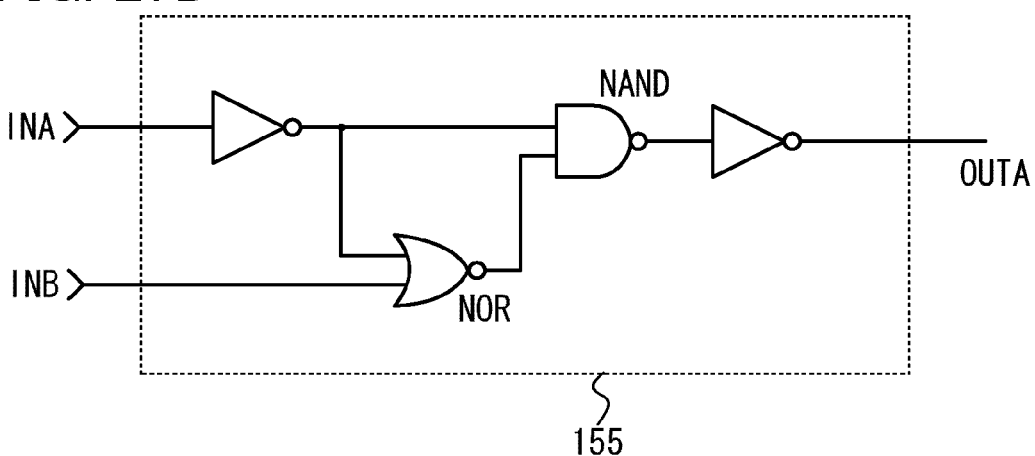

Alternatively, the circuit 155 can include a NAND circuit, a NOR circuit, a clocked inverter circuit, or the like. For example, the circuit 155 may include an inverter circuit and a NAND circuit as illustrated in FIG. 27A or may include an inverter circuit and a NOR circuit as illustrated in FIG. 27B. Further alternatively, the circuit 155 may include a clocked inverter circuit as illustrated in FIG. 27C or may be include a NAND circuit and a NOR circuit as illustrated in FIG. 27D.

Embodiment 4

In this embodiment, an application example of circuit configurations illustrated in Embodiments 1 to 3 will be described with reference to FIG. 28. Accordingly, the contents described in Embodiments 1 to 3 can be applied to, combined with, or replaced with this embodiment.

Figure 28:
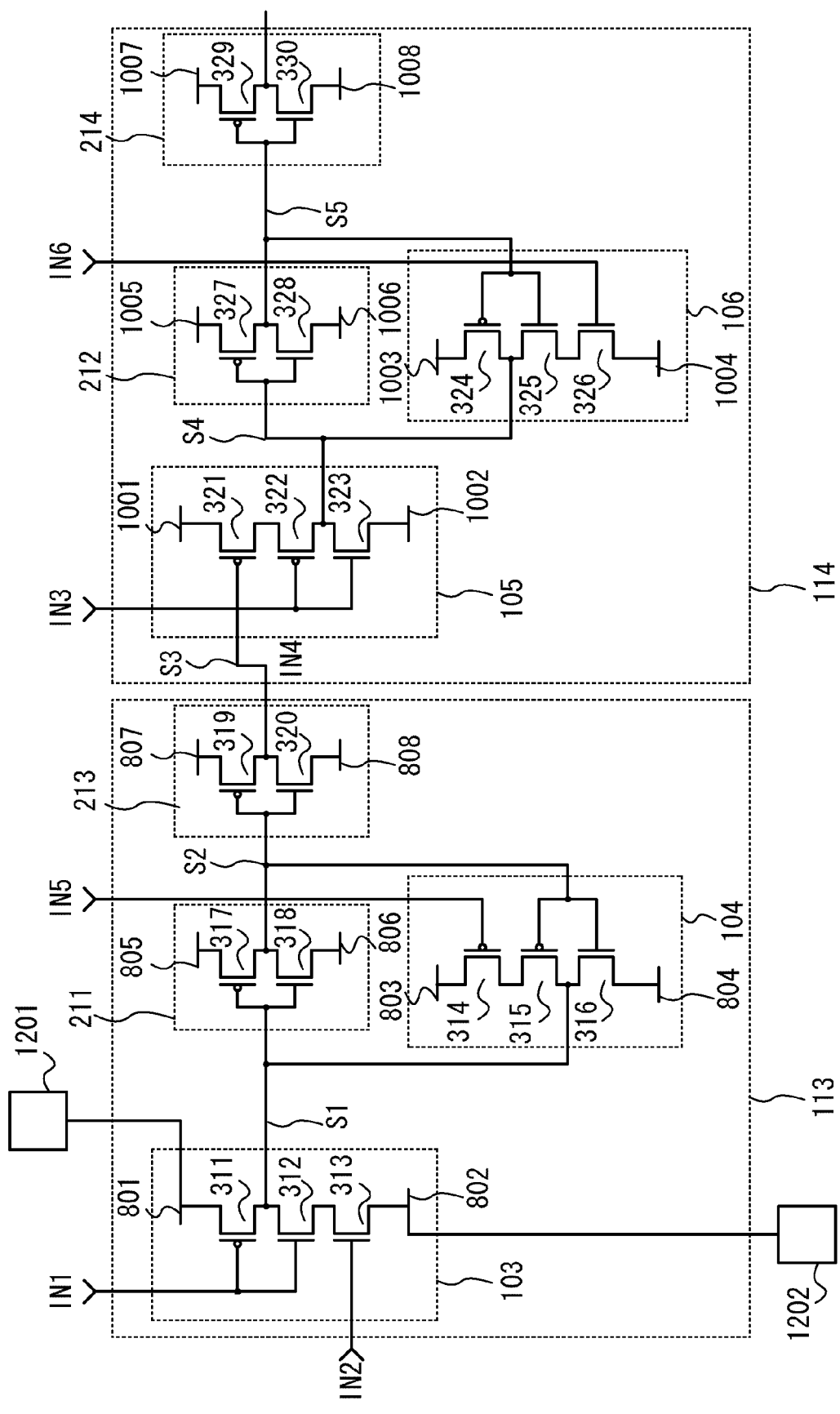
FIG. 28 is a circuit diagram of an example of a configuration of Embodiment 4.

FIG. 28 illustrates a circuit diagram of a shift register operating by using a single phase clock signal. A circuit having the flip flop in Embodiment 1 as a basic configuration is a flip flop 113 and a circuit having the flip flop in Embodiment 2 as a basic configuration is a flip flop 114. Accordingly, the flip flop 113 functions as the circuit 155 with respect to the flip flop 114. Note that an output of the flip flop 113 is connected to an input of the flip flop 114 in FIG. 28, but an embodiment of the present invention is not limited thereto. An output of the flip flop 114 can be connected to an input of the flip flop 113. In that case, the flip flop 114 functions as the circuit 155 with respect to the flip flop 113. Further, the flip flops 113 and the flip flops 114 are alternately provided and connected to provide a plurality of circuits, whereby a shift register can be formed.

The flip flop 113 can be connected to the flip flop 114 so that a signal of the node S1 is input to the second input terminal (IN4) of the circuit 105 in the flip flop 114, directly or through the even number of inverter circuits. In the case where the node S1 and the input terminal IN4 are directly connected, a circuit can be omitted; therefore, power consumption and layout area can be reduced. In particular, the case where the p-channel transistor 314 or the n-channel transistor 326 is provided is preferable in that the potential of the node S1 or the node S4 is easily changed. Alternatively, a signal of the node S2 can be input to the second input terminal (IN4) of the circuit 105 in the flip flop 114 through the odd number of inverter circuits. In particular, when the node S2 is connected to the input terminal IN4 through the odd number of inverter circuits, the amount of delay of the signal can be large; therefore, the circuit can be driven more stably.

Note that FIG. 28 illustrates an example of the case where the node S2 is connected to the input terminal IN4 through a circuit 213.

In the circuit 213, a p-channel transistor 319 is connected to an n-channel transistor 320 in series. In the circuit 213, a first terminal of the p-channel transistor 319 is connected to a wiring 807. A second terminal of the p-channel transistor 319 is connected to a first terminal of the n-channel transistor 320. A second terminal of the n-channel transistor 320 is connected to a wiring 808. Further, in the circuit 213, a gate of the p-channel transistor 319 is connected to a gate of the n-channel transistor 320 to form an input terminal of the circuit 213 and are connected to the output terminal of the circuit 211. In the circuit 213, the second terminal of the p-channel transistor 319 and the first terminal of the n-channel transistor 320 form an output terminal of the circuit 213 and are connected to the second input terminal (IN4) of the circuit 105 in the flip flop 114.

Further, a circuit 214 is provided for the circuit illustrated in FIG. 28. In the circuit 214, a p-channel transistor 329 is connected to an n-channel transistor 330 in series. In the circuit 214, a first terminal of the p-channel transistor 329 is connected to a wiring 1007. A second terminal of the p-channel transistor 329 is connected to a first terminal of the n-channel transistor 330. A second terminal of the n-channel transistor 330 is connected to a wiring 1008. Further, in the circuit 214, a gate of the p-channel transistor 329 is connected to a gate of the n-channel transistor 330 to form an input terminal of the circuit 214 and are connected to the output terminal of the circuit 212. In the circuit 214, the second terminal of the p-channel transistor 329 and the first terminal of the n-channel transistor 330 form an output terminal of the circuit 214.

In the circuit diagram in FIG. 28, a signal or a power supply potential is input to the first input terminal (IN1) of the circuit 103, a second input terminal (IN2) of the circuit 103, the second input terminal (IN5) of the circuit 104, the first input terminal (IN3) of the circuit 105, the second input terminal (IN6) of the circuit 106, the wiring 801, the wiring 803, the wiring 805, the wiring 807, the wiring 1001, the wiring 1003, the wiring 1005, the wiring 1007, the wiring 802, the wiring 804, the wiring 806, the wiring 808, the wiring 1002, the wiring 1004, the wiring 1006, and the wiring 1008. Here, as an example, a clock signal is input to the first input terminal (IN1) of the circuit 103, the second input terminal (IN5) of the circuit 104, the first input terminal (IN3) of the circuit 105, and the second input terminal (IN6) of the circuit 106. An input signal SP is input to the second input terminal (IN2) of the circuit 103.

Further, each of the wiring 801, the wiring 803, the wiring 805, the wiring 807, the wiring 1001, the wiring 1003, the wiring 1005, and the wiring 1007 is connected to a wiring or a circuit to which the high potential power source VDD is supplied. Each of the wiring 802, the wiring 804, the wiring 806, the wiring 808, the wiring 1002, the wiring 1004, the wiring 1006, and the wiring 1008 is connected to a wiring or a circuit to which the low potential power source VSS is supplied.

The wirings 801, 803, 805, 807, 1001, 1003, 1005, and 1007 can be formed using wirings different from one another. At least two of the wirings 801, 803, 805, 807, 1001, 1003, 1005, and 1007 can be connected to each other. Accordingly, for example, the same potential can be supplied to the wirings 801, 803, 805, 807, 1001, 1003, 1005, and 1007. Connection of the wirings can lead to reduction in the number of wirings. Note that an embodiment of the present invention is not limited thereto. Similarly, the wirings 802, 804, 806, 808, 1002, 1004, 1006, and 1008 can be formed using wirings different from one another. At least two of the wirings 802, 804, 806, 808, 1002, 1004, 1006, and 1008 can be connected to each other. Accordingly, for example, the same potential can be supplied to the wirings 802, 804, 806, 808, 1002, 1004, 1006, and 1008. Connection of the wirings can lead to reduction in the number of wirings. Note that an embodiment of the present invention is not limited thereto.

Note that the wiring 801 is connected to a circuit 1201. The wiring 802 is connected to a circuit 1202. The circuit 1201 and the circuit 1202 have a function of supplying a power supply voltage or a signal. As an example, the circuit 1201 has a function of supplying the high potential power source VDD, and the circuit 1202 has a function of supplying the low potential power source VSS.

Note that the circuit 1201 can supply a power supply voltage or a signal not only to the wiring 801 but also to the wiring 803, the wiring 805, the wiring 807, the wiring 1001, the wiring 1003, the wiring 1005, the wiring 1007, and the like. Similarly, the circuit 1202 can supply a power supply voltage or a signal not only to the wiring 802 but also to the wiring 804, the wiring 806, the wiring 808, the wiring 1002, the wiring 1004, the wiring 1006, the wiring 1008, and the like.

Note that in FIG. 28, the circuit 213 and the circuit 214 include inverter circuits as an example, but an embodiment of the present invention is not limited thereto. The circuits can include other logic circuits (e.g., a NAND circuit, a NOR circuit, a clocked inverter circuit, a level shifter, and a buffer circuit).

Figure 29:
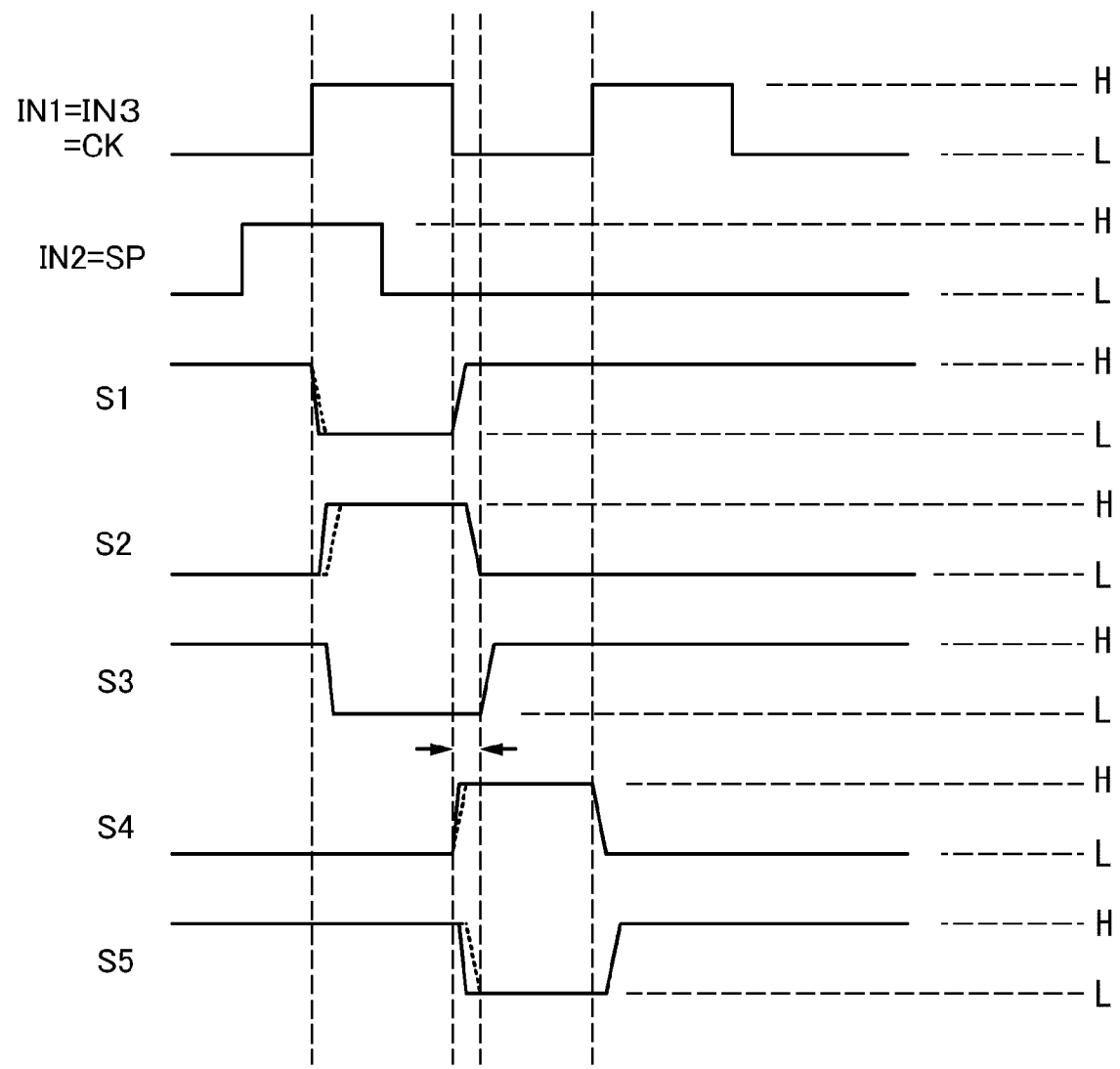
FIG. 29 is an example of a timing diagram of Embodiment 4.

FIG. 29 illustrates a timing diagram of flip flops which are illustrated in FIG. 28 and which operate by using a single phase clock signal. Here, a node corresponding to the output terminal of the circuit 103 of the flip flop 113, a node corresponding to the output terminal of the circuit 211 of the flip flop 113, a node corresponding to the second input terminal of the circuit 105 in the flip flop 114, a node corresponding to the output terminal of the circuit 105 in the flip flop 114, and the output terminal of the circuit 212 in the flip flop 114 are referred to as S1, S2, S3, S4, and S5, respectively. By a dotted line, FIG. 29 shows a timing diagram of a flip flop in the case where the p-channel transistor 314 or the n-channel transistor 326 is not provided. In the node S4 and the node S5, the signal can be changed quickly in comparison with the case where the p-channel transistor 314 or the n-channel transistor 326 is not provided. That is to say, the node S1 or the node S4 is charged quickly.

The circuit diagram in FIG. 28 is the case of the configuration in which the p-channel transistor 314 and the n-channel transistor 326 are provided. At the timing in which the potential of the node S4 is changed from the L level to the H level, with the use of the n-channel transistor 326, the L level of the clock signal is input to the gate of the n-channel transistor 326 (the second input terminal (IN6)) to turn off the n-channel transistor 326, which prevents current inhibiting charging from flowing into the node S4. Therefore, the signal of the node S4 can be changed quickly. The signal of the node S4 can be changed quickly, so that data can be rewritten in a delay period of a signal of the node S3; therefore, a shift register operating stably can be formed. Further, a circuit can operate stably even if characteristics of transistors vary, are changed because of temperature, or are changed over time because of a long-time operation. Charging of the node S1 is similar to that of the node S4.

Embodiment 5

In this embodiment, an application example of a circuit configuration illustrated in Embodiment 4 will be described with reference to FIG. 30, FIG. 31, FIG. 32, FIG. 33, FIG. 34, FIG. 35, and FIG. 36. Accordingly, the contents described in Embodiments 1 to 4 can be applied to, combined with, or replaced with this embodiment.

FIG. 28 illustrates the case where the flip flop 113 is connected to the flip flop 114 so that a signal flows from the flip flop 113 to the flip flop 114; on the other hand, here, the case where the flip flop 113 is connected to the flip flop 114 so that a signal flows from the flip flop 114 to the flip flop 113 will be described. The flip flop 114 can be connected to the flip flop 113 so that a signal of the node S4 is input to the second input terminal (IN2) of the circuit 103 in the flip flop 113, directly or through the even number of inverter circuits. In the case where the node S4 and the input terminal IN2 are directly connected, a circuit can be omitted; therefore, power consumption and layout area can be reduced. In particular, the case where the p-channel transistor 314 or the n-channel transistor 326 is provided is preferable in that the potential of the node S1 or the node S4 is easily changed. Alternatively, a signal of the node S5 can be input to the second input terminal (IN2) of the circuit 103 in the flip flop 113 through the odd number of inverter circuits. In particular, when the node S5 is connected to the input terminal IN2 through the odd number of inverter circuits, the amount of delay of the signal can be large; therefore, the circuit can be driven more stably.

Figure 30:
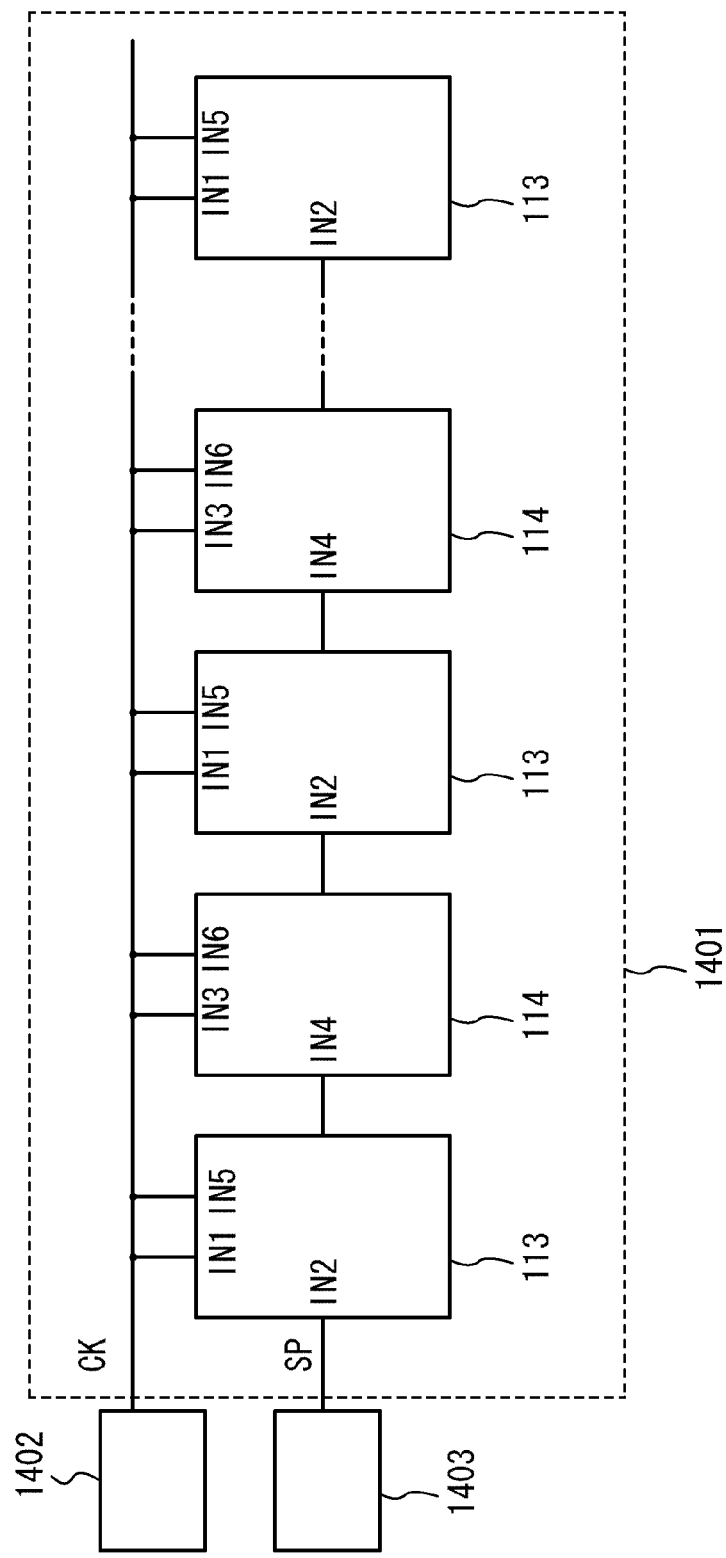
FIG. 30 is a block diagram of an example of a configuration of Embodiment 4.

FIG. 30 illustrates an example of a block diagram of a shift register. The flip flops 113 and the flip flops 114 are alternately connected in a plurality of stages to form a shift register 1401. The first stage and the last stage may be either the flip flop 113 or the flip flop 114: a practitioner can determine the number of stages as necessary. As an example, a clock signal CK is input from a circuit 1402 to the flip flop 113 and the flip flop 114. Further, as an example, an input signal SP is input from a circuit 1403 to the first stage and an output signal of the previous stage is input to the second stage and subsequent stages.

Figure 31:
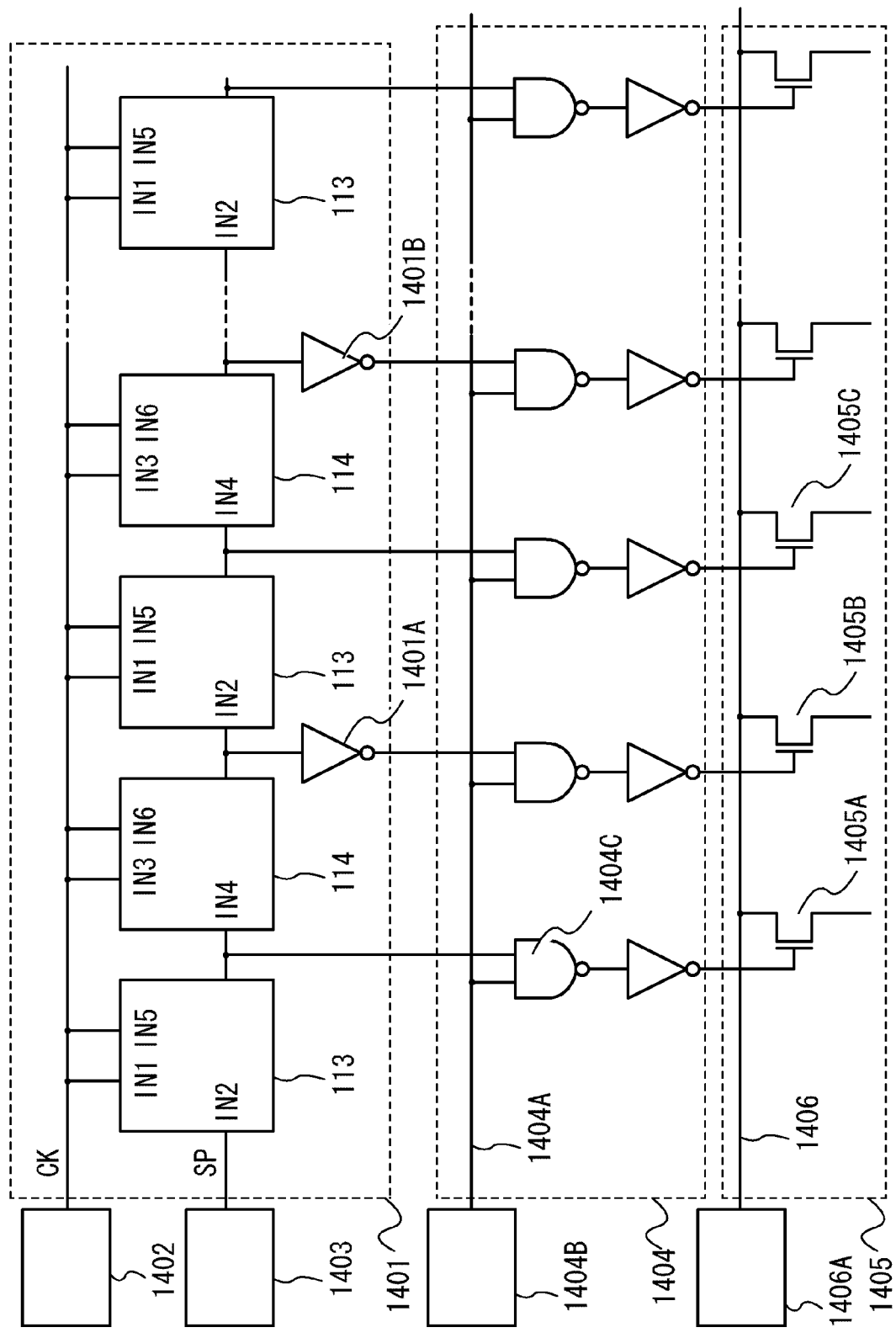
FIG. 31 is a block diagram of an example of a configuration of Embodiment 4.

Note that in FIG. 30, as a signal output from the shift register 1401, a signal input to the input terminal IN2 or the input terminal IN4 can be obtained, for example. As an example, as illustrated in FIG. 31, a signal input to the input terminal IN4 and a signal which is an inverted signal of a signal input to the input terminal IN2 can be an output signal. Note that in order to invert a signal, an inverter circuit 1401A and an inverter circuit 1401B are provided. Further, a circuit 1404 is provided and an output signal of the shift register 1401 can be input thereto. The circuit 1404 can have a function of controlling a pulse width of a signal, for example. Specifically, the circuit 1404 has a function of shortening the pulse width. A signal output from the shift register 1401 is input to a NAND the circuit 1404C. A pulse signal is also input from a circuit 1404B to the NAND the circuit 1404C through a wiring 1404A. With this configuration, the pulse width of a pulse signal output from the shift register 1401 can be controlled. Note that a NOR circuit or the like can be used instead of the NAND the circuit 1404C.

Note that a signal output from the shift register 1401 or the circuit 1404 can be input to gates of a transistor 1405A, a transistor 1405B, a transistor 1405C, and the like which are included in a circuit 1405.

For example, in the case where the circuit 1405 has a configuration in which a plurality of pixels is provided, the transistor 1405A, the transistor 1405B, and the transistor 1405C each correspond to a transistor provided in a pixel. A wiring 1406 functions as a video signal line (a source signal line). A video signal is supplied from a circuit 1406A and is supplied to a pixel electrode and a storage capacitor which are connected to each of the transistor 1405A, the transistor 1405B, and the transistor 1405C. Accordingly, it can be said that the shift register 1401 or the circuit 1404 is a gate line driver circuit (or part of the gate line driver circuit). Note that a circuit which shifts the potential level of a signal can be provided between the shift register 1401 and the circuit 1404 or between the circuit 1404 and the circuit 1405.

In the case where the circuit 1405 is a sampling circuit, the transistor 1405A, the transistor 1405B, and the transistor 1405C correspond to transistors for sampling a signal. A video signal is supplied from the circuit 1406A to the wiring 1406 and is supplied to the video signal line (the source signal line) and a pixel which are connected to each of the transistor 1405A, the transistor 1405B, and the transistor 1405C. In the case where a video signal is supplied to the pixel, it can be said that dot sequential driving is performed. Accordingly, it can be said that the shift register 1401, the circuit 1404, or the circuit 1405 is a source line driver circuit (or part of the source line driver circuit). Note that a circuit which shifts the potential level of a signal can be provided between the shift register 1401 and the circuit 1405 or between the circuit 1404 and the circuit 1405.

Note that a video signal supplied to the wiring 1406 is an analog signal in many cases.

Note that the transistor 1405A, the transistor 1405B, and the transistor 1405C can function as switches. Accordingly, as a switch, a CMOS switch including both n-channel and p-channel transistors may be employed as a switch. By using a CMOS switch, the switch can more accurately operate as a switch because current can flow when either the p-channel transistor or the n-channel transistor is turned on. Thus, a voltage can be appropriately output regardless of whether voltage of an input signal to the switch is high or low. Alternatively, since the voltage amplitude value of a signal for turning on or off the switch can be made small, power consumption can be reduced.

As described above, the shift register 1401 can be used as the gate line driver circuit (or part of the gate line driver circuit) or the source line driver circuit (or part of the source line driver circuit).

Figure 32:
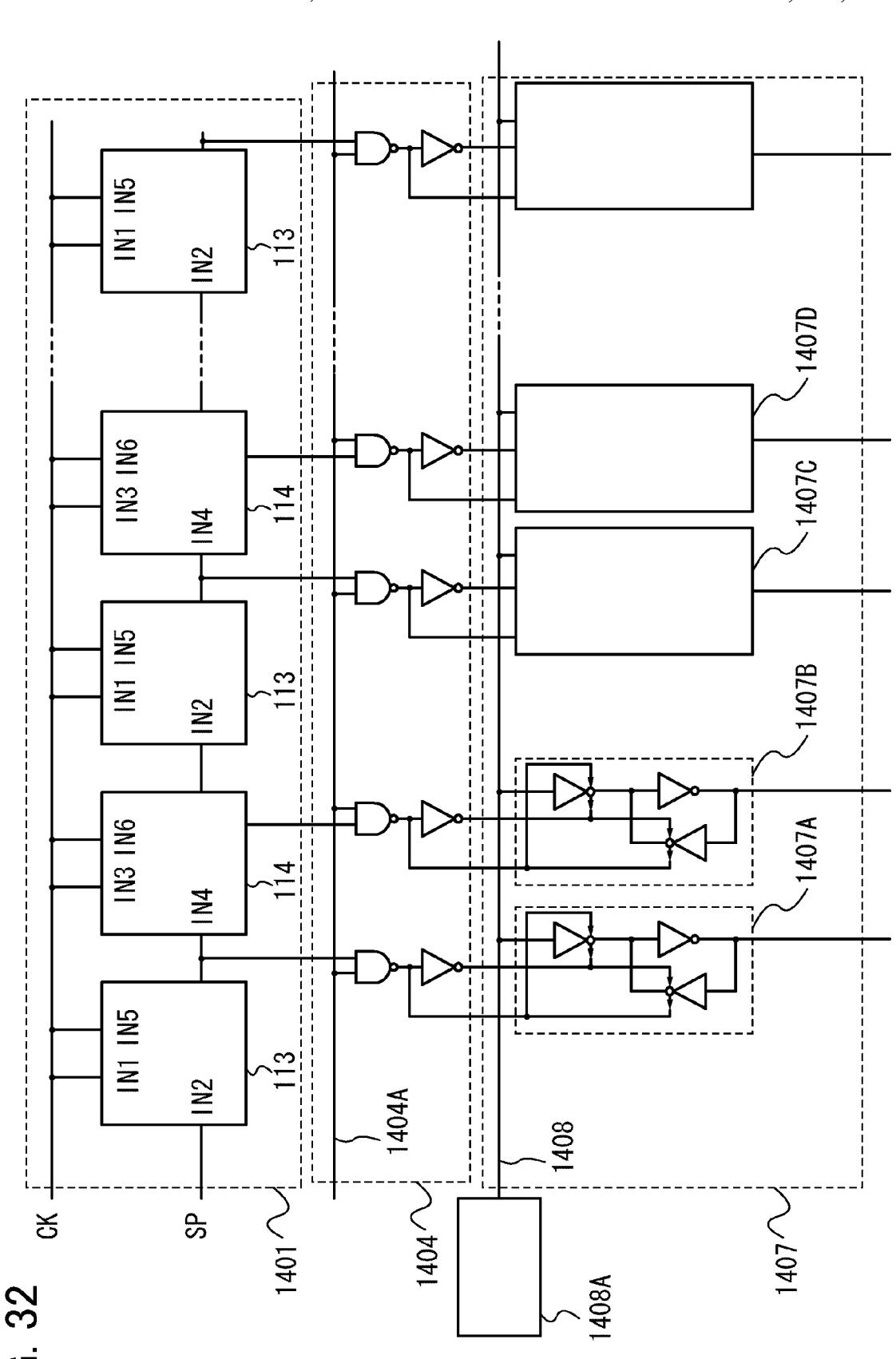
FIG. 32 is a block diagram of an example of a configuration of Embodiment 4.

Note that as an extraction terminal of an output signal from a shift register, not only the input terminal IN2 and the input terminal IN4 but also the node S1, the node S2, the node S4, the node S5, and the like can be used. Here, FIG. 32 illustrates an example of the shift register 1401 in the case where a signal input to the input terminal IN4 and a signal of the node S5 are output signals. In this case, a signal transferred to the flip flop 113 or the flip flop 114 connected to the previous flip flop and a signal extracted as an output signal from the shift register are output from different nodes.

Note that FIG. 32 illustrates an example of the case where a circuit 1407 is provided instead of the circuit 1405. A video signal is supplied from a circuit 1408A to a memory circuit 1407A, a memory circuit 1407B, a memory circuit 1407C, a memory circuit 1407D, and the like through a wiring 1408. Accordingly, the circuit 1407 can have a function as a latch circuit. The memory circuit 1407A, the memory circuit 1407B, the memory circuit 1407C, and the memory circuit 1407D include a clocked inverter circuit or an inverter circuit. Therefore, it can be said that the shift register 1401, the circuit 1404, or the circuit 1407 is a source line driver circuit (or part of the source line driver circuit).

Note that a video signal supplied to the wiring 1408 is a digital signal in many cases.

Note that a signal can be output from the shift register 1401 through the node S1, the node S2, the node S3, the node S4, the node S5, the input terminal IN2, the input terminal IN4, and the like. After that, an inverter circuit is provided and a signal can be inverted or current drive capability can be improved (impedance is converted).

Figure 33:
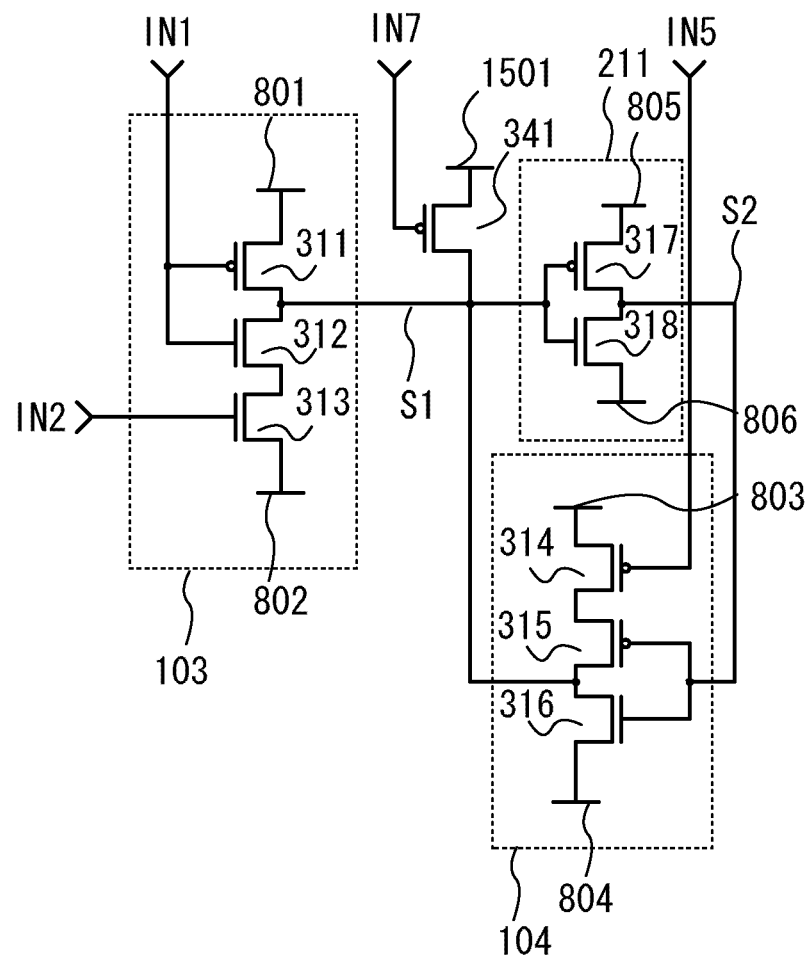
FIG. 33 is a circuit diagram of an example of a configuration of Embodiment 4.

The shift register and the flip flop may include a reset circuit for initialization. FIG. 33 illustrates a circuit configuration in which a reset circuit is added to the circuit configuration in FIG. 1. The reset circuit is formed using a p-channel transistor 341. A first terminal of the p-channel transistor 341 is connected to a wiring 1501. A second terminal of the p-channel transistor 341 is connected to the node S1. A gate of the p-channel transistor 341 functions as an input terminal (IN7). The wiring 1501 may be connected to a wiring or a circuit to which the high potential power source VDD is supplied. A reset signal RS is input to the input terminal (IN7). As a reset signal, an H-level signal is applied to the gate of the p-channel transistor 341 when the flip flop operates; on the other hand, when an L-level signal is applied to the gate of the p-channel transistor 341, the potential of the node S1 becomes the H level and the flip flop is reset. A reset circuit can be also formed using an n-channel transistor. At that time, a first terminal of the n-channel transistor is connected to the node S2, and a second terminal of the n-channel transistor is connected to a wiring or a circuit to which the low potential power source VSS is supplied. At that time, the flip flop is reset by an H-level reset signal RS applied to a gate of the n-channel transistor. In addition, the reset circuit can have other circuit configuration.

Note that the wiring 1501 can be connected to the wiring 801, the wiring 803, and the like. Alternatively, in the case where the first terminal of the n-channel transistor is connected to the node S2, the second terminal of the n-channel transistor can be connected to the wiring 802, the wiring 804, and the like.

Figure 34:
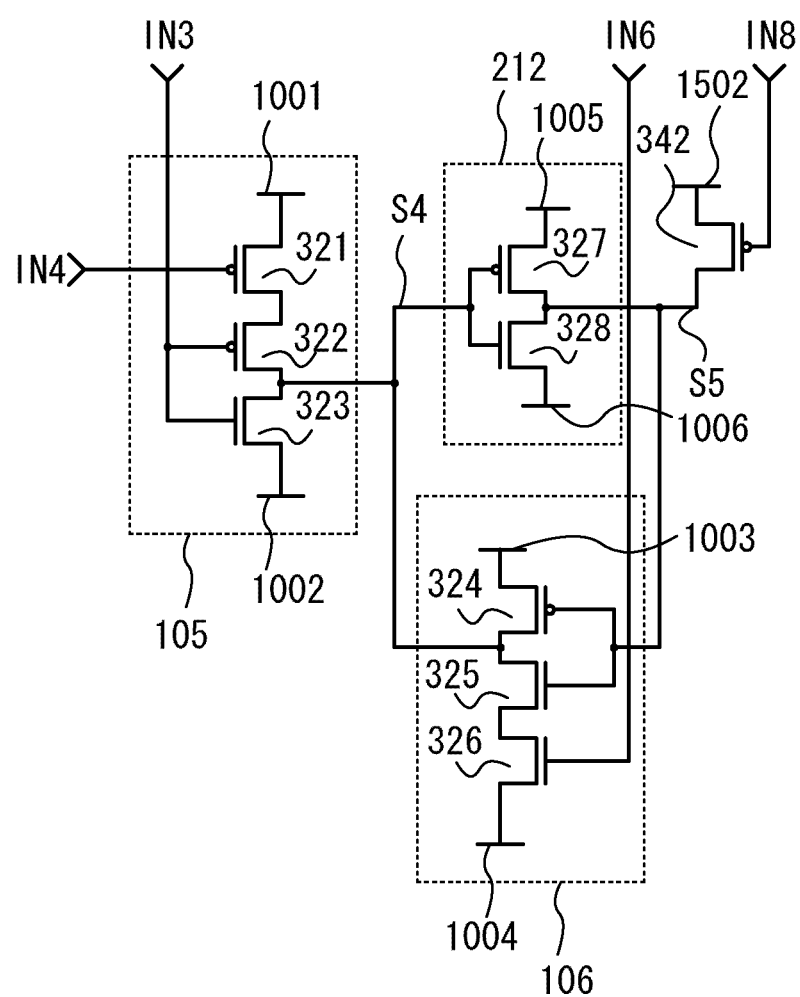
FIG. 34 is a circuit diagram of an example of a configuration of Embodiment 4.

FIG. 34 illustrates a circuit configuration in which a reset circuit is added to the circuit configuration in FIG. 11. The reset circuit is formed using a p-channel transistor 342. A first terminal of the p-channel transistor 342 is connected to a wiring 1502. A second terminal of the p-channel transistor 342 is connected to the node S5. A gate of the p-channel transistor 342 functions as an input terminal (IN8). The wiring 1502 can be connected to a wiring or a circuit to which the high potential power source VDD is supplied. A reset signal RS is input to the input terminal (IN8). As a reset signal, an H-level signal is applied to the gate of the p-channel transistor 342 when the flip flop operates; on the other hand, when an L-level signal is applied to the gate of the p-channel transistor 342, the potential of the node S5 becomes the H level and the flip flop is reset. A reset circuit can be also formed using an n-channel transistor. At that time, a first terminal of the n-channel transistor is connected to the node S4, and a second terminal of the n-channel transistor is connected to a wiring or a circuit to which the low potential power source VSS is supplied. At that time, the flip flop is reset by an H-level reset signal RS applied to a gate of the n-channel transistor. In addition, the reset circuit can have other circuit configuration.

Note that the wiring 1502 can be connected to the wiring 1001, the wiring 1003, and the like. Alternatively, in the case where the first terminal of the n-channel transistor is connected to the node S4, the second terminal of the n-channel transistor can be connected to the wiring 1002, the wiring 1004, and the like.

Figure 35:
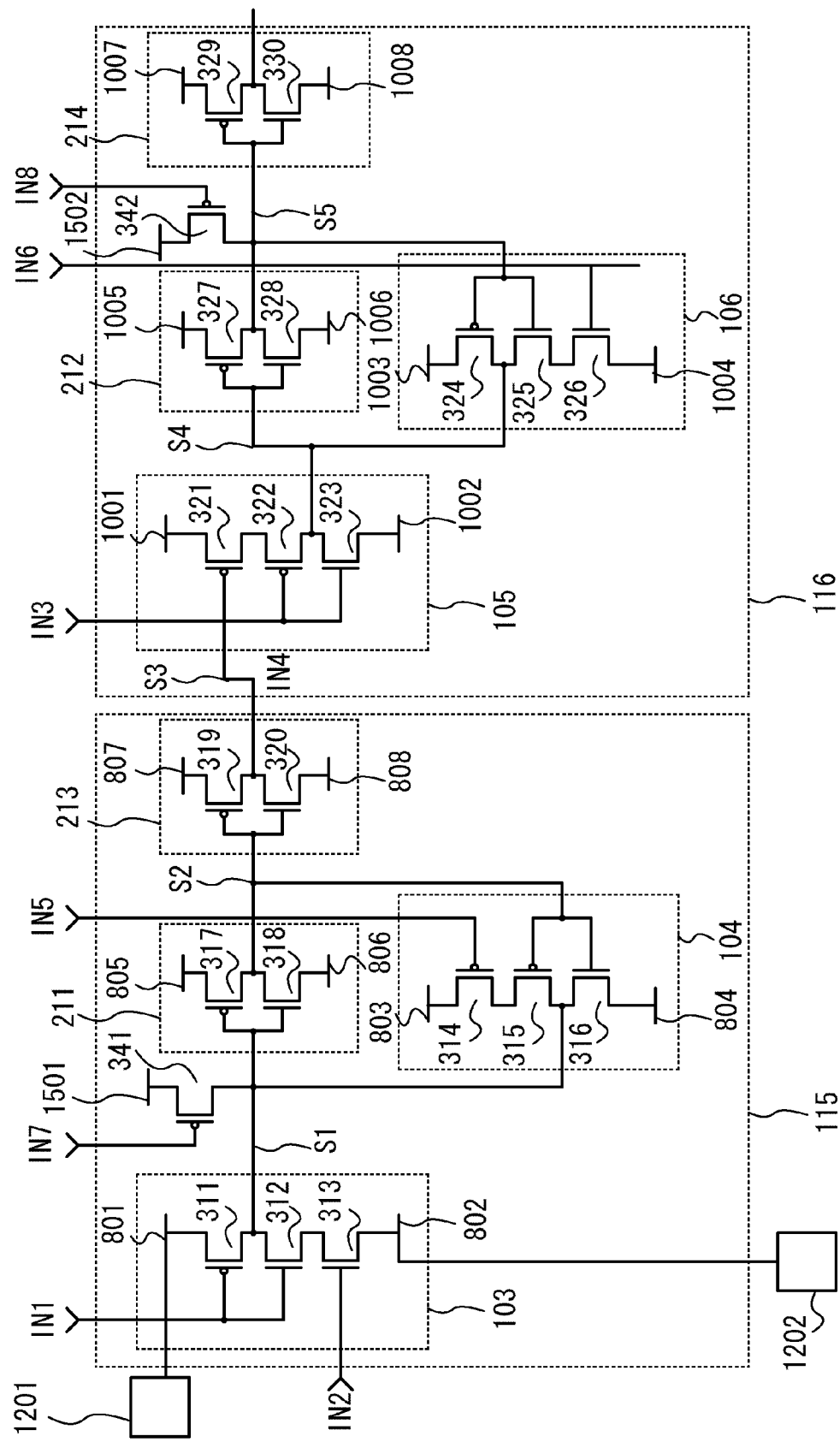
FIG. 35 is a circuit diagram of an example of a configuration of Embodiment 4.
Figure 36:
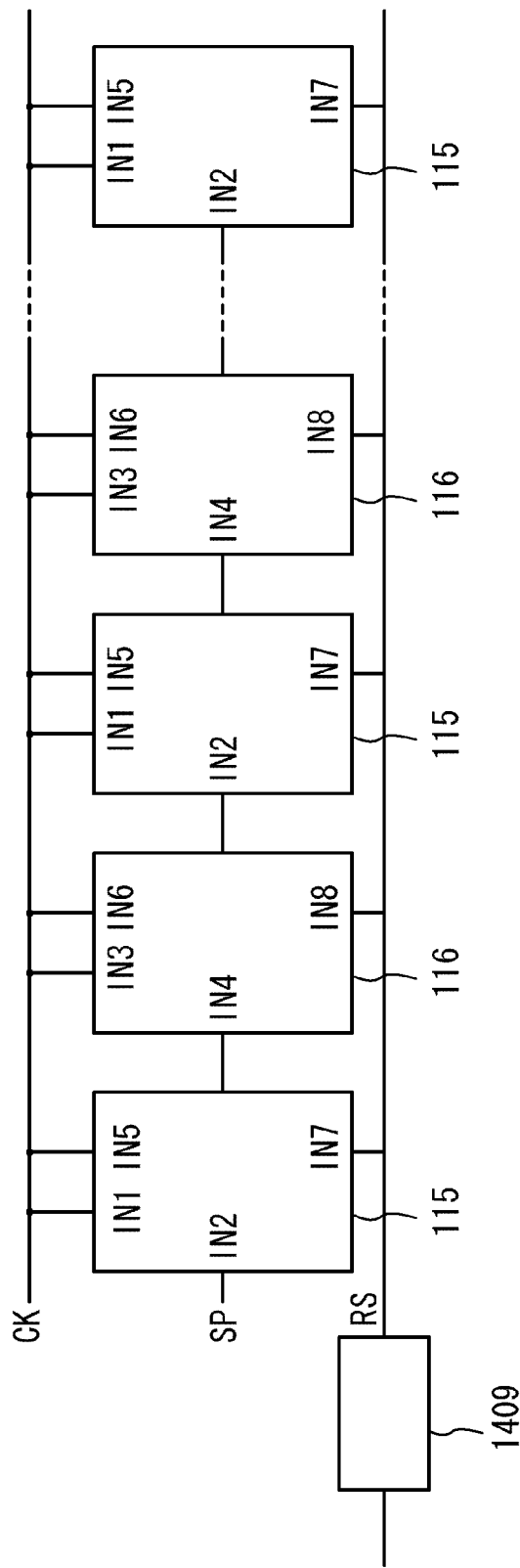
FIG. 36 is a block diagram of an example of a configuration of Embodiment 4.

FIG. 35 illustrates a circuit configuration in which a reset circuit is added to the circuit configuration in FIG. 28. The description of FIG. 33 and FIG. 34 may be referred to for the detailed description. FIG. 35 illustrates the case where both a flip flop 115 and a flip flop 116 include reset circuits but it is also acceptable that any one of the flip flops includes a reset circuit. FIG. 36 illustrates a block diagram of a shift register in which the flip flops 115 and the flip flops 116 are connected in a plurality of stages. The flip flops 115 and the flip flops 116 are alternately connected in a plurality of stages to form a shift register. The first stage and the last stage may be either the flip flop 115 or the flip flop 116: a practitioner can determine the number of stages as necessary. As an example, to the flip flop 115 and the flip flop 116, a clock signal CK is input from the circuit 1402 and a reset signal RS is input from a circuit 1409. Further, as an example, an input signal SP is input from a circuit 1403 to the first stage and an output signal of the previous stage is input to the second stage or subsequent stages.

Embodiment 6

Next, an example of a method for manufacturing a transistor which can be used as an embodiment of the present invention will be described. That is to say, an example of a method for manufacturing the circuits which is explained in Embodiments 1 to 5 will be described. Accordingly, contents described in Embodiments 1 to 5 can be applied to, combined with, or replaced with this embodiment.

Figure 37A:
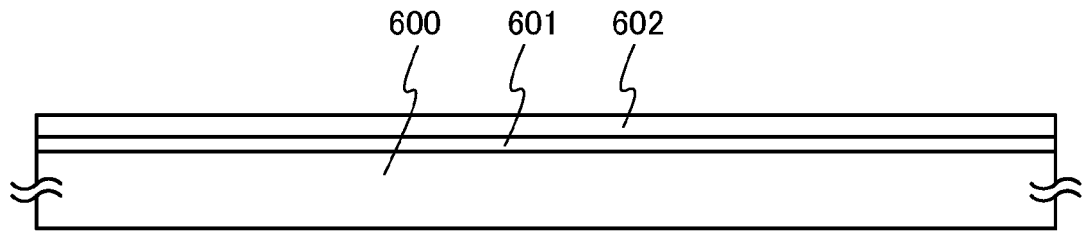
FIGS. 37A to 37D are cross-sectional views showing an example of the method of fabricating a transistor.

First, as illustrated in FIG. 37A, an insulating layer 601 and a semiconductor layer 602 are sequentially formed over a substrate 600. The insulating layer 601 and the semiconductor layer 602 can be successively formed without being exposed to the air. Alternatively, an SOI substrate can be used instead of the substrate 600, the insulating layer 601, and the semiconductor layer 602.

Although there is no particular limitation on a substrate which can be used as the substrate 600, it is necessary that the substrate have at least heat resistance high enough to withstand heat treatment to be performed later. For example, a glass substrate formed by a fusion process or a float process can be used. In the case where the temperature of the heat treatment to be performed later is high, a glass substrate whose strain point is 730° C. or higher is preferably used as a glass substrate. For the glass substrate, a glass material such as aluminosilicate glass, aluminoborosilicate glass, or barium borosilicate glass is used, for example. Note that in general, by containing more barium oxide (BaO) than boron oxide ($B_2O_3$), a more practical heat-resistant glass substrate can be obtained. Therefore, a glass substrate containing more BaO and $B_2O_3$ is preferably used. Here, as the substrate 600, a 0.5-mm-thick aluminosilicate glass substrate, which is a non-alkali glass substrate, (manufactured by Asahi Glass Co., Ltd. (trade name: AN100)) is used.

The insulating layer 601 is provided in order that alkali metal such as Na or alkaline earth metal contained in the substrate 600 can be prevented from diffusing into the semiconductor layer 602 and adversely affecting characteristics of a semiconductor element such as a transistor. Thus, it is preferable that the insulating layer 601 be formed using an insulating material having a high barrier property that can suppress diffusion of alkali metal or alkaline earth metal into the semiconductor layer 602. Note that in the case where a substrate containing even a small amount of alkali metal or alkaline earth metal, such as a glass substrate or a plastic substrate, is used, provision of the insulating layer 601 between the substrate 600 and the semiconductor layer 602 is effective in preventing diffusion of impurities. However, when a substrate in which diffusion of impurities does not lead to a significant problem, such as a quartz substrate, is used as the substrate 600, the insulating layer 601 is not necessarily provided.

The insulating layer 601 is formed using an insulating material such as silicon oxide, silicon nitride, silicon oxynitride, silicon nitride oxide, or aluminum nitride by CVD, sputtering, or the like.

Note that a silicon oxynitride film is a film which contains more oxygen than nitrogen and, in the case where measurement is performed using Rutherford backscattering spectrometry (RBS) and hydrogen forward scattering spectrometry (HFS), shows concentrations of oxygen, nitrogen, silicon, and hydrogen at a range from 50 to 70 at. %, 0.5 to 15 at. %, 25 to 35 at. %, and 0.1 to 10 at. %, respectively. Further, a silicon nitride oxide film is a film which contains more nitrogen than oxygen and, in the case where measurement is performed using RBS and HFS, shows concentrations of oxygen, nitrogen, silicon, and hydrogen at a range from 5 to 30 at. %, 20 to 55 at. %, 25 to 35 at. %, and 10 to 25 at. %, respectively. Note that percentages of nitrogen, oxygen, silicon, and hydrogen fall within the ranges given above if the total number of atoms contained in silicon oxynitride or silicon nitride oxide is defined as 100 at. %.

The insulating layer 601 may be formed using a single insulating film or a stack of a plurality of insulating films. Here, the insulating layer 601 is formed by sequentially stacking a 50-nm-thick silicon nitride oxide film and a 140-nm-thick silicon oxynitride film. However, the material and the thickness of each film, and the number of stacked layers are not limited to these.

A silicon oxide film can be formed using a mixed gas of silane and oxygen, tetraethoxysilane (TEOS) and oxygen, or the like by a method such as thermal CVD, plasma-enhanced CVD, atmospheric pressure CVD, or bias ECRCVD. A silicon nitride film can be typically formed using a mixed gas of silane and ammonia by plasma-enhanced CVD. A silicon oxynitride film and a silicon nitride oxide film can be typically formed using a mixed gas of silane and dinitrogen monoxide by plasma-enhanced CVD.

The semiconductor layer 602 is preferably formed without being exposed to the air after the insulating layer 601 is formed. The thickness of the semiconductor layer 602 is 20 to 200 nm (preferably 40 to 170 nm, more preferably 50 to 150 nm). Note that the semiconductor layer 602 includes a polycrystalline semiconductor containing silicon or germanium.

The semiconductor layer 602 including a polycrystalline semiconductor can be formed by crystallization of an amorphous semiconductor layer or a microcrystalline semiconductor layer by laser crystallization, thermal crystallization, thermal crystallization in which a catalytic element which promotes crystallization, such as nickel, is used, or the like alone, or by a combination of any of the above methods. Alternatively, a polycrystalline semiconductor may be formed directly by sputtering, plasma-enhanced CVD, thermal CVD, or the like. In the case where laser crystallization is performed without introduction of a catalytic element which promotes crystallization, in order to prevent generation of a phenomenon in which the amorphous semiconductor layer scatter due to laser light irradiation (such a phenomenon is referred to as ablation), the amorphous semiconductor layer is heated at 500° C. for one hour in a nitrogen atmosphere so that the concentration of hydrogen contained in the amorphous semiconductor layer is $1 \times 10^{20}$ atoms/cm$^3$ or lower before the amorphous semiconductor layer is irradiated with laser light.

For example, in the case where a polycrystalline semiconductor layer is formed by laser crystallization, heat treatment at 550° C. for four hours is performed on the semiconductor layer 602 before the laser crystallization in order to improve resistance of the semiconductor layer 602 to laser. A crystal with a large grain size can be obtained by irradiation with laser light having one of the second, third, and fourth harmonics of a fundamental wave by using a continuous-wave solid-state laser. Typically, for example, the second (532 nm) harmonic or the third (355 nm) harmonic of an Nd:YVO$_4$ laser (having a fundamental wave of 1064 nm) is preferably used. Specifically, the laser light emitted from the continuous wave YVO$_4$ laser is converted into the harmonic by a non-linear optical element so that laser light having an output of 10 W is obtained. The laser light is preferably shaped into a rectangular or elliptical shape on an irradiated surface by an optical system and is emitted to the semiconductor layer 602. The power density in that case needs to be approximately 0.01 to 100 MW/cm$^2$ (preferably 0.1 to 10 MW/cm$^2$). The scan rate is set to approximately 10 to 2000 cm/sec for the irradiation.

As a continuous-wave gas laser, an Ar laser, a Kr laser, or the like can be used. As a continuous-wave solid-state laser, a YAG laser, a YVO$_4$ laser, a YLF laser, a YAlO$_3$ laser, a forsterite (Mg$_2$SiO$_4$) laser, a GdVO$_4$ laser, a Y$_2$O$_3$ laser, a glass laser, a ruby laser, an alexandrite laser, a Ti:sapphire laser, or the like can be used.

As a pulsed laser, an Ar laser, a Kr laser, an excimer laser, a CO$_2$ laser, a YAG laser, a Y$_2$O$_3$ laser, a YVO$_4$ laser, a YLF laser, a YAlO$_3$ laser, a glass laser, a ruby laser, an alexandrite laser, a Ti:sapphire laser, a copper vapor laser, or a gold vapor laser can be used, for example.

Alternatively, laser crystallization may be performed using pulsed laser light having a pulse repetition rate of 10 MHz or higher. The repetition rate of the pulsed laser light is much higher than the frequency band of several tens of hertz to several hundreds of hertz, which is usually used. It is said that the time between irradiation with pulsed laser light and complete solidification of the semiconductor layer 602 is several ten to several hundred nanoseconds. Thus, when the pulsed laser light has the above repetition rate, the semiconductor layer 602 can be irradiated with laser light of the next pulse before the semiconductor layer 602 melted by preceding laser light is solidified. Therefore, since a solid-liquid interface can be continuously moved in the semiconductor layer 602, the semiconductor layer 602 having crystal grains grown continuously in a scan direction is formed. Specifically, an aggregate of crystal grains having widths of approximately 10 to 30 µm in the scan direction and widths of approximately 1 to 5 µm in a direction perpendicular to the scan direction can be formed. By formation of such crystal grains of single crystal that are grown continuously in the scan direction, the semiconductor layer 602 having few grain boundaries at least in a channel direction of a TFT can be formed.

Note that the laser crystallization can be performed by irradiation with a fundamental wave of continuous-wave laser light and a harmonic of the continuous-wave laser light in parallel. Alternatively, the laser crystallization may be performed by irradiation with a fundamental wave of continuous-wave laser light and a harmonic of pulsed laser light in parallel.

Note that laser irradiation may be performed in an inert gas atmosphere such as a rare gas or a nitrogen gas. Thus, the increase in roughness of a semiconductor surface due to laser light irradiation can be suppressed, and variation in threshold voltage due to variation in interface state density can be suppressed.

In the case of using thermal crystallization using a catalytic element which promotes crystallization, a method for introducing the catalytic element into the amorphous semiconductor layer is not particularly limited to a certain method as long as the catalytic element can be introduced onto a surface of or inside the amorphous semiconductor layer. For example, sputtering, CVD, plasma treatment (also including plasma-enhanced CVD), an adsorption method, or a method of applying a solution of a metal salt can be used. Among them, the method of using a solution is easy and can easily adjust the concentration of the catalytic element. Further, it is preferable that an oxide film be formed by UV light irradiation in an oxygen atmosphere, thermal oxidation, treatment with ozone water or hydrogen peroxide containing a hydroxyl radical, or the like, in order to improve the wettability of the surface of the amorphous semiconductor layer and to spread the aqueous solution over the entire surface of the amorphous semiconductor layer.

After the catalytic element is introduced into the amorphous semiconductor layer, the polycrystalline semiconductor layer can be formed by heat treatment (at 550° C. to 750° C. for 3 minutes to 24 hours). As the catalytic element which promotes the crystallization, one or more kinds of elements selected from iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used.

After the crystallization, the catalytic element which promotes the crystallization is removed from the polycrystalline semiconductor layer, or gettering is performed in order to lower the concentration of the catalytic element. A semiconductor layer which contains an impurity element is formed so as to be in contact with the polycrystalline semiconductor layer on which the crystallization is performed. The semiconductor layer which contains the impurity element serves as a gettering sink. As the impurity element, an impurity element which imparts n-type conductivity, an impurity element which imparts p-type conductivity, or a rare gas element can be used. For example, one or more kinds of elements selected from phosphorus (P), nitrogen (N), arsenic (As), antimony (Sb), bismuth (Bi), boron (B), helium (He), neon (Ne), argon (Ar), krypton (Kr), and xenon (Xe) can be used. Then, heat treatment (at 550° C. to 750° C. for 3 minutes to 24 hours) is performed. With the treatment, the catalytic element which is contained in the polycrystalline semiconductor layer and promotes the crystallization is moved into the semiconductor layer containing the impurity element, so that the concentration of the catalytic element which promotes the crystallization in the polycrystalline semiconductor layer is lowered. After that, the semiconductor layer containing the impurity element that serves as the gettering sink is removed.

Here, the semiconductor layer 602 is formed using polycrystalline silicon by a combination of crystallization using a catalytic element and laser crystallization. A specific method for manufacturing the semiconductor layer 602 is described below.

Here, first, a 50-nm-thick amorphous silicon film is formed over the insulating layer 601. Then, a nickel acetate solution containing 10 ppm by weight of nickel is applied to the amorphous silicon film by a spinner. Note that a method by which a nickel element is dispersed over the entire surface by sputtering may be used instead of a method by which the catalytic element is added using the solution. Next, after heat treatment (at 500° C. for one hour), heat treatment for crystallization (at 550° C. for four hours) is performed, so that the amorphous silicon film is crystallized, whereby the semiconductor layer 602 containing polycrystalline silicon.

Next, the oxide film formed on the surface of the semiconductor layer 602 containing polycrystalline silicon is removed with dilute hydrofluoric acid. After that, irradiation with laser light (XeCl: a wavelength of 308 nm) for increasing the degree of crystallization and reducing defects left in crystal grains is performed in the atmosphere or an oxygen atmosphere.

Excimer laser light having a wavelength of 400 nm or less, or the second harmonic or the third harmonic of a YAG laser is used for the laser light. Here, pulsed laser light having a repetition rate of approximately 10 to 1000 Hz is used. The laser light is condensed to 100 to 500 mJ/cm$^2$ by an optical system, and irradiation is performed with an overlap rate of 90 to 95%, thereby scanning the surface of the silicon film. In this embodiment, irradiation with laser light having a repetition rate of 30 Hz and an energy density of 470 mJ/cm$^2$ is performed in the air.

Note that since the laser light irradiation is performed in the air or an oxygen atmosphere, an oxide film is formed on the surface by the laser light irradiation. Note that although an example where the pulsed laser is used is illustrated in this embodiment, a continuous wave laser may be used. In order to obtain a crystal with a large grain size at the time of crystallization of the semiconductor layer, it is preferable to use a continuous-wave solid-state laser and any of the second to fourth harmonics of a fundamental wave. Typically, the second harmonic (532 nm) or the third harmonic (355 nm) of an Nd:YVO$_4$ laser (a fundamental wave of 1064 nm) may be used.

In the case where a continuous wave laser is used, laser light emitted from the continuous wave YVO$_4$ laser having an output of 10 W is converted into harmonics by a non-linear optical element. Alternatively, the harmonics are obtained by putting a YVO$_4$ crystal and a non-linear optical element in a resonator. Then, the laser light is preferably shaped by an optical system so that the laser light has a rectangular shape or an elliptical shape on an irradiated face, and an object is irradiated with this laser light. The power density in that case needs to be approximately 0.01 to 100 MW/cm$^2$ (preferably 0.1 to 10 MW/cm$^2$). Then, irradiation with the laser light is performed while the semiconductor layer is moved relatively to the laser light at a rate of approximately 10 to 2000 cm/s.

Next, in addition to the oxide film formed by the laser light irradiation, a barrier layer formed using an oxide film having a thickness of 1 to 5 nm in total is formed on the surface of the polycrystalline semiconductor layer by processing of the surface of the polycrystalline semiconductor layer subjected to the laser crystallization with ozone water for 120 seconds. The barrier layer is formed in order to remove the catalytic element which is added for crystallization, such as nickel (Ni), from the polycrystalline semiconductor layer. Although the barrier layer is formed using ozone water here, the barrier layer may be formed by deposition of an oxide film having a thickness of approximately 1 to 10 nm by a method of oxidizing a surface of a semiconductor layer having a crystal structure by UV light irradiation in an oxygen atmosphere, a method of oxidizing a surface of a semiconductor layer having a crystal structure by oxygen plasma treatment, plasma-enhanced CVD, sputtering, evaporation, or the like. In addition, before the barrier layer is formed, the oxide film formed by the laser light irradiation may be removed.

Next, over the barrier layer, an amorphous silicon film containing an argon element that serves as a gettering site is formed to a thickness of 10 nm to 400 nm, for example, 100 nm here, by sputtering. Here, the amorphous silicon film containing an argon element is formed in an atmosphere containing argon with the use of a silicon target. In the case where the amorphous silicon film containing an argon element is formed by plasma-enhanced CVD, the amorphous silicon film containing an argon element is formed under the following deposition conditions: a monosilane/argon ($SiH_4$: Ar) flow ratio of 1:99; a deposition pressure of 6.665 Pa; an RF power density of 0.087 $W/cm^2$; and a deposition temperature of 350° C.

After that, a furnace heated to 650° C. is used for heat treatment for three minutes so that the catalytic element is removed (gettering). Accordingly, the concentration of the catalytic element in the semiconductor layer 602 having a crystal structure is lowered. A lamp annealing apparatus may be used instead of the furnace.

Next, after the amorphous silicon film containing an argon element that is the gettering site is selectively removed using the barrier layer as an etching stopper, the barrier layer is selectively removed with dilute hydrofluoric acid. Note that since nickel tends to move to a region with a high concentration of oxygen in gettering, the barrier layer formed using an oxide film is preferably removed after the gettering.

When the semiconductor layer is crystallized in the absence of a catalytic element, the above steps including the formation of a barrier layer, the formation of a gettering site, heat treatment for gettering, removal of the gettering site, removal of the barrier layer, and the like are not necessary.

After the semiconductor layer 602 is formed as described above, channel doping by which an impurity element which imparts p-type conductivity or an impurity element which imparts n-type conductivity is added at a low concentration is performed on the semiconductor layer 602. The channel doping may be performed on the whole semiconductor layer 602 or may be selectively performed on part of the semiconductor layer 602. As the impurity element which imparts p-type conductivity, boron (B), aluminum (Al), gallium (Ga), or the like can be used. As the impurity element which imparts n-type conductivity, phosphorus (P), arsenic (As), or the like can be used. Here, boron (B) is used as the impurity element and is added so as to be contained at a concentration of $1\times10^{16}$ to $5\times10^{17}/cm^3$.

Figure 37B:
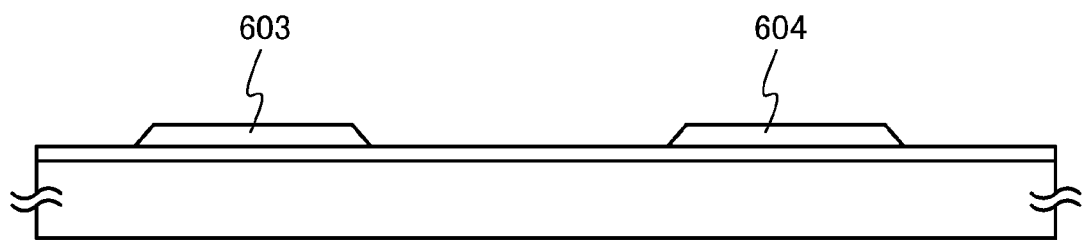

Next, the semiconductor layer 602 is processed (patterned) to have a desired shape by etching, so that semiconductor layers 603 and 604 which are separated into island shapes are formed as illustrated in FIG. 37B. Note that the channel doping may be performed not on the semiconductor layer 602 but on the processed semiconductor layers 603 and 604.

Figure 37C:
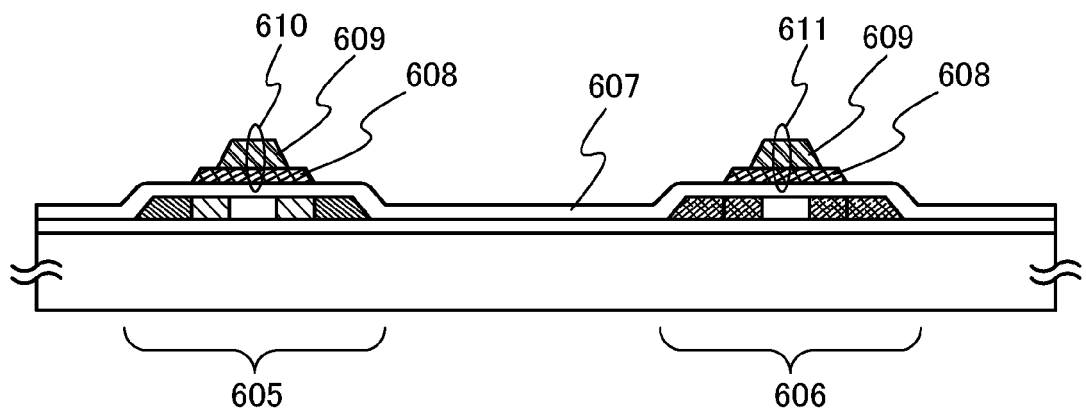

Then, as illustrated in FIG. 37C, transistors 605 and 606 are formed using the semiconductor layers 603 and 604. Specifically, a gate insulating layer 607 is formed so as to cover the semiconductor layers 603 and 604. Then, over the gate insulating layer 607, conductive films 608 and 609 which are processed (patterned) to have desired shapes are formed. The conductive films 608 and 609 are sequentially stacked over the gate insulating layer 607. The conductive films 608 and 609 which overlap with the semiconductor layer 603 function as a gate electrode 610 of the transistor 605. The conductive films 608 and 609 which overlap with the semiconductor layer 604 function as a gate electrode 611 of the transistor 606.

Then, impurities which impart n-type or p-type conductivity are added to the semiconductor layers 603 and 604 with the use of the conductive film 608, the conductive film 609, or a resist which is patterned, as a mask, so that impurity regions which function as a source region, a drain region, and LDD regions, and the like are formed. Note that although FIG. 37C illustrates the case where the transistor 605 is an n-channel transistor and the transistor 606 is a p-channel transistor, the transistor 605 may be a p-channel transistor and the transistor 606 may be an n-channel transistor, the transistors 605 and 606 may be n-channel transistors, or the transistors 605 and 606 may be p-channel transistors.

Note that the gate insulating layer 607 can be formed using a single layer of silicon oxide film, a silicon nitride film, a silicon oxynitride film, or a silicon nitride oxide film or a stack of any of a silicon oxide film, a silicon nitride film, a silicon oxynitride film, and a silicon nitride oxide film, for example. In the case where the gate insulating layer 607 is formed using a stack, it is preferable to use a three-layer structure in which a silicon oxide film, a silicon nitride film, and a silicon oxide film are sequentially stacked from the substrate 600 side, for example. Further, the gate insulating layer 607 can be formed by plasma-enhanced CVD, low-pressure CVD, sputtering, or the like. For example, in the case where the gate insulating layer 607 including silicon oxide is formed by plasma-enhanced CVD, the gate insulating layer 607 is formed under the following conditions: a gas in which tetraethyl orthosilicate (TEOS) and $O_2$ are mixed; a reaction pressure of 40 Pa; a substrate temperature of 300 to 400° C.; and a high-frequency (13.56 MHz) power density of 0.5 to 0.8 $W/cm^2$.

The gate insulating layer 607 may be formed by oxidation or nitriding of surfaces of the semiconductor layers 603 and 604 by high-density plasma treatment. The high-density plasma treatment is performed using, for example, a mixed gas of a rare gas such as He, Ar, Kr, or Xe and oxygen, nitrogen oxide, ammonia, nitrogen, hydrogen, or the like. In that case, when plasma is excited by introduction of microwaves, plasma with a low electron temperature and high density can be generated. By oxidation or nitriding of the surfaces of the semiconductor layers 603 and 604 with oxygen radicals (including OH radicals in some cases) or nitrogen radicals (including NH radicals in some cases) generated by such high-density plasma, an insulating film having a thickness of 1 to 20 nm, typically 5 to 10 nm is formed so as to be in contact with the semiconductor layers 603 and 604. The insulating film having a thickness of 5 to 10 nm may be used as the gate insulating layer 607.

The oxidation or nitriding of the semiconductor layers by the high-density plasma treatment proceeds by solid-phase reaction. Therefore, interface state density between the gate insulating film and the semiconductor layers can be made extremely low. Further, by direct oxidation or nitriding of the semiconductor layers by high-density plasma treatment, variations in the thickness of the insulating film to be formed can be suppressed. Further, in the case where the semiconductor layers have crystallinity, oxidation in crystal grain boundaries proceeds at fast speed by thermal oxidation and the uniformity of the thickness of a thermal oxide semiconductor film is not preferable. On the other hand, by oxidation of the surfaces of the semiconductor layers by solid-phase reaction by high-density plasma treatment, crystal grains and crystal grain boundaries are uniformly oxidized; therefore, crystal grain boundaries can be prevented from being locally oxidized at fast speed. Thus, a uniform gate insulating film with low interface state density can be formed. Variations in the characteristics of a transistor can be suppressed when the gate insulating film partly or entirely includes an insulating film formed by high-density plasma treatment.

Alternatively, aluminum nitride can be used for the gate insulating layer 607. Aluminum nitride has comparatively high thermal conductivity and can efficiently diffuse heat generated in a transistor. Alternatively, after silicon oxide, silicon oxynitride, or the like which does not contain aluminum is formed, aluminum nitride may be stacked thereon to be used for the gate insulating film.

Here, the 30-nm-thick gate insulating layer 607 containing silicon oxynitride is formed using nitrous oxide ($N_2O$) and silane ($SiH_4$) at a pressure of 10 to 30 Pa and a microwave (2.45 GHz) power of 3 to 5 kW by vapor deposition. By a combination of solid phase reaction and reaction due to vapor deposition, the gate insulating layer 607 having low interface state density and high withstand voltage can be formed.

Alternatively, for the gate insulating layer 607, a high dielectric constant material such as zirconium dioxide, hafnium oxide, titanium dioxide, or tantalum pentoxide may be used. With the use of a high dielectric constant material for the gate insulating layer 607, the physical thickness of the gate insulating film 607 can be large, and therefore, gate leakage current can be reduced.

Although the gate electrodes 610 and 611 are formed using the two conductive films 608 and 609 which are stacked in this embodiment, the present invention is not limited thereto structure. Instead of the conductive films 608 and 609, the gate electrodes 610 and 611 may be formed using a single-layer conductive film, or may be formed using three or more conductive films which are stacked. In the case of a three-layer structure in which three or more conductive films are stacked, a layered structure of a molybdenum film, an aluminum film, and a molybdenum film is preferably used.

For the conductive film used for the gate electrodes 610 and 611, tantalum (Ta), tungsten (W), titanium (Ti), molybdenum (Mo), aluminum (Al), copper (Cu), chromium (Cr), niobium (Nb), neodymium (Nd), cobalt (Co), zirconium (Zr), zinc (Zn), ruthenium (Ru), rhodium (Rh), palladium (Pd), osmium (Os), iridium (Ir), platinum (Pt), gold (Au), silver (Ag), or the like can be used. Alternatively, either an alloy containing the metal as its main component or a compound containing the metal may be used. Alternatively, the conductive film may be formed using a semiconductor such as polycrystalline silicon that is doped with an impurity element which imparts conductivity, such as phosphorus, to a semiconductor layer.

Alternatively, for the conductive film used for the gate electrodes 610 and 611, a conductive material having light transmitting properties with respect to visible light can be used. As a light-transmitting conductive material, indium tin oxide (ITO), indium tin oxide containing silicon oxide (ITSO), organic indium, organic tin, zinc oxide, or the like can be used. Alternatively, for the conductive film used for the gate electrodes 610 and 611, indium zinc oxide (IZO) containing zinc oxide (ZnO), zinc oxide (ZnO), ZnO doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like may be used.

Here, tantalum nitride or tantalum (Ta) is used for the first conductive film 608 and tungsten (W) is used for the second conductive film 609. As well as the example illustrated in this embodiment, any of the following combination of the two conductive films can be used: tungsten nitride and tungsten; molybdenum nitride and molybdenum; aluminum and tantalum; aluminum and titanium; and the like. Since tungsten and tantalum nitride have high heat resistance, heat treatment for thermal activation can be performed in a step performed after the two conductive films are formed. Alternatively, as the combination of the two conductive films, for example, nickel silicide and Si doped with an impurity which imparts n-type conductivity, WSix and silicon doped with an impurity which imparts n-type conductivity, or the like can be used.

The conductive films 608 and 609 can be formed by CVD, sputtering, or the like. In the case where the gate electrodes 610 and 611 are formed using the two conductive films, the first conductive film 608 is formed to a thickness of 20 to 100 nm, and the second conductive film 609 is formed to a thickness of 100 to 400 nm. Here, the first conductive film 608 containing tantalum nitride or tantalum (Ta) is formed to a thickness of 30 nm, and the second conductive film 609 containing tungsten (W) is formed to a thickness of 170 nm.

Note that as a mask used for forming the gate electrodes 610 and 611, silicon oxide, silicon oxynitride, or the like may be used instead of a resist. In that case, a step of forming the mask of silicon oxide, silicon oxynitride, or the like by patterning is additionally needed; however, the thickness of the mask is less reduced at the time of etching as compared to the resist, so that the gate electrodes 610 and 611 with desired shapes can be formed. Alternatively, the gate electrodes 610 and 611 may be selectively formed by a droplet discharge method without the use of a mask. Note that a droplet discharge method is a method for forming a predetermined pattern by discharge or ejection of a droplet containing a predetermined composition from an orifice, and includes an inkjet method in its category.

Note that when the gate electrodes 610 and 611 are formed, an optimal etching method and an optimal etchant are selected as appropriate in accordance with the material of the conductive films. An example of an etching method when tantalum nitride is used for the first conductive film 608 and tungsten is used for the second conductive film 609 is specifically described below.

First, after a tantalum nitride film is formed, a tungsten film is formed over the tantalum nitride film. Then, a mask is formed over the tungsten film and first etching is performed. In the first etching, etching is performed under a first etching condition, and then, under a second etching condition. In the first etching condition, etching is performed as follows: inductively coupled plasma (ICP) etching is used; $CF_4$, $Cl_2$, and $O_2$ are used for an etching gas with a flow ratio of 25:25:10 (sccm); and an RF (13.56 MHz) power of 500 W is applied to a coiled electrode at a pressure of 1 Pa so that plasma is generated. Then, an RF (13.56 MHz) power of 150 W is applied to the substrate side (sample stage) so that negative self-bias voltage is substantially applied. Under this first etching condition, it is possible to etch the tungsten film so that end portions thereof are tapered.

Next, etching is performed under the second etching condition. In the second etching conduction, etching is performed for approximately 30 seconds as follows: $CF_4$ and $Cl_2$ are used for an etching gas with a flow ratio of 30:30 (sccm); and an RF (13.56 MHz) power of 500 W is applied to a coiled electrode at a pressure of 1 Pa so that plasma is generated. An RF (13.56 MHz) power of 20 W is applied to the substrate side (sample stage) so that negative self-bias voltage is substantially applied. In the second etching condition where $CF_4$ and $Cl_2$ are mixed with each other, the tungsten film and the tantalum nitride film are etched to the same or substantially the same degree.

In the first etching, when the mask is formed to have a suitable shape, the end portions of the tantalum nitride film and the tungsten film are tapered with an angle of approximately 15 to 45° due to the effect of the bias voltage applied to the substrate side. Note that in the gate insulating layer 607, a portion which is exposed by the first etching is slightly etched to be thinner than other portions which are covered with the tantalum nitride film and the tungsten film depending on the etching condition.

Next, second etching is performed without removal of the mask. In the second etching, the tungsten film is selectively etched using $CF_4$, $Cl_2$, and $O_2$ for an etching gas. In that case, the tungsten film is preferentially etched by the second etching; however, the tantalum nitride film is hardly etched.

Through the first etching and the second etching, the conductive film 608 including tantalum nitride and the conductive film 609 including tungsten that has smaller width than the conductive film 608 can be formed.

Next, impurities which impart one conductivity type are introduced into the semiconductor layers 603 and 604 so that impurity regions of the transistors 605 and 606 are formed. Here, the transistor 605 is an n-channel transistor, and the transistor 606 is a p-channel transistor. Thus, an impurity which imparts n-type conductivity, for example, phosphorus (P), arsenic (As), or the like is introduced into the semiconductor layer 603. Further, an impurity which imparts p-type conductivity, for example, boron (B) is introduced into the semiconductor layer 604.

When the conductive films 608 and 609 which are formed through the first etching and the second etching as masks, the impurity regions which function as the source region, the drain region, and the LDD regions can be separately formed in the semiconductor layer 603 and the semiconductor layer 604 in a self-alignment manner. That is to say, an additional mask is not needed for formation of the impurity regions.

Through the series of steps, the transistors 605 and 606 can be formed. Note that the method for manufacturing the transistors is not limited to the above process.

Note that although a single-gate transistor is illustrated in this embodiment, a multi-gate transistor such as a double-gate transistor may be used.

Alternatively, a transistor or the like formed by an inkjet method or a printing method can be used. Thus, a transistor can be formed at room temperature, can be formed at a low vacuum, or can be formed using a large substrate. In addition, since the transistor can be formed without a mask (a reticle), the layout of the transistor can be easily changed. Further, since it is not necessary to use a resist, material cost is reduced and the number of steps can be reduced. Furthermore, since a film is formed only in a portion where the film is needed, a material is not wasted compared to a manufacturing method in which etching is performed after a film is formed over the entire surface, so that cost can be reduced.

Figure 37D:
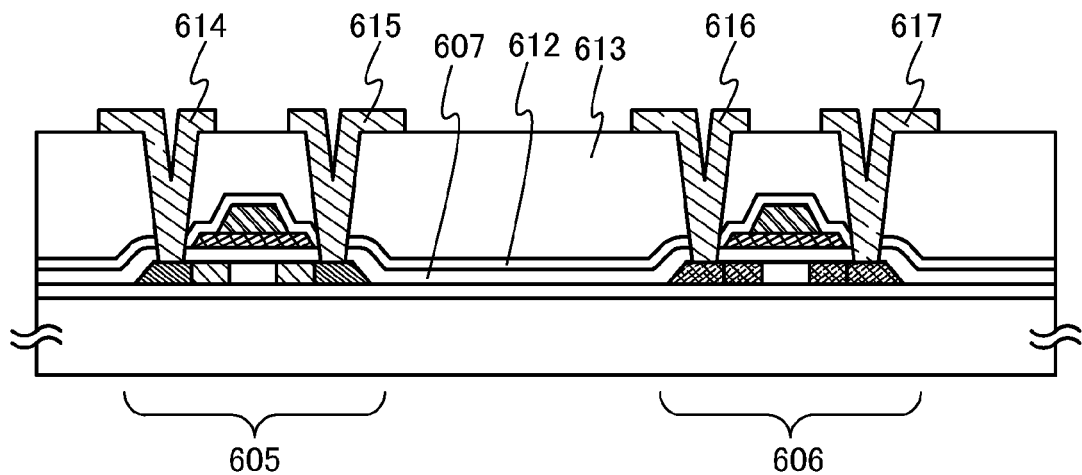

Then, as illustrated in FIG. 37D, an insulating film 612 is formed so as to cover the transistors 605 and 606. The insulating film 612 is not necessarily provided; however, by provision of the insulating film 612, an impurity such as alkali metal or alkaline earth metal can be prevented from entering the transistors 605 and 606. Specifically, it is preferable to use silicon nitride, silicon nitride oxide, silicon oxynitride, aluminum nitride, aluminum oxide, silicon oxide, or the like for the insulating film 612. Here, a silicon oxynitride film having a thickness of approximately 30 nm is formed by CVD and is used as the insulating film 612.

After the insulating film 612 is formed, the impurity regions may be activated by heat treatment. For example, heat treatment may be performed at 480° C. for one hour in a nitrogen atmosphere. For the heat treatment, a thermal annealing method using an annealing furnace, a laser annealing method, a rapid thermal annealing method (an RTA method), or the like can be used.

Next, an insulating film 613 is formed over the insulating film 612. An organic material having heat resistance, such as an acrylic, a polyimide, a benzocyclobutene, a polyamide, or an epoxy can be used for the insulating film 613. As well as such an organic material, a low-dielectric constant material (a low-k material), a siloxane-based resin, silicon oxide, silicon nitride, silicon oxynitride, silicon nitride oxide, phosphosilicate glass (PSG), borophosphosilicate glass (BPSG), alumina, or the like can be used. A siloxane-based resin is a material in which a skeleton structure is formed by the bond of silicon (Si) and oxygen (O). As well as hydrogen, at least one of fluorine, a fluoro group and an organic group (e.g., an alkyl group or aromatic hydrocarbon) may be used as a substituent. Note that the insulating film 613 may be formed using a stack of a plurality of insulating films formed using any of these materials.

For the formation of the insulating film 613, the following method can be used depending on the material of the insulating film 613: a CVD method, a sputtering method, an SOG method, a spin coating method, a dip coating method, a spray coating method, a droplet discharge method (e.g., an ink jet method, screen printing, or offset printing), or a tool (equipment) such as a doctor knife, a roll coater, a curtain coater, or a knife coater.

Here, a 100-nm-thick silicon nitride oxide film containing hydrogen that is formed by CVD and a 900-nm-thick silicon oxynitride film formed by CVD are stacked and used as the insulating film 613.

Note that although the insulating films 612 and 613 serve as interlayer insulating films in this embodiment, a single-layer insulating film may be used as the interlayer insulating film, or an insulating film having two stacked layers or an insulating film having four or more stacked layers may be used as the interlayer insulating film.

Next, heat treatment is preferably performed at 300° C. to 550° C. for 1 to 12 hours. Here, heat treatment is performed at 410° C. for one hour in a nitrogen atmosphere. Through the heat treatment, dangling bonds in the semiconductor layers 603 and 604 can be terminated with hydrogen contained in the insulating film 613. For the heat treatment, thermal annealing using an annealing furnace, laser annealing, rapid thermal annealing (RTA), or the like can be used. Through the heat treatment, not only hydrogenation but also activation of impurity elements added to the semiconductor layers 603 and 604 can be performed. As a different method for performing hydrogenation for terminating the dangling bonds, plasma hydrogenation (using hydrogen excited by plasma) may be performed.

Next, contact holes are formed in the gate insulating layer 607, the insulating film 612, and the insulating film 613 so that the semiconductor layers 603 and 604 are partly exposed.

Then, conductive films 614 and 615 which are in contact with the semiconductor layer 603 through the contact holes and conductive films 616 and 617 which are in contact with the semiconductor layer 604 through the contact holes are formed.

The conductive films 614 to 617 can be formed by CVD, sputtering, or the like. Specifically, for the conductive films 614 to 617, tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like can be used. Alternatively, either an alloy containing the metal as its main component or a compound containing the metal may be used. For the conductive films 614 to 617, a single-layer film including the metal or a plurality of stacked films including the metal can be used.

In this embodiment, an example of a method for manufacturing a thin film transistor is described as a method for manufacturing a transistor which can be used for the present invention. However, the manufacturing method is not limited thereto. Further, a transistor formed in a semiconductor substrate can be used other than a thin film transistor.

Note that in this specification and the like, when it is explicitly described that "Y is formed on X" or "Y is formed over X", it does not necessarily mean that Y is formed in direct contact with X. The description includes the case where X and Y are not in direct contact with each other, that is, the case where another object is placed between X and Y. Here, each of X and Y denotes an object (e.g., a device, an element, a circuit, a wiring, an electrode, a terminal, a conductive film, a layer, or the like).

Therefore, for example, when it is explicitly described that "a layer Y is formed on (or over) a layer X", it includes both the case where the layer Y is formed on and in direct contact with the layer X, and the case where another layer (e.g., a layer Z) is formed on and in direct contact with the layer X and the layer Y is formed on and in direct contact with the layer Z. Note that another layer (e.g., a layer Z) may be a single layer or a plurality of layers (a stack of layers).

Similarly, when it is explicitly described that Y is formed above X, it does not necessarily mean that Y is formed on and in direct contact with X, and another object may be placed between X and Y. Therefore, for example, when it is described that "a layer Y is formed above a layer X", it includes both the case where the layer Y is formed on and in direct contact with the layer X, and the case where another layer (e.g., a layer Z) is formed on and in direct contact with the layer X and the layer Y is formed on and in direct contact with the layer Z. Note that another layer (e.g., a layer Z) may be a single layer or a plurality of layers (a stack of layers).

Note that when it is explicitly described that Y is formed over, on, or above X, it includes the case where Y is formed obliquely over/above X.

Note that the same can be said when it is explicitly described that Y is formed below or under X.

Note that in this specification and the like, terms for describing spatial arrangement, such as "over", "above", "under", "below", "laterally", "right", "left", "obliquely", "behind", "front", "inside", "outside", and "in" are often used for briefly showing a relation between an element and another element or between a feature and another feature with reference to a diagram. Note that embodiments of the present invention are not limited thereto, and such terms for describing spatial arrangement can indicate not only the direction illustrated in a diagram but also another direction. For example, when it is explicitly described that "Y is over X", it does not necessarily mean that Y is placed over X. Since a device in a diagram can be inverted or rotated by 180°, the case where Y is placed under B can be included. Accordingly, "over" can refer to the direction described by "under" in addition to the direction described by "over". Note that the embodiments of the present invention are not limited thereto, and "over" can refer to any of the other directions described by "laterally", "right", "left", "obliquely", "behind", "front", "inside", "outside", and "in" in addition to the directions described by "over" and "under" because the device in the diagram can be rotated in a variety of directions. That is, such terms can be construed as appropriate depending on circumstances.

Embodiment 7

In this embodiment, an example of a display device will be described.

Figure 38A:
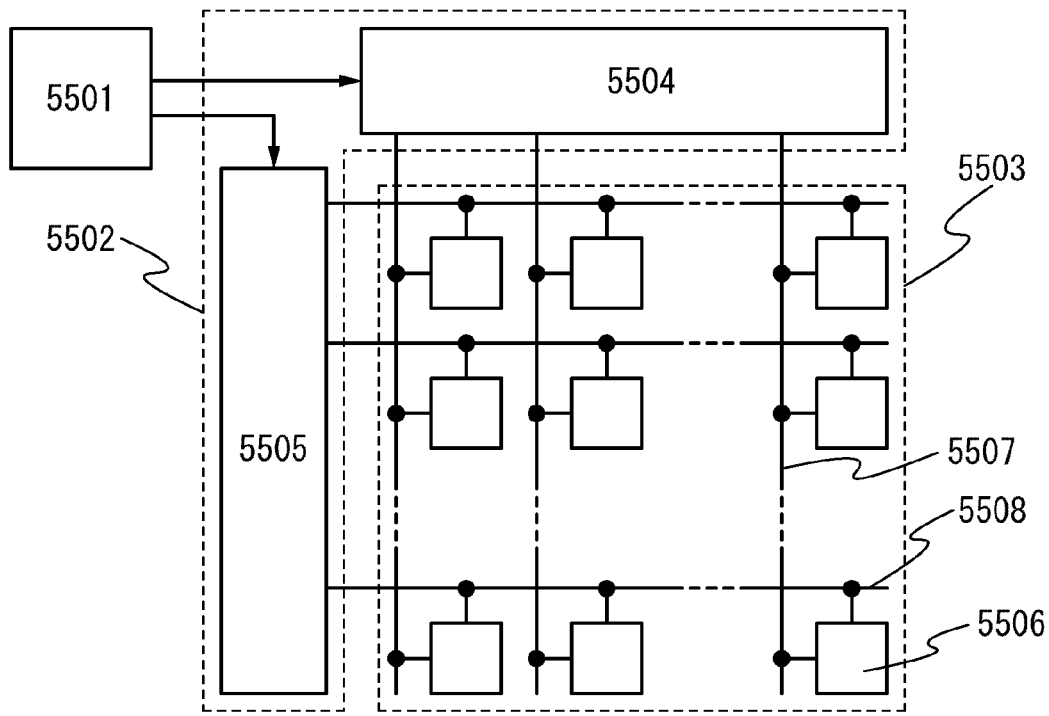
FIGS. 38A to 38E are examples of a block diagram of a display device.

FIG. 38A illustrates an example of a block diagram of a display device in this embodiment. The display device in FIG. 38A includes a circuit 5501 (e.g., a timing controller), a circuit 5502 (e.g., a driver circuit), and a pixel portion 5503. The circuit 5502 includes a circuit 5504 (e.g., a source driver circuit) and a circuit 5505 (e.g., a gate driver circuit). A plurality of wirings 5507 (e.g., signal lines, source signal lines, or video signal lines) extended from the circuit 5504 and a plurality of wirings 5508 (e.g., signal lines, gate signal lines, or scan lines) extended from the circuit 5505 are placed in the pixel portion 5503. Pixels 5506 are placed in regions where the plurality of wirings 5507 and the plurality of wirings 5508 intersect with each other, so as to be arranged in matrix. The pixel 5506 is connected to the wiring 5507 and the wiring 5508. The circuit 5501 is connected to the circuit 5504 and the circuit 5505.

A variety of wirings can be provided in the pixel portion 5503 depending on the configuration of the pixel 5506. Some examples will be described below. For example, when the pixel 5506 includes a liquid crystal element, a display element with memory properties, or the like, a capacitor line is preferably provided in the pixel portion 5503. As another example, when the pixel 5506 includes a light-emitting element such as an EL element, a power supply line such as an anode line is preferably provided in the pixel portion 5503. As another example, when the pixel 5506 includes a plurality of switches, transistors, or the like, a wiring having a function similar to that of the wiring 5508 (e.g., a signal line, a gate signal line, or a scan line) can be formed in the pixel portion 5503. In that case, it is preferable to additionally provide a circuit having a function similar to that of the circuit 5505 (e.g., a gate driver circuit).

All or part of the circuits 5501, 5504, and 5505 may be formed over a substrate where the pixel portion 5503 is formed. Alternatively, all the circuits 5501, 5504, and 5505 may be formed over a substrate different from the substrate where the pixel portion 5503 is formed. Some examples will be described with reference to FIGS. 38B to 38E.

Figure 38B:
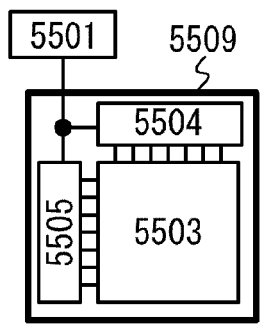

FIG. 38B illustrates an example in which the circuits 5504 and 5505 are formed over a substrate where the pixel portion 5503 is formed (referred to as a substrate 5509) and the circuit 5501 is formed over a substrate (e.g., a silicon substrate or an SOI substrate) different from the substrate where the pixel portion 5503 is formed. With this structure, the number of connections between the substrate where the pixel portion 5503 is formed and an external circuit can be reduced. Thus, improvement in reliability, increase in yield, reduction in manufacturing cost, and the like can be realized.

The substrate where the pixel portion 5503 is formed and the external circuit are preferably connected through an FPC pad or the like. The external circuit is preferably mounted on an FPC (flexible printed circuit) by TAB (tape automated bonding). Alternatively, the external circuit is preferably mounted on the substrate 5509 by COG (chip on glass).

Figure 38C:
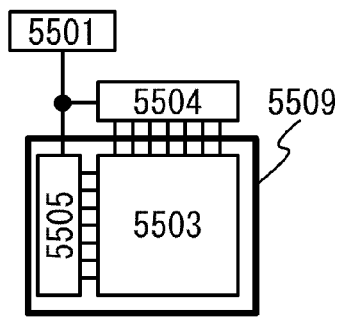

FIG. 38C illustrates an example in which the circuit 5505 is formed over the substrate where the pixel portion 5503 is formed and the circuits 5501 and 5504 are formed over a substrate (e.g., a silicon substrate or an SOI substrate) different from the substrate where the pixel portion 5503 is formed. In this structure, the circuit 5505 can be formed over the substrate where the pixel portion 5503 is formed. The driving frequency of the circuit 5505 is lower than that of the circuit 5504 in many cases. Therefore, the pixel portion 5503 and the circuit 5505 can be formed using a transistor including amorphous silicon, microcrystalline silicon, an oxide semiconductor, or an organic semiconductor. Thus, it is possible to achieve reduction in the number of steps, reduction in manufacturing cost, improvement in reliability, increase in yield, and the like. Moreover, the size of the pixel portion 5503 can be increased, so that the size of a display portion of the display device can be increased.

Figure 38D:
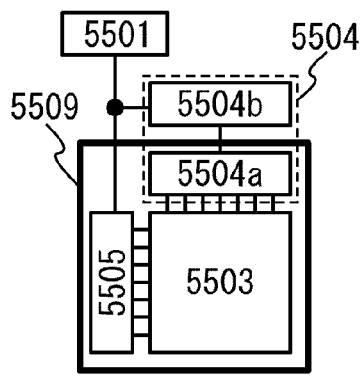

FIG. 38D illustrates an example in which part of the circuit 5504 (referred to as a circuit 5504a) and the circuit 5505 are formed over the substrate where the pixel portion 5503 is formed and the circuit 5501 and another part of the circuit 5504 (referred to as a circuit 5504b) are formed over a substrate different from the substrate where the pixel portion 5503 is formed. The driving frequency of the circuit 5504a is lower than that of the circuit 5504b. Therefore, as in the display device in FIG. 38B, the pixel portion 5503 and the circuits 5504a and 5505 can be formed using a transistor including amorphous silicon, microcrystalline silicon, an oxide semiconductor, or an organic semiconductor. The circuit 5504a is preferably constituted by one or more of a switch, an inverter circuit, a selector circuit, a demultiplexer circuit, a shift register circuit, a decoder circuit, and a buffer circuit. The circuit 5504b is preferably constituted by one or more of a shift register circuit, a decoder circuit, a latch circuit, a D/A conversion circuit, a level shifter circuit, and a buffer circuit.

Figure 38E:
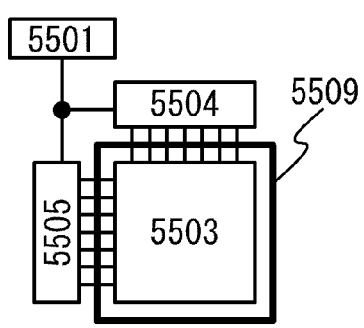

FIG. 38E illustrates an example in which the circuits 5501, 5504, and 5505 are formed over a substrate different from the substrate where the pixel portion 5503 is formed.

In the circuit 5504 or the circuit 5505, the circuit described in the embodiment can be used.

Note that a display element, a display device which is a device including a display element, a light-emitting element, and a light-emitting device which is a device including a light-emitting element can employ various modes and can include various elements. For example, a display medium, whose contrast, luminance, reflectivity, transmittance, or the like changes by electromagnetic action, such as an EL (electroluminescence) element (e.g., an EL element including organic and inorganic materials, an organic EL element, or an inorganic EL element), an LED (e.g., a white LED, a red LED, a green LED, or a blue LED), a transistor (a transistor which emits light depending on the amount of current), an electron emitter, a liquid crystal element, electronic ink, an electrophoretic element, a grating light valve (GLV), a plasma display panel (PDP), a digital micromirror device (DMD), a piezoelectric ceramic display, or a carbon nanotube, can be used as a display element, a display device, a light-emitting element, or a light-emitting device. Display devices having EL elements include an EL display and the like. Display devices having electron emitters include a field emission display (FED), an SED-type flat panel display (SED: surface-conduction electron-emitter display), and the like. Display devices having liquid crystal elements include a liquid crystal display (e.g., a transmissive liquid crystal display, a transflective liquid crystal display, a reflective liquid crystal display, a direct-view liquid crystal display, or a projection liquid crystal display) and the like. Display devices having electronic ink or electrophoretic elements include electronic paper and the like.

For example, an element which controls transmission or non-transmission of light by optical modulation action of liquid crystals can be used as a liquid crystal element. The element can include a pair of electrodes and liquid crystals. Note that the optical modulation action of liquid crystals is controlled by an electric field applied to the liquid crystals (including a horizontal electric field, a vertical electric field, and a diagonal electric field). Note that specifically, the following can be used for a liquid crystal element, for example: a nematic liquid crystal, a cholesteric liquid crystal, a smectic liquid crystal, a discotic liquid crystal, a thermotropic liquid crystal, a lyotropic liquid crystal, a low-molecular liquid crystal, a high-molecular liquid crystal, a polymer dispersed liquid crystal (PDLC), a ferroelectric liquid crystal, an anti-ferroelectric liquid crystal, a main-chain liquid crystal, a side-chain high-molecular liquid crystal, a plasma addressed liquid crystal (PALC), a banana-shaped liquid crystal, and the like. In addition, the following can be used as a driving method of a liquid crystal: a TN (twisted nematic) mode, an STN (super twisted nematic) mode, an IPS (in-plane-switching) mode, an FFS (fringe field switching) mode, an MVA (multi-domain vertical alignment) mode, a PVA (patterned vertical alignment) mode, an ASV (advanced super view) mode, an ASM (axially symmetric aligned microcell) mode, an OCB (optically compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a PNLC (Polymer Network Liquid Crystal) mode, a guest-host mode, a blue phase mode, and the like. Note that the present invention is not limited thereto, and a variety of liquid crystal elements and driving methods thereof can be used as a liquid crystal element and a driving method thereof.

For example, as electronic paper, a device for displaying images by molecules (a device which utilizes optical anisotropy, dye molecular orientation, or the like), a device for displaying images by particles (a device which utilizes electrophoresis, particle movement, particle rotation, phase change, or the like), a device for displaying images by movement of one end of a film, a device for displaying images by using coloring properties or phase change of molecules, a device for displaying images by using optical absorption by molecules, a device for displaying images by using self-light emission by combination of electrons and holes, or the like can be used. Specifically, examples of a display method of electronic paper are microcapsule electrophoresis, horizontal electrophoresis, vertical electrophoresis, a spherical twisting ball, a magnetic twisting ball, a columnar twisting ball, a charged toner, an electron powder and granular material, magnetic electrophoresis, a magnetic thermosensitive type, electro wetting, light-scattering (transparent-opaque change), a cholesteric liquid crystal and a photoconductive layer, a cholesteric liquid crystal, a bistable nematic liquid crystal, a ferroelectric liquid crystal, a liquid crystal dispersed type with a dichroic dye, a movable film, coloring and decoloring properties of a leuco dye, photochromism, electrochromism, electrodeposition, flexible organic EL, and the like. Note that the present invention is not limited thereto, and a variety of electronic paper and display methods thereof can be used as electronic paper and a driving method thereof. Here, by using microcapsule electrophoresis, aggregation and precipitation of phoresis particles can be solved. Electron powder and granular material has advantages such as high-speed response, high reflectivity, wide viewing angle, low power consumption, and memory properties.

Note that in this specification and the like, transistors with a variety of structures can be used as a transistor, without limitation to a certain type. For example, a thin film transistor (TFT) including a non-single-crystal semiconductor film typified by amorphous silicon, polycrystalline silicon, microcrystalline (also referred to as microcrystal, nanocrystal, or semi-amorphous) silicon, or the like can be used as a transistor. In the case of using the TFT, there are various advantages. For example, since the TFT can be formed at temperature which is lower than that of the case of using single crystal silicon, manufacturing cost can be reduced or a manufacturing apparatus can be made large. Since the manufacturing apparatus can be made large, the TFT can be formed using a large substrate. Therefore, many display devices can be formed concurrently at low cost. Alternatively, since the manufacturing temperature is low, a substrate having low heat resistance can be used. Therefore, the transistor can be formed using a light-transmitting substrate. Alternatively, transmission of light in a display element can be controlled by using the transistor formed using the light-transmitting substrate. Alternatively, part of a film included in the transistor can transmit light because the thickness of the transistor is small. Therefore, the aperture ratio can be improved.

Note that for example, a transistor including a compound semiconductor (e.g., SiGe, GaAs, and the like), an oxide semiconductor (e.g., ZnO, InGaZnO, IZO (indium zinc oxide), ITO (indium tin oxide), SnO, TiO, and AlZnSnO (AZTO)), or the like; a thin film transistor obtained by thinning such a compound semiconductor or an oxide semiconductor; or the like can be used as a transistor. Thus, manufacturing temperature can be lowered and, for example, such a transistor can be formed at room temperature. Accordingly, the transistor can be formed directly on a substrate having low heat resistance, such as a plastic substrate or a film substrate. Note that such a compound semiconductor or an oxide semiconductor can be used not only for a channel portion of the transistor but also for other applications. For example, such a compound semiconductor or an oxide semiconductor can be used for a wiring, a resistor, a pixel electrode, a light-transmitting electrode, or the like. Since such an element can be formed at the same time as the transistor, cost can be reduced.

Note that for example, a transistor with a structure where gate electrodes are formed above and below a channel can be used as a transistor. With the structure where the gate electrodes are formed above and below the channel, a circuit structure where a plurality of transistors are connected in parallel is provided. Thus, a channel region is increased, so that the amount of current can be increased. Alternatively, with the structure where gate electrodes are formed above and below the channel, a depletion layer can be easily formed, so that subthreshold swing can be improved.

Note that in this specification and the like, a transistor can be formed using a variety of substrates, without limitation to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. As a glass substrate, a barium borosilicate glass substrate, an aluminoborosilicate glass substrate, a soda-lime glass substrate, or the like can be used, for example. For a flexible substrate, a flexible synthetic resin such as plastics typified by polyethylene terephthalate (PET), polyethylene naphthalate (PEN), or polyether sulfone (PES), or acrylic can be used, for example. For an attachment film, polypropylene, polyester, vinyl, polyvinyl fluoride, polyvinyl chloride, or the like can be used, for example. For a base material film, polyester, polyamide, polyimide, an inorganic vapor deposition film, paper, or the like can be used, for example. In particular, by forming transistors with the use of a semiconductor substrate, a single crystal substrate, an SOI substrate, or the like, transistors with fewer variations in characteristics, sizes, shapes, or the like, with high current supply capability, and with small sizes can be formed. By forming a circuit with the use of such a transistor, power consumption of the circuit can be reduced or the circuit can be highly integrated.

Note that the transistor may be formed using one substrate, and then, the transistor may be transferred to another substrate. In addition to the above substrates over which the transistor can be formed, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, or the like can be used as a substrate to which the transistor is transferred. By using such a substrate, a transistor with excellent properties or a transistor with low power consumption can be formed, a device with high durability and high heat resistance can be provided, or reduction in weight or thickness can be achieved.

Embodiment 8

A display device including a shift register circuit disclosed in this specification can be applied to a variety of electronic devices (including amusement machines). Examples of electronic devices include television sets (also referred to as televisions or television receivers), monitors of computers or the like, cameras such as digital cameras or digital video cameras, digital photo frames, mobile phones (also referred to as cellular phones or cellular phone devices), portable game consoles, portable information terminals, audio reproducing devices, large-sized game machines such as pachinko machines, and the like. Examples of electronic devices each including the display device including a shift register circuit described in the above embodiment will be described.

Figure 39A:
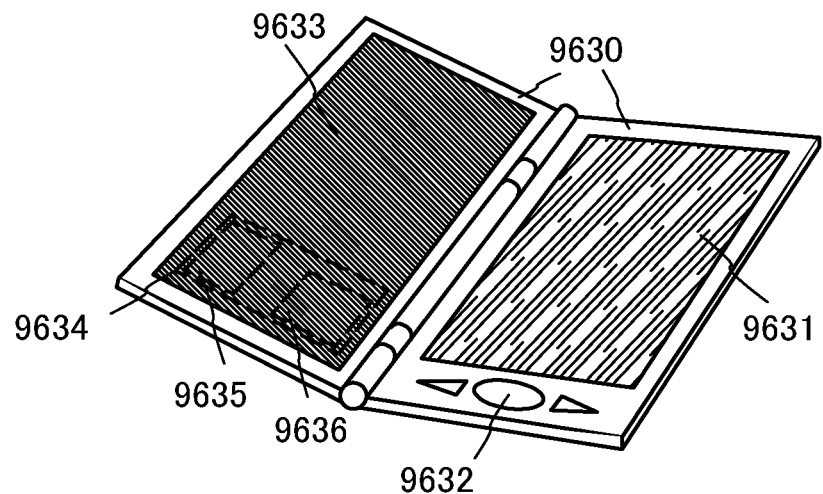
FIGS. 39A and 39B illustrate an example of an electronic device.

FIG. 39A illustrates an electronic book reader (also referred to as an e-book reader) that can include housings 9630, a display portion 9631, operation keys 9632, a solar cell 9633, and a charge and discharge control circuit 9634. The electronic book reader in FIG. 39A can have a function of displaying a variety of information (e.g., a still image, a moving image, and a text image) on the display portion, a function of displaying a calendar, a date, the time, and the like on the display portion, a function of operating or editing the information displayed on the display portion, a function of controlling processing by various kinds of software (programs), and the like. Note that in FIG. 39A, a structure including a battery 9635 and a DCDC converter (hereinafter abbreviated as a converter) 9636 is illustrated as an example of the charge and discharge control circuit. By applying the display device including a shift register circuit described in another embodiment to the display portion 9631, the electronic book reader can have high stability.

In the structure of FIG. 39A, a semi-transmissive or reflective liquid crystal display device is used as the display portion 9631, whereby the electronic book reader is excellent in visibility even in a relatively bright environment. In such an environment, power generation by the solar cell 9633 and charge with the battery 9635 can be efficiently performed. Note that the solar cell 9633 can be provided in not only the illustrated region but also a space (a surface or a rear surface) of the housing 9630 as appropriate. When a lithium ion battery is used as the battery 9635, there is an advantage of downsizing or the like.

Figure 39B:
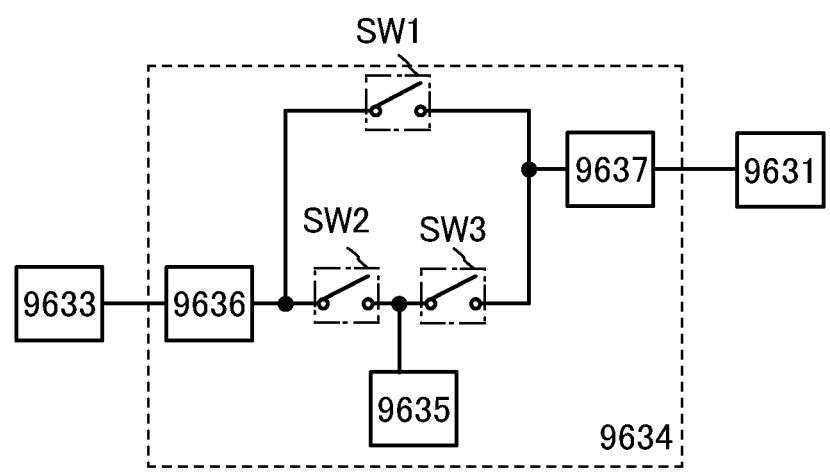

The structure and the operation of the charge and discharge control circuit 9634 illustrated in FIG. 39A will be described with reference to a block diagram in FIG. 39B. The solar cell 9633, the battery 9635, the converter 9636, a converter 9637, switches SW1 to SW3, and the display portion 9631 are shown in FIG. 39B. The battery 9635, the converter 9636, the converter 9637, and the switches SW1 to SW3 are included in the charge and discharge control circuit 9634.

First, an example of operation in the case where power is generated by the solar cell 9633 using external light is described. The voltage of power generated by the solar cell is raised or lowered by the converter 9636 to a suitable voltage for charging the battery 9635. Then, when the power from the solar cell 9633 is used for the operation of the display portion 9631, the switch SW1 is turned on and the voltage of the power is raised or lowered by the converter 9637 to a voltage needed for the display portion 9631. In addition, when display on the display portion 9631 is not performed, the switch SW1 is turned off and the switch SW2 is turned on so that charge of the battery 9635 may be performed.

Next, operation in the case where power is not generated by the solar cell 9633 owing to lack of external light is described. The voltage of power accumulated in the battery 9635 is raised or lowered by the converter 9637 by turning on the switch SW3. Then, power from the battery 9635 is used for the operation of the display portion 9631.

Note that the solar cell is described as one example of a means for charging, the battery 9635 may be charged with another means or with a combination of another means.

Figure 40A:
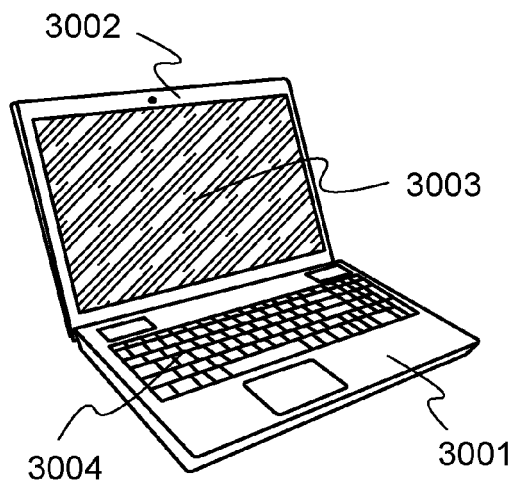
FIGS. 40A to 40F each illustrate an electronic device.

FIG. 40A illustrates a laptop personal computer, which includes a main body 3001, a housing 3002, a display portion 3003, a keyboard 3004, and the like. By using the display device including a shift register circuit described in Embodiments 1 to 6, the laptop personal computer can have high stability.

Figure 40B:
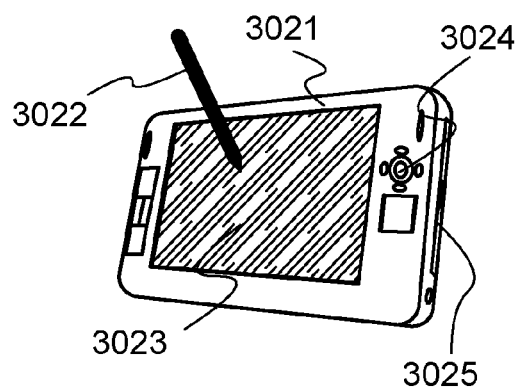

FIG. 40B is a personal digital assistant (PDA), which includes a main body 3021 provided with a display portion 3023, an external interface 3025, operation buttons 3024, and the like. A stylus 3022 is included as an accessory for operation. By using the display device including a shift register circuit described in Embodiments 1 to 6, the personal digital assistant (PDA) can be highly reliable.

Figure 40C:
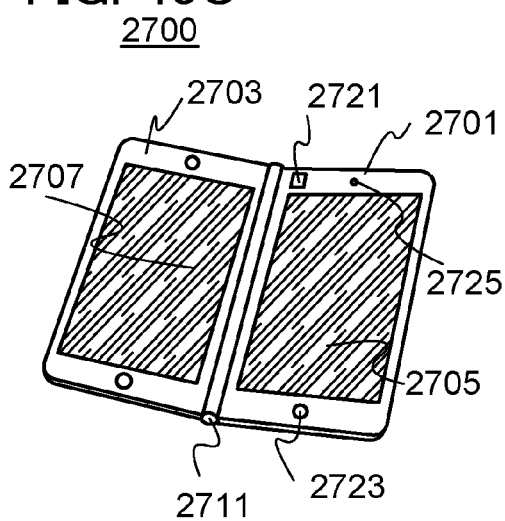

FIG. 40C illustrates an example of an electronic book reader. For example, an electronic book reader 2700 has two housings, a housing 2701 and a housing 2703. The housing 2701 and the housing 2703 are combined with a hinge 2711. The electronic book reader 2700 can be opened and closed with the hinge 2711 as an axis, and can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 40C) and images can be displayed on a display portion on the left side (the display portion 2707 in FIG. 40C). By using the display device including a shift register circuit described in Embodiments 1 to 6, the electronic book reader 2700 can have high stability.

FIG. 40C illustrates an example in which the housing 2701 is provided with an operation portion and the like. For example, the housing 2701 is provided with a power switch 2721, operation keys 2723, a speaker 2725, and the like. With the operation keys 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Moreover, the electronic book reader 2700 may have a function of an electronic dictionary.

The electronic book reader 2700 may have a configuration capable of wirelessly transmitting and receiving data. Through wireless communication, desired book data or the like can be purchased and downloaded from an electronic book server.

Figure 40D:
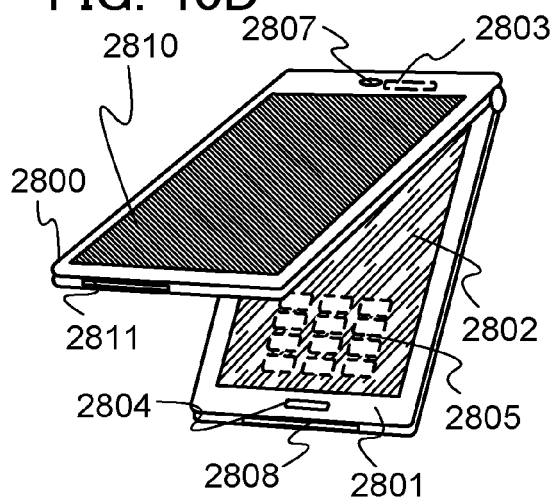

FIG. 40D illustrates a mobile phone, which includes two housings, a housing 2800 and a housing 2801. The housing 2801 includes a display panel 2802, a speaker 2803, a microphone 2804, a camera lens 2807, an external connection terminal 2808, and the like. In addition, the housing 2800 includes a solar cell 2810 having a function of charge of the portable information terminal, an external memory slot 2811, and the like. An antenna is incorporated in the housing 2801. By using the display device including a shift register circuit described in Embodiments 1 to 6, the mobile phone can have high stability.

Further, the display panel 2802 is provided with a touch panel. A plurality of operation keys 2805 which are displayed as images are illustrated by dashed lines in FIG. 40D. Note that a boosting circuit by which a voltage output from the solar cell 2810 is increased to be sufficiently high for each circuit is also provided.

The display direction of the display panel 2802 is changed as appropriate depending on a usage pattern. The speaker 2803 and the microphone 2804 can be used for a video phone, voice recording, playback, and the like as well as voice calls. Further, the housings 2800 and 2801 are combined with a hinge and the mobile phone can be opened and closed with the hinge as an axis. The mobile phone can be opened more than the state shown in FIG. 40D, which makes possible to speak on the phone easily. Moreover, the mobile phone can be opened more so as to be closed reversely; thus, the size of the mobile phone can be decreased, which makes the mobile phone suitable for being carried.

The external connection terminal 2808 can be connected to an AC adapter and various types of cables such as a USB cable, and charge and data communication with a personal computer or the like are possible. Further, a storage medium is inserted into the external memory slot 2811, whereby a large amount of data can be stored and transferred.

Further, in addition to the above functions, an infrared communication function, a television reception function, or the like may be provided.

Figure 40E:
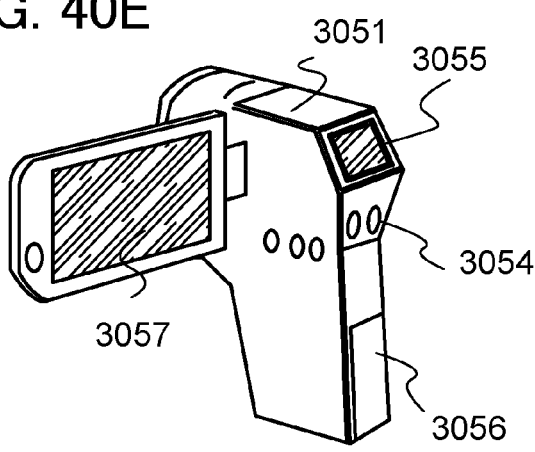

FIG. 40E illustrates a digital video camera, which includes a main body 3051, a display portion A 3057, an operation switch 3054, a display portion B 3055, a battery 3056, and the like. By using the display device including a shift register circuit described in Embodiments 1 to 6, the digital video camera can have high stability.

Figure 40F:
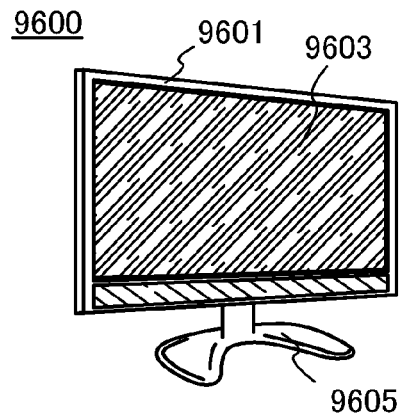

FIG. 40F illustrates an example of a television set. In a television set 9600, a display portion 9603 is incorporated in a housing 9601. The display portion 9603 can display images. Here, the housing 9601 is supported by a stand 9605. By using the display device including a shift register circuit described in Embodiments 1 to 6, the television set 9600 can have high stability.

The television set 9600 can be operated by an operation switch of the housing 9601 or a separate remote controller. Further, the remote controller may be provided with a display portion for displaying data output from the remote controller.

Note that the television set 9600 is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

This embodiment can be implemented in combination with any of the other embodiments as appropriate.

Note that in this specification and the like, explicit singular forms preferably mean singular forms. However, without being limited thereto, such singular forms can include plural forms. Similarly, explicit plural forms preferably mean plural forms. However, without being limited thereto, such plural forms can include singular forms.

Embodiment 9

In this embodiment, an application example of a semiconductor device including a nonvolatile semiconductor memory device using a shift register which is illustrated in the above embodiments will be described with reference to drawings.

Further, the nonvolatile semiconductor memory device including the shift register circuit of the present invention can be used in electronic devices which include a memory in all kinds of fields. For example, an electronic device to which the nonvolatile semiconductor memory device including the shift register circuit of the present invention is applied may be a camera such as a video camera, a digital camera, a goggle-type display (a head-mounted display), a navigation system, a sound reproducing device (a car audio device, an audio component, or the like), a computer, a game machine, a portable information terminal (a mobile computer, a portable telephone, a portable game machine, an electronic book, or the like), an image reproducing device which includes a recording medium (specifically, a device which plays back a recording medium, such as a DVD (digital versatile disc), and has a display which can display the images), or the like. Specific examples of these electronic devices are shown in FIGS. 41A to 41E.

Figure 41A:
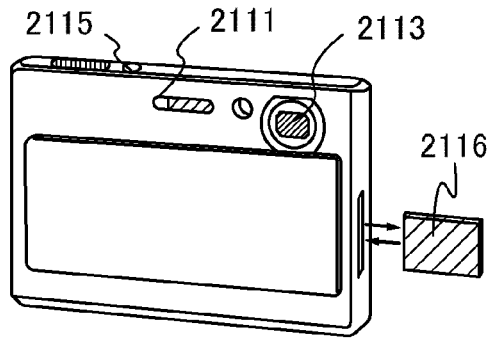
FIGS. 41A to 41E each illustrate an electronic device.
Figure 41B:
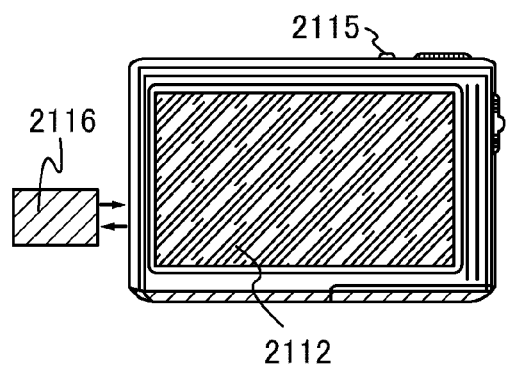

FIGS. 41A and 41B show a digital camera. FIG. 41B is a view of the back side of FIG. 41A. The digital camera includes a housing 2111, a display portion 2112, a lens 2113, a shutter release button 2115, and the like. The display portion 2112 is provided with a touch screen and settings can be changed by a touch on the display. Further, the digital camera includes a removable nonvolatile memory 2116 in which data photographed using the digital camera is stored. A nonvolatile semiconductor memory device including the shift register circuit of the present invention can be applied to the memory 2116.

Figure 41C:
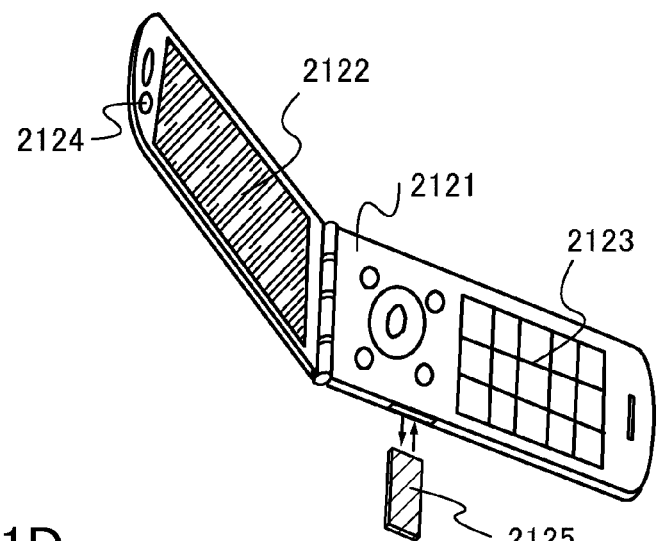

FIG. 41C shows a portable telephone, which is a representative example of a portable terminal. The portable telephone includes a housing 2121, a display portion 2122, operation keys 2123, a camera lens 2124, and the like. Further, the portable telephone includes a removable nonvolatile memory 2125. Data such as the telephone number of the portable telephone and the like, images, music data, and the like can be stored in the memory 2125 and reproduced. A nonvolatile semiconductor memory device including the shift register circuit of the present invention can be applied to the memory 2125.

Figure 41D:
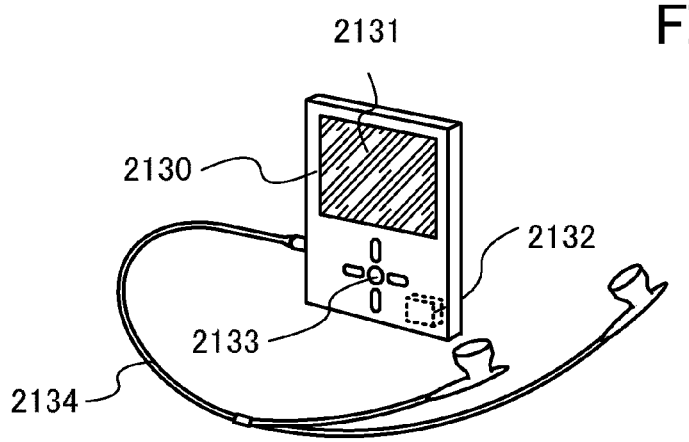

Further, FIG. 41D shows a digital player, which is a representative example of an audio device. The digital player shown in FIG. 41D includes a main body 2130, a display portion 2131, a memory portion 2132, an operating portion 2133, earphones 2134, and the like. Note that headphones or wireless earphones can be used instead of the earphones 2134. A nonvolatile semiconductor memory device described in this embodiment can be used for the memory portion 2132. For example, when a NAND-type nonvolatile memory with a memory capacity of 20 to 200 gigabytes (GB) is used and the operating portion 2133 is operated, images and sound (music) can be stored and reproduced. Note that when white characters are displayed on a black background in the display portion 2131, power consumption can be suppressed. This is particularly effective in a portable audio device. Note that when white characters are displayed on a black background in the display portion 2131, power consumption can be suppressed. This is particularly effective in a portable audio device. Note that a nonvolatile semiconductor memory device which is provided in the memory portion 2132 may be removable.

Figure 41E:
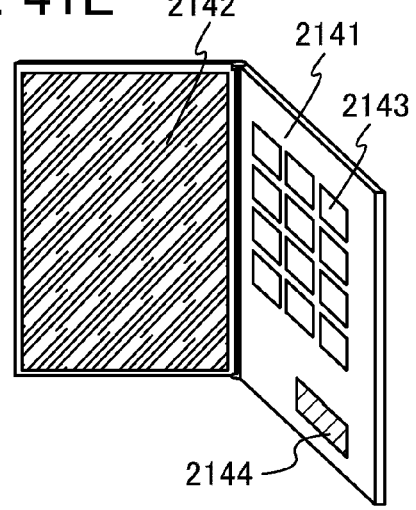

Further, FIG. 41E shows an electronic book (also referred to as electronic paper). The electronic book includes a main body 2141, a display portion 2142, operation keys 2143, and a memory portion 2144. A modem may be built into the main body 2141, or a structure in which information can be transmitted and received wirelessly may be employed. A nonvolatile semiconductor memory device including the shift register circuit of the present invention can be used for the memory portion 2144. For example, a NAND type nonvolatile memory with a memory capacity of 20 to 200 gigabytes (GB) can be used. In addition, when operation keys 2143 are operated, an image or sound (music) can be recorded and reproduced. Note that a nonvolatile semiconductor memory device which is provided in the memory portion 2144 may be removable.

Thus, a nonvolatile semiconductor memory device including the shift register circuit of the present invention has a very wide range of application, and can be used in electronic devices which include a memory portion in all kinds of fields.

Note that in this specification and the like, in a diagram or a text described in one embodiment, it is possible to take out part of the diagram or the text and constitute an embodiment of the invention. Thus, in the case where a diagram or a text related to a certain portion is described, the context taken out from part of the diagram or the text is also disclosed as one embodiment of the invention, and one embodiment of the invention can be constituted. Thus, for example, in a diagram or a text including one or more of active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like, it is possible to take out part of the diagram or the text and constitute one embodiment of the invention. For example, from a circuit diagram in which N circuit elements (e.g., transistors or capacitors; N is an integer) are provided, it is possible to constitute one embodiment of the invention by taking out M circuit elements (e.g., transistors or capacitors; M is an integer, where M<N). As another example, it is possible to constitute one embodiment of the invention by taking out M layers (M is an integer, where M<N) from a cross-sectional view in which N layers (N is an integer) are provided. As another example, it is possible to constitute one embodiment of the invention by taking out M elements (M is an integer, where M<N) from a flow chart in which N elements (N is an integer) are provided.

Note that in the case where at least one specific example is described in a diagram or a text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted.

Note that in this specification and the like, a content described in at least a diagram (which may be part of the diagram) is disclosed as one embodiment of the invention, and one embodiment of the invention can be constituted. Therefore, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted.

Note that what is described (or part thereof) in one embodiment can be applied to, combined with, or exchanged with another content in the same embodiment and/or what is described (or part thereof) in another embodiment or other embodiments. Note that in each embodiment, a content described in the embodiment is a content described with reference to a variety of diagrams or a content described with a paragraph disclosed in this specification. In addition, by combining a diagram (or part thereof) described in one embodiment with another part of the diagram, a different diagram (or part thereof) described in the same embodiment, and/or a diagram (or part thereof) described in one or a plurality of different embodiments, much more diagrams can be formed.

This application is based on Japanese Patent Application serial no. 2010-212933 filed with Japan Patent Office on Sep. 23, 2010, the entire contents of which are hereby incorporated by reference.

What is claimed is:

1. A semiconductor device comprising:
   a first inverter;
   a circuit comprising:
      a second inverter including an output electrically connected to an output of the first inverter, and comprising a first transistor of one of a n-channel type and a p-channel type, and a second transistor of another channel type than the first transistor, a terminal of the first transistor and a terminal of the second transistor forming the output of the second inverter; and
      a third transistor electrically connected in series with the first transistor and the second transistor between a first potential power supply line and a second potential power supply line, without other intervening component between the lines, so that, when the circuit is in operation, the second inverter is constantly supplied with a power supply potential supplied through one of the first potential power supply line and the second potential power supply line; and
   a third inverter including an input electrically connected to an output of the first inverter and to an output of the second inverter, and an output electrically connected to an input of the second inverter.

2. A semiconductor device according to claim 1,
   wherein a gate of the first transistor and a gate of the second transistor are electrically connected to each other, and
   wherein the first transistor has a first terminal electrically connected to the first potential power supply line and a second terminal electrically connected to the output of the first inverter and to the input of the third inverter;
   wherein the second transistor has a first terminal electrically connected to a second terminal of the first transistor; and
   wherein the third transistor has a first terminal electrically connected to a second terminal of the second transistor and a second terminal electrically connected to the second potential power supply line.

3. A semiconductor device according to claim 1,
   wherein the first inverter, the second inverter and the third inverter are each connected to the first potential power supply line and to the second potential power supply line.

4. A semiconductor device according to claim 1,
   wherein a gate of the third transistor is configured to be input with a clock signal.

5. A semiconductor device according to claim 1,
   wherein a gate of the third transistor is electrically connected to an input of the first inverter.

6. A semiconductor device according to claim 1, further comprising a reset circuit.

7. A semiconductor device according to claim 1, P1 wherein the first inverter, the third inverter, and the circuit comprising the second inverter and the third transistor are part of a shift register.

8. A display device including the semiconductor device according to claim 1.

9. A semiconductor device comprising:
   a first circuit comprising:
      a first wiring;
      a first input terminal;
      a second input terminal;
      a first output terminal;
      a second wiring;
      a first n-channel transistor including a gate electrically connected to the first input terminal, and a first terminal electrically connected to the first wiring;
      a second n-channel transistor including a gate electrically connected to the second input terminal, a first terminal electrically connected a second terminal of the first n-channel transistor, and a second terminal electrically connected to the first output terminal; and
      a first p-channel transistor including a gate electrically connected to the second input terminal and to the gate of the second n-channel transistor, a first terminal electrically connected to the second terminal of the second n-channel transistor and to the first output terminal, and a second terminal electrically connected to the second wiring so that, when the first circuit is in operation, the first p-channel transistor is constantly supplied with a high power source potential through the second wiring;
   a second circuit comprising:
      a third input terminal;
      a fourth input terminal;
      a third wiring;
      a fourth wiring;
      a third n-channel transistor including a gate electrically connected to the third input terminal, a first terminal electrically directly connected to the third wiring so that, when the second circuit is in operation, the third n-channel transistor is constantly supplied with a low power source potential through the third wiring, and a second terminal electrically connected to the first output terminal of the first circuit;

a second p-channel transistor including a gate electrically connected to the third input terminal and to the gate of the third n-channel transistor, and a first terminal electrically connected to the second terminal of the third n-channel transistor and to the first output terminal of the first circuit; and a third p-channel transistor including a gate electrically connected to the fourth input terminal, a first terminal electrically connected to a second terminal of the third p-channel transistor, and a second terminal electrically connected to the fourth wiring; and a third circuit comprising:
  a fifth wiring;
  a sixth wiring;
  a fourth n-channel transistor including a gate electrically connected to the first output terminal of the first circuit, a first terminal electrically connected to the fifth wiring, and a second terminal electrically connected to the third input terminal of the second circuit; and
  a fourth p-channel transistor including a gate electrically connected to the first output terminal of the first circuit and to the gate of the fourth n-channel transistor, a first terminal electrically connected to the second terminal of the fourth n-channel transistor and to the third input terminal of the second circuit, and a second terminal electrically connected to the sixth wiring.

10. A semiconductor device according to claim 9,
wherein the first wiring, the third wiring and the fifth wiring are electrically connected to a low potential power source; and
wherein the second wiring, the fourth wiring and the sixth wiring are electrically connected to a high potential power source.

11. A semiconductor device according to claim 9,
wherein the first wiring, the third wiring and the fifth wiring are electrically connected to a first common wiring; and
wherein the second wiring, the fourth wiring and the sixth wiring are electrically connected to a second common wiring.

12. A semiconductor device according to claim 9,
wherein the first wiring, the third wiring and the fifth wiring are electrically connected to a first common wiring connected to a low potential power source; and
wherein the second wiring, the fourth wiring and the sixth wiring are electrically connected to a second common wiring connected to a high potential power source.

13. A semiconductor device according to claim 9,
wherein the second input terminal of the first circuit and the fourth input terminal of the second circuit are configured to be input with a clock signal.

14. A semiconductor device according to claim 9, further comprising a reset circuit.

15. A semiconductor device according to claim 9,
wherein the first circuit, the second circuit, and the third circuit are part of a shift register.

16. A display device including the semiconductor device according to claim 9.

17. A semiconductor device comprising:
a first circuit comprising:
  a first wiring;
  a first input terminal;
  a second input terminal;
  a first output terminal;
  a second wiring;
  a first p-channel transistor including a gate electrically connected to the first input terminal, and a first terminal electrically connected to the first wiring;
  a second p-channel transistor including a gate electrically connected to the second input terminal, a first terminal electrically connected a second terminal of the first p-channel transistor, and a second terminal electrically connected to the first output terminal; and
  a first n-channel transistor including a gate electrically connected to the second input terminal and to the gate of the second p-channel transistor, a first terminal electrically connected to the second terminal of the second p-channel transistor and to the first output terminal, and a second terminal electrically connected to the second wiring so that, when the first circuit is in operation, the first n-channel transistor is constantly supplied with a low power source potential through the second wiring;

a second circuit comprising:
  a third input terminal;
  a fourth input terminal;
  a third wiring;
  a fourth wiring;
  a third p-channel transistor including a gate electrically connected to the third input terminal, a first terminal electrically directly connected to the third wiring so that, when the second circuit is in operation, the third p-channel transistor is constantly supplied with a high power source potential through the third wiring, and a second terminal electrically connected to the first output terminal of the first circuit;
  a second n-channel transistor including a gate electrically connected to the third input terminal and to the gate of the third p-channel transistor, and a first terminal electrically connected to the second terminal of the third p-channel transistor and to the first output terminal of the first circuit; and
  a third n-channel transistor including a gate electrically connected to the fourth input terminal, a first terminal electrically connected to a second terminal of the third n-channel transistor, and a second terminal electrically connected to the fourth wiring; and a third circuit comprising:
  a fifth wiring;
  a sixth wiring;
  a fourth p-channel transistor including a gate electrically connected to the first output terminal of the first circuit, a first terminal electrically connected to the fifth wiring, and a second terminal electrically connected to the third input terminal of the second circuit; and
  a fourth n-channel transistor including a gate electrically connected to the first output terminal of the first circuit and to the gate of the fourth p-channel transistor, a first terminal electrically connected to the second terminal of the fourth p-channel transistor and to the third input terminal of the second circuit, and a second terminal electrically connected to the sixth wiring.

18. A semiconductor device according to claim 17,
wherein the first wiring, the third wiring and the fifth wiring are electrically connected to a low potential power source; and wherein the second wiring, the fourth wiring and the sixth wiring are electrically connected to a high potential power source.

19. A semiconductor device according to claim 17,
wherein the first wiring, the third wiring and the fifth wiring are electrically connected to a first common wiring; and
wherein the second wiring, the fourth wiring and the sixth wiring are electrically connected to a second common wiring.

20. A semiconductor device according to claim 17,
wherein the first wiring, the third wiring and the fifth wiring are electrically connected to a first common wiring connected to a low potential power source; and
wherein the second wiring, the fourth wiring and the sixth wiring are electrically connected to a second common wiring connected to a high potential power source.

21. A semiconductor device according to claim 17,
wherein the second input terminal of the first circuit and the fourth input terminal of the second circuit are configured to be input with a clock signal.

22. A semiconductor device according to claim 17, further comprising a reset circuit.

23. A semiconductor device according to claim 17,
wherein the first circuit, the second circuit, and the third circuit are part of a shift register.

24. A display device including the semiconductor device according to claim 17.

* * * * *

UNITED STATES PATENT AND TRADEMARK OFFICE
CERTIFICATE OF CORRECTION

PATENT NO.         : 8,476,929 B2
APPLICATION NO.    : 13/231997
DATED              : July 2, 2013
INVENTOR(S)        : Hajime Kimura It is certified that error appears in the above-identified patent and that said Letters Patent is hereby corrected as shown below:

In the Claims

In claim 7, column 48, line 30, delete the word "P1".

Signed and Sealed this
Twenty-second Day of October, 2013

Teresa Stanek Rea
*Deputy Director of the United States Patent and Trademark Office*